US012635145B1

(12) United States Patent
Guhabiswas et al.

(10) Patent No.: US 12,635,145 B1
(45) Date of Patent: May 19, 2026

(54) FABRICATING NON-LINEAR POLAR MATERIAL BASED CAPACITORS FOR MEMORY AND LOGIC

(71) Applicant: Kepler Computing Inc., San Francisco, CA (US)

(72) Inventors: Debraj Guhabiswas, Berkeley, CA (US); Alexis Corda, Union City, CA (US); Maria Isabel Perez, Berkeley, CA (US); Jason Y. Wu, Albany, CA (US); Neil Quinn Murray, Albany, CA (US); Somilkumar J. Rathi, San Jose, CA (US); Niloy Mukherjee, San Ramon, CA (US); Rajeev Kumar Dokania, Beaverton, OR (US); Amrita Mathuriya, Portland, OR (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 445 days.

(21) Appl. No.: 18/148,275

(22) Filed: Dec. 29, 2022

(51) Int. Cl.
| | |
|---|---|
| *H10B 53/30* | (2023.01) |
| *G11C 11/22* | (2006.01) |
| *H01L 21/02* | (2006.01) |
| *H10D 1/68* | (2025.01) |

(52) U.S. Cl.
CPC ............ *H10B 53/30* (2023.02); *G11C 11/221* (2013.01); *H01L 21/02197* (2013.01); *H10D 1/688* (2025.01)

(58) Field of Classification Search
CPC .. H10B 53/30; H10D 1/688; H01L 21/02197; G11C 11/221
See application file for complete search history.

(56) References Cited

U.S. PATENT DOCUMENTS

| | | | |
|---|---|---|---|
| 5,705,414 | A | 1/1998 | Lustig |
| 5,739,563 | A | 4/1998 | Kawakubo et al. |
| 6,165,864 | A | 12/2000 | Shen et al. |
| 6,177,351 | B1 | 1/2001 | Beratan et al. |

(Continued)

FOREIGN PATENT DOCUMENTS

| | | |
|---|---|---|
| DE | 102015015854 A1 | 6/2017 |
| JP | 2006352005 A | 12/2006 |

(Continued)

OTHER PUBLICATIONS

Final Office Action notified Apr. 6, 2023 for U.S. Appl. No. 17/396,609.

(Continued)

*Primary Examiner* — Richard A Booth
(74) *Attorney, Agent, or Firm* — MUGHAL GAUDRY & FRANKLIN PC

(57) ABSTRACT
A method of fabricating a device comprising forming a multi-layer stack by sequentially depositing a first conductive layer, a dielectric layer on the first conductive layer, a second conductive layer on the dielectric layer, a third conductive layer comprising one or more of ruthenium, platinum, or iridium on the second conductive layer, and depositing an insulator layer on the third conductive layer. The method further comprises patterning the multi-layer stack to form a device by utilizing a plasma etch process.

22 Claims, 17 Drawing Sheets

(56)                    References Cited

U.S. PATENT DOCUMENTS

| | | | |
|---|---|---|---|
| 6,211,035 | B1 | 4/2001 | Moise et al. |
| 6,365,927 | B1 | 4/2002 | Cuchiaro et al. |
| 6,368,910 | B1 | 4/2002 | Sheu et al. |
| 6,548,343 | B1 | 4/2003 | Summerfelt et al. |
| 6,613,586 | B2 | 9/2003 | Bailey |
| 6,699,725 | B2 | 3/2004 | Lee |
| 6,753,193 | B2 | 6/2004 | Kim |
| 7,075,134 | B2 | 7/2006 | Araujo et al. |
| 7,754,501 | B2 | 7/2010 | Urushido |
| 7,977,720 | B2 | 7/2011 | Fukada |
| 8,440,508 | B2 | 5/2013 | Udayakumar et al. |
| 8,916,872 | B1 | 12/2014 | Tran et al. |
| 9,847,338 | B2 | 12/2017 | Nakao |
| 9,875,784 | B1 | 1/2018 | Li et al. |
| 10,847,201 | B2 | 11/2020 | Manipatruni et al. |
| 11,043,472 | B1 | 6/2021 | Dokania et al. |
| 11,063,131 | B2 | 7/2021 | Haratipour et al. |
| 11,139,270 | B2 | 10/2021 | Manipatruni et al. |
| 11,164,976 | B2 | 11/2021 | Ramamoorthy et al. |
| 11,659,714 | B1 | 5/2023 | Mukherjee et al. |
| 2001/0013614 | A1 | 8/2001 | Joshi et al. |
| 2002/0045279 | A1 | 4/2002 | Kwon et al. |
| 2002/0098645 | A1 | 7/2002 | Jung et al. |
| 2003/0030084 | A1 | 2/2003 | Moise et al. |
| 2005/0020054 | A1 | 1/2005 | Hilliger et al. |
| 2006/0133129 | A1 | 6/2006 | Rodriguez et al. |
| 2007/0045690 | A1 | 3/2007 | Fukada |
| 2007/0232016 | A1 | 10/2007 | Hayashi et al. |
| 2008/0057641 | A1 | 3/2008 | Wang |
| 2008/0121956 | A1 | 5/2008 | Kanaya |
| 2008/0121959 | A1 | 5/2008 | Izumi |
| 2008/0197502 | A1 | 8/2008 | Kikuchi et al. |
| 2009/0026514 | A1 | 1/2009 | Wang |
| 2009/0032978 | A1 | 2/2009 | Bucchignano et al. |
| 2009/0050949 | A1* | 2/2009 | Maruyama ......... H10D 30/0415 257/295 |
| 2010/0102404 | A1 | 4/2010 | Li et al. |
| 2010/0224961 | A1 | 9/2010 | Summerfelt et al. |
| 2010/0320518 | A1 | 12/2010 | Ozaki |
| 2011/0062550 | A1 | 3/2011 | Udayakumar et al. |
| 2013/0149794 | A1 | 6/2013 | Wang |
| 2013/0264620 | A1 | 10/2013 | Yu et al. |
| 2020/0051833 | A1 | 2/2020 | Chen et al. |
| 2020/0235111 | A1 | 7/2020 | Calderoni et al. |
| 2020/0395460 | A1 | 12/2020 | Haratipour et al. |
| 2021/0082928 | A1 | 3/2021 | Chen et al. |
| 2021/0202510 | A1 | 7/2021 | Thareja et al. |
| 2021/0202511 | A1 | 7/2021 | Yeong et al. |
| 2021/0202689 | A1 | 7/2021 | Thareja et al. |
| 2021/0233920 | A1 | 7/2021 | Sukekawa |
| 2021/0272896 | A1 | 9/2021 | Lin et al. |
| 2021/0343731 | A1 | 11/2021 | Chen et al. |
| 2021/0398991 | A1 | 12/2021 | Manfrini et al. |
| 2021/0398992 | A1 | 12/2021 | Wu et al. |
| 2022/0199634 | A1 | 6/2022 | Calderoni et al. |
| 2022/0285376 | A1 | 9/2022 | Chen et al. |
| 2022/0344338 | A1 | 10/2022 | Yang et al. |
| 2022/0376075 | A1 | 11/2022 | Manfrini et al. |
| 2022/0399352 | A1 | 12/2022 | Leng |
| 2023/0187476 | A1 | 6/2023 | Sato et al. |
| 2023/0189532 | A1 | 6/2023 | Müller |

FOREIGN PATENT DOCUMENTS

| | | | |
|---|---|---|---|
| JP | 4428500 | B2 | 3/2010 |
| KR | 100481867 | B1 | 4/2005 |
| KR | 100601953 | B1 | 7/2006 |
| KR | 100791074 | B1 | 1/2008 |
| KR | 100901950 | B1 | 6/2009 |
| WO | 2004076166 | A2 | 9/2004 |

OTHER PUBLICATIONS

Final Office Action notified Jul. 19, 2023 for U.S. Appl. No. 17/478,849.
Final Office Action notified Sep. 14, 2023 for U.S. Appl. No. 17/465,792.
First Office Action mailed Nov. 3, 2023 for TW Patent Application No. 111132919 Office Action recalled for typographical errors.
First Office Action mailed Nov. 14, 2023 for TW Patent Application No. 111132919 Office Action issued on Nov. 3, 2023 recalled for typographical errors.
Non-Final Office Action notified Apr. 25, 2023 for U.S. Appl. No. 17/478,850.
Non-Final Office Action notified Aug. 3, 2023 for U.S. Appl. No. 17/552,293.
Non-Final Office Action notified Aug. 3, 2023 for U.S. Appl. No. 17/552,323.
Non-Final Office Action notified Aug. 3, 2023 for U.S. Appl. No. 17/552,345.
Non-Final Office Action notified Aug. 15, 2023 for U.S. Appl. No. 17/552,269.
Non-Final Office Action notified Dec. 21, 2023 for U.S. Appl. No. 17/465,792.
Non-Final Office Action notified Jan. 18, 2024 for U.S. Appl. No. 17/502,942.
Non-Final Office Action notified Jan. 19, 2024 for U.S. Appl. No. 17/503,009.
Non-Final Office Action notified Jul. 20, 2023 for U.S. Appl. No. 17/50,899.
Non-Final Office Action notified Jul. 20, 2023 for U.S. Appl. No. 17/552,266.
Non-Final Office Action notified Jul. 20, 2023 for U.S. Appl. No. 17/552,330.
Non-Final Office Action notified Mar. 15, 2024 for U.S. Appl. No. 17/485,161.
Non-Final Office Action notified Mar. 31, 2023 for U.S. Appl. No. 17/465,792.
Non-Final Office Action notified Mar. 31, 2023 for U.S. Appl. No. 17/478,849.
Notice of Allowance notified Apr. 3, 2024 for U.S. Appl. No. 17/465,792.
Notice of Allowance notified Aug. 7, 2023 for U.S. Appl. No. 17/85850.
Notice of Allowance notified Aug. 7, 2023 for U.S. Appl. No. 17/553,486.
Notice of Allowance notified Aug. 7, 2023 for U.S. Appl. No. 17/553,496.
Notice of Allowance notified Aug. 10, 2023 for U.S. Appl. No. 17/553,475.
Notice of Allowance notified Aug. 11, 2023 for U.S. Appl. No. 17/478,849.
Notice of Allowance notified Dec. 7, 2023 for U.S. Appl. No. 17/552,330.
Notice of Allowance notified Dec. 13, 2023 for U.S. Appl. No. 17/552,321.
Notice of Allowance notified Dec. 28, 2023 for U.S. Appl. No. 17/552,269.
Notice of Allowance notified Dec. 28, 2023 for U.S. Appl. No. 17/552,293.
Notice of Allowance notified Feb. 16, 2024 for Taiwan Patent Application No. 111132919.
Notice of Allowance notified Jan. 18, 2024 for U.S. Appl. No. 17/552,323.
Notice of Allowance notified Jan. 24, 2024 for U.S. Appl. No. 17/552,345.
Notice of Allowance notified Jul. 3, 2023 for U.S. Appl. No. 17/550,904.
Notice of Allowance notified Jul. 17, 2023 for U.S. Appl. No. 17/553,480.

(56) References Cited

OTHER PUBLICATIONS

Notice of Allowance notified Jul. 19, 2023 for U.S. Appl. No. 17/553,508.
Notice of Allowance notified Jul. 20, 2023 for U.S. Appl. No. 17/553,469.
Notice of Allowance notified Jul. 24, 2023 for U.S. Appl. No. 17/553,472.
Notice of Allowance notified Jul. 26, 2023 for U.S. Appl. No. 17/553,511.
Notice of Allowance notified Jun. 15, 2023 for U.S. Appl. No. 17/396,609.
Notice of Allowance notified Nov. 13, 2023 for U.S. Appl. No. 17/465,796.
Notice of Allowance notified Nov. 22, 2023 for U.S. Appl. No. 17/550,899.
Notice of Allowance notified Nov. 29, 2023 for U.S. Appl. No. 17/552,266.
Office Action—Written Primary Examination Decision—notified Jan. 10, 2024 for Taiwan Patent Application No. 111132920.
Office Action notified May 16, 2023 for Taiwan Patent Application No. 111132920.
Restriction Requirement notified Apr. 26, 2023 for U.S. Appl. No. 17/550,899.
Restriction Requirement notified Apr. 26, 2023 for U.S. Appl. No. 17/552,266.
Restriction Requirement notified Apr. 26, 2023 for U.S. Appl. No. 17/552,321.
Restriction Requirement notified Jan. 11, 2023 for U.S. Appl. No. 17/478,849.
Restriction Requirement notified Jul. 13, 2023 for U.S. Appl. No. 17/552,269.
Restriction Requirement notified May 1, 2023 for U.S. Appl. No. 17/552,330.
U.S. Appl. No. 17/396,609, filed Aug. 6, 2021, Debraj Guhabiswas.
U.S. Appl. No. 17/449,750, filed Oct. 1, 2021, Noriyuki Sato.
Coll et al., "Nanocrystalline Ferroelectric BiFeO3 Thin Films by Low-Temperature Atomic Layer Deposition," Chem. Mater. 2015, 27, 18, 6322-6328Publication Date: Aug. 20, 2015. https://doi.org/10.1021/acs.chemmater.5b02093.
"Perovskite memory devices with ultra-fast switching speed," News Release Jun. 22, 2021, Pohang University of Science & Technology (POSTECH), Downloaded on Oct. 19, 2021 from https://www.eurekalert.org/news-releases/603724. (2 pages).
Chowdhury et al., "Alumina as a Hydrogen Barrier Layer for FeRAM Devices," 2007 Non-Volatile Memory Technology Symposium, 2007, pp. 49-52, doi:10.1109/NVMT.2007.4389944.

Desu et al., "Reactive ion etching of ferroelectric SrBi2TaxNb2—xO9 thin films," Appl. Phys. Lett. 68, 566 (1996); https://doi.org/10.1063/1.116402. (3 pages).
Lee et al., "Plasma-Assisted Dry Etching of Ferroelectric Capacitor Modules and Application to a 32M Ferroelectric Random Access Memory Devices with Submicron Feature Size," Japanese Journal of Applied Physics, vol. 41, No. 11S, 2002. pp. 6749-6753. (5 pages).
Mauersberger et al., "Single-Step Reactive Ion Etching Process for Device integration of Hafnium-Zirconium-Oxide (HZO)/Titanium Nitride (TiN) Stacks." 2021 Semicond. Sci. Technol. 36 095025, https://doi.org/10.1088/1361-6641/ac1827 (7 pages).
Non-Final Office Action notified Dec. 8, 2022 for U.S. Appl. No. 17/396,609.
Restriction Requirement notified Aug. 22, 2022 for U.S. Appl. No. 17/396,609.
Restriction Requirement notified Dec. 30, 2022 for U.S. Appl. No. 17/465,92.
Schneider et al., "Dry-etching of barium-strontium-titanate thin films," Proceedings of the 11th IEEE International Symposium on Applications of Ferroelectrics (Cat. No. 98CH36245) (pp. 51-54). IEEE. Aug. 1998. DOI:10.1109/ISAF.1998.786634. (4 pages).
Shi et al., "Reactive ion etching of sol-gel-derived BST thin film," Ceramics International vol. 30, Iss. 7, 2004, pp. 1513-1516. (4 pages).
Ueda et al., "Plasma etching of PZT capacitor using ISM plasma source for ferroelectric memory application," Integrated Ferroelectrics, 39:1-4, 23-30, DOI: 10.1080/10584580108011924. (8 pages).
Walters, "Scaling and Design of Thin Film Ferroelectric Hafnium Oxide for Memory and Logic Devices," Dissertation for PhD Philosophy, University of Florida, 2020 (170 pages).
Wang et al., "Ferroelectric Devices and Circuits for Neuro-Inspired Computing," MRS Communications (2020), 10, 538-548, doi: 10.1557/mrc.2020.71, (11 pages).
Yeh et al., "Fabrication and Investigation of Three-Dimensional Ferroelectric Capacitors for the Application of FeRAM," AIP Advances, 6 035128(2016); doi: 10.1063/1.4945405. 13 pages.
Yu et al., "Atomic layer deposited ultrathin metal nitride barrier layers for ruthenium interconnect applications" Journal of Vacuum Science & Technology A 35, 03E109 (2017); https://doi.org/10.1116/1.4979709.
Restriction Requirement notified May 1, 2023 for U.S. Appl. No. 17/552,345.
Restriction Requirement notified Sep. 14, 2023 for U.S. Appl. No. 17/465,796.

* cited by examiner

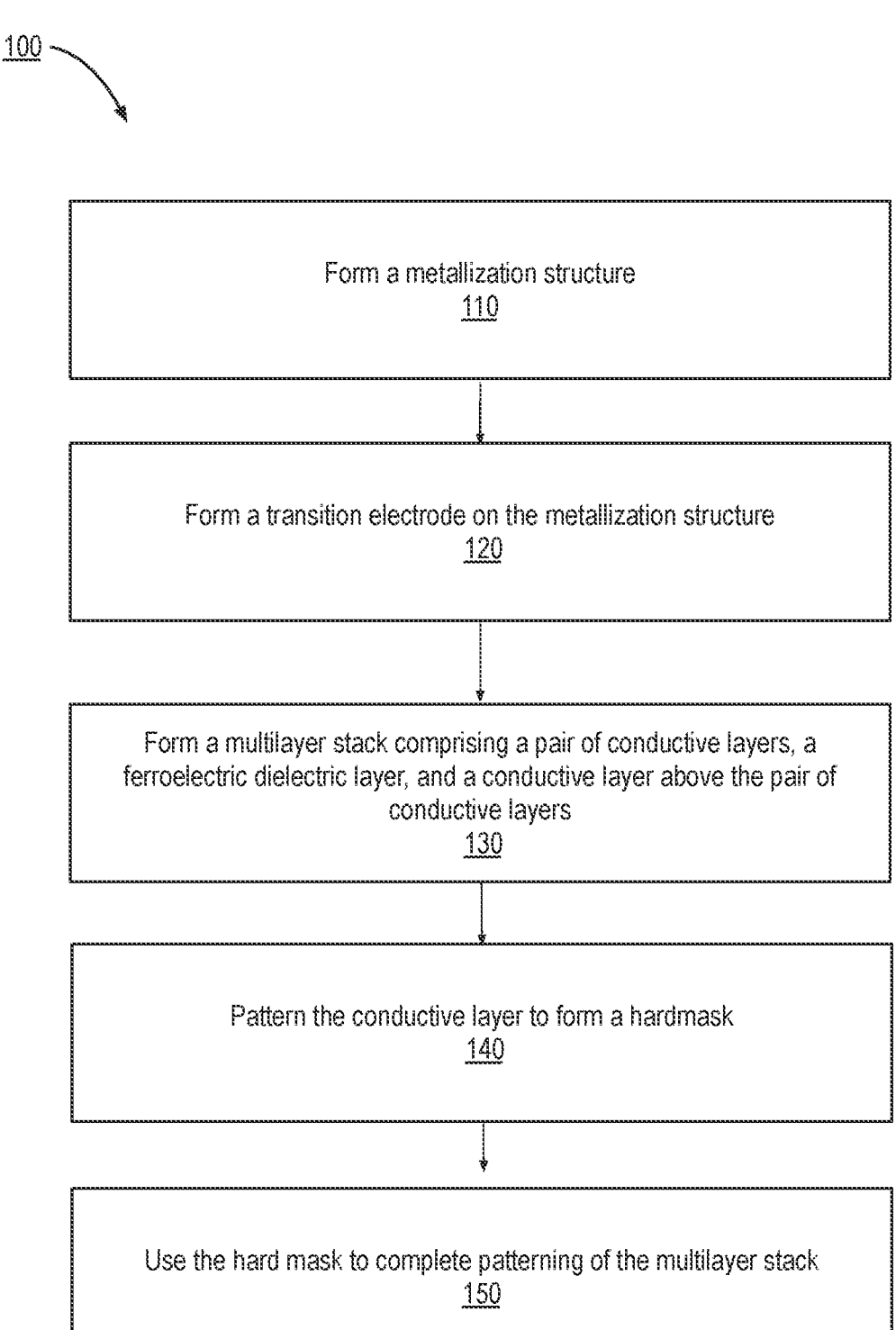

100

Form a metallization structure
110

Form a transition electrode on the metallization structure
120

Form a multilayer stack comprising a pair of conductive layers, a ferroelectric dielectric layer, and a conductive layer above the pair of conductive layers
130

Pattern the conductive layer to form a hardmask
140

Use the hard mask to complete patterning of the multilayer stack
150

FIG. 1

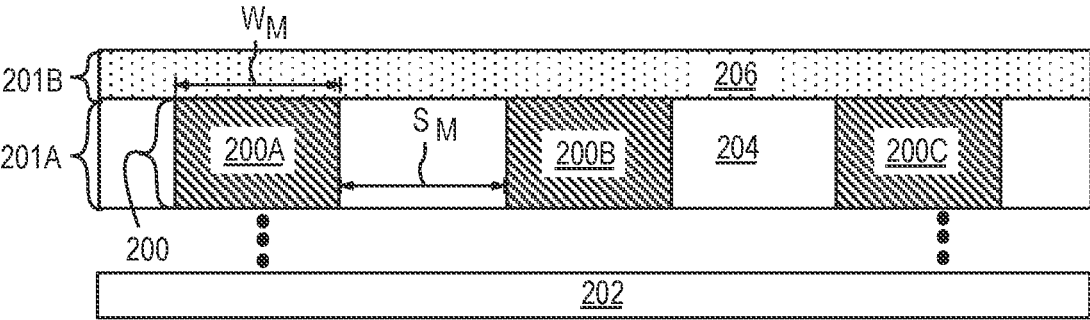
FIG. 2A
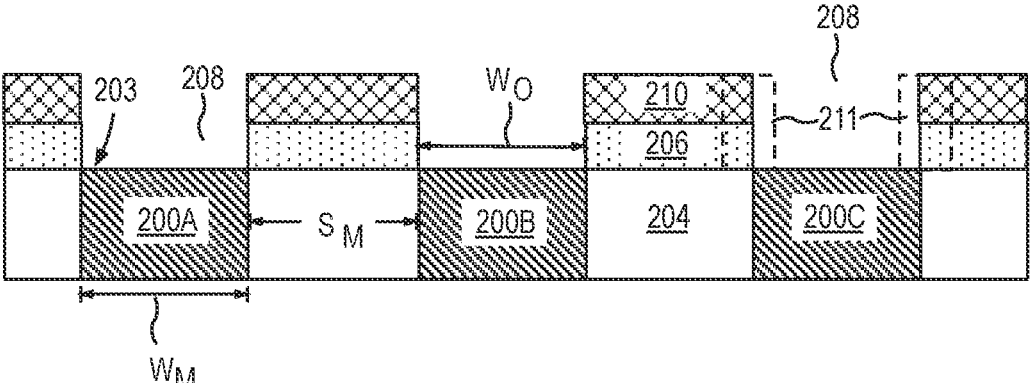
FIG. 2B
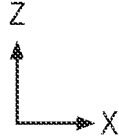

Plate-line parallel to bit-line
1TnC

1TnC
Plate-lines parallel to word-line

FABRICATING NON-LINEAR POLAR MATERIAL BASED CAPACITORS FOR MEMORY AND LOGIC

BACKGROUND

Ferroelectric Random Access Memory (FeRAM) devices include materials that can be difficult to etch. It is useful for masking layers that are used to pattern the device to be more resistant to etch than the materials being etched. As such, alternate stacks, and methods to pattern ferroelectric materials are useful to realize high density array.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections, characteristic of structures formed by nanofabrication techniques. Further, where considered appropriate, reference labels have been repeated among the figures to indicate corresponding or analogous elements.

FIG. 1 illustrates a flow diagram of a method to fabricate a memory device, in accordance with at least one embodiment.

FIG. 2A illustrates a cross-sectional illustration of a plurality of metallization structures formed above a substrate.

FIG. 2B illustrates a cross-sectional illustration of the structure in FIG. 2A following the process to form openings above the plurality of metallization structures.

DETAILED DESCRIPTION

Figure 2C:
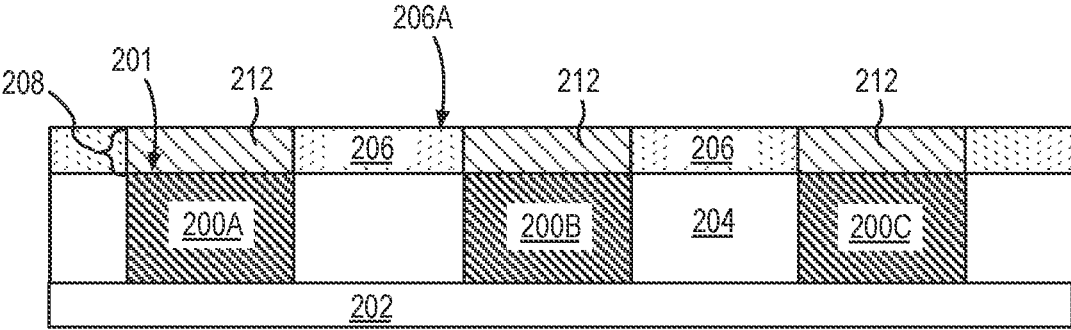
FIG. 2C illustrates a cross-sectional illustration of the structure in FIG. 2B following the process to form a transition electrode above a metallization structure, in accordance with at least one embodiment.

At least one embodiment describes memory devices for high density memory and logic applications and methods of fabrication. While various embodiments are described with reference to ferroelectric random-access memory (FeRAM), capacitive structures formed herein can be used for any application where a capacitor is desired. For example, the capacitive structure can be used for fabricating ferroelectric based or paraelectric based majority gate, minority gate, and/or threshold gate. In the following description, numerous specific details are set forth, such as structural schemes and detailed fabrication methods to provide a thorough understanding of embodiments of the present disclosure. It will be apparent to one skilled in the art that embodiments of the present disclosure may be practiced without these specific details. In other instances, well-known features, such as device operations, are described in lesser detail to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment," "one embodiment," "at least one embodiment," or "some embodiments" means that a particular feature, structure, function, or characteristic described in connection with the embodiment is included in at least one embodiment of the disclosure. Thus, the appearances of the phrase "in an embodiment," "in one embodiment," or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a," "an," and "the" are intended to include the plural forms as well, unless the context clearly indicates otherwise. It will also be understood that "and/or" as used herein refers to and encompasses all possible combinations of one or more of the associated listed items.

Here, "coupled" and "connected," along with their derivatives, may be used herein to describe functional or structural relationships between components. These terms are not intended as synonyms for each other. In at least one embodiment, "connected" may be used to indicate that two or more elements are in direct physical, optical, or electrical contact with each other. "Coupled" may be used to indicated that two or more elements are in either direct or indirect (with other intervening elements between them) physical, electrical, or magnetic contact with each other, and/or that the two or more elements co-operate or interact with each other (e.g., as in a cause-and-effect relationship).

Here, "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies. As used throughout this description, and in the claims, a list of items joined by "at least one of" or "one or more of" can mean any combination of the listed terms.

Here, "adjacent" here generally refers to a position of a thing being next to (e.g., immediately next to or close to with one or more things between them) or adjoining another thing (e.g., abutting it).

Here, "signal" may refer to current signal, voltage signal, magnetic signal, or data/clock signal.

Here, "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Unless otherwise specified in the explicit context of their use, "substantially equal," "about equal," and "approximately equal" mean that there is no more than incidental variation between two things so described. In the art, such variation is typically no more than +/−10% of a predetermined target value.

Here, "left," "right," "front," "back," "top," "bottom," "over," "under," and the like in the description and in the claims, if any, are used for descriptive purposes and not necessarily for describing permanent relative positions. For example, "over," "under," "front side," "back side," "top," "bottom," "over," "under," and "on" as used herein refer to a relative position of one component, structure, or material with respect to other referenced components, structures, or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. Similar distinctions are to be made in the context of component assemblies.

Here, "between" may be employed in the context of the z-axis, x-axis, or y-axis of a device. In at least one embodiment, a material that is between two other materials may be in contact with one or both of those materials. In at least one embodiment, a material that is between two or more materials may be separated from both of the other two materials by one or more intervening materials. In at least one embodiment, a material "between" two other materials may therefore be in contact with either of the other two materials. In at least one embodiment, a material "between" two other materials may be coupled to the other two materials through an intervening material. In at least one embodiment, a device that is between two other devices may be directly connected to one or both of those devices. In at least one embodiment, a device that is between two other devices may be separated from both of the other two devices by one or more intervening devices.

In at least one embodiment, perovskite memory devices are useful for high density memory applications owing to their low power consumption and high on/off ratio. In at least one embodiment, perovskite memory devices can also be useful over other forms of memory such as magnetic tunnel junction-based devices due to the relatively low number of layers implemented for a functional device. In at least one embodiment, perovskite memory devices can also be referred to as FeRAM memory devices. In at least one embodiment, a FeRAM memory device is fully operational with three layers, where a ferroelectric dielectric is contained between two electrode layers. In at least one embodiment, the electrode layers can also include perovskite materials to enable lattice matching and reduction in electrical resistance. In at least one embodiment, introduction of lead-free perovskite materials offers additional environmental benefits without sacrificing device performance.

Patterning of perovskite materials presents many challenges due to the low volatility of many etch by-products. Accumulation of etch by-products on sidewalls of patterned structures often leads to non-functional devices. For this reason, patterning techniques often include ion beam milling to sputter the materials to fabricate isolated devices. Ion beam milling often includes low angle sputter etching (relative to a normal to a device surface) followed by high angle cleaning. However, accumulation of milling residue can be more than 20 nm thick on sidewalls of patterned devices. Residue can have a nonuniform thickness along the sidewall and extensive cleanup processes may be implemented to form functional devices. Extensive cleanup processes can cause damage to sidewalls of devices because cleanup angles may utilize ion beams that are substantially normal to sidewalls of devices. Such ion beams can erode and degrade sidewalls in addition to removing residue.

Ion beam milling can also be self-limiting in high density applications where height of individual devices and close proximity between adjacent devices (spacing) can create shadowing effects. Typical height to spacing ratio for high density devices is less than 2.5:1. Other problems with ion beam milling include lack of selectivity to an implemented masking material. Often the masking material is removed faster than the perovskite materials, leading to mask erosion, erosion of top electrode of a FeRAM device, and sloped sidewalls of one or more layers. Sloped sidewalls that exceed 45 degrees, for example, can limit a density of memory devices in a given area and possibly cause adjacent devices to merge.

In at least one embodiment, to enable high density memory devices, non lead-based perovskite materials may be implemented due to their environmental friendliness for mass production. In at least one embodiment, patterning of memory devices may be enabled by reactive ion etching techniques that utilize feedstock gases such as Ar, $N_2$, $O_2$, HBr, or $CH_4$ in addition to other chemistries. In at least one embodiment, where gas chemistries are combined in specific proportions, the reactive ion etching techniques can lead to residue free sidewall surfaces of a patterned memory device. In at least one embodiment, a plasma-based approach also provides other benefits that include enabling patterning to form devices having greater than 5:1 aspect ratio (e.g., a ratio between height and spacing between any pair of memory devices).

However, patterning of high aspect ratio devices can be challenging because a masking layer typically includes one or more materials that are minimally chosen to withstand the etch process while one or more layers below are patterned. It is useful for the thickness of the masking material to be sufficiently low to not increase the aspect ratio. In at least one embodiment, a dual hardmask approach is considered beneficial where the dual hardmask includes an insulator layer above a conductive material. In at least one embodiment, the insulator layer may be utilized to pattern the conductive material and the dual hardmask may be utilized to etch the FeRAM multilayer stack. In at least one embodiment, the insulator layer is removed prior to etching the FeRAM multilayer stack. In at least one embodiment, the choice of the conductive material should have high-etch selectivity to pattern the FeRAM multilayer stack. In at least one embodiment, in addition to etch selectivity, control residue generated during the etching process (etch residue), and removing such residue is useful to fidelity of patterned memory devices. While noble metals such as Pt, Ru, Pa, Rh, Ir, or Os may provide excellent etch selectivity, at least some of these metals are difficult to be etched and formed in to a hardmask. Residue generated by etching some of these metals is also difficult to remove later. Such etch residue can adhere to sidewalls of the devices being formed and cause shorting between upper and lower electrodes. Of these metals, ruthenium, can form volatile etch by products, such as $RuO_4$, if etched in an oxygen or an oxygen containing plasma. A sufficiently thick ruthenium hardmask can also pattern FeRAM multilayer stack with high fidelity and little to no residue.

In at least one embodiment, ruthenium hardmask can have a non-planar upper surface after the patterning process. In at least one embodiment, the non-planar surface can be planarized. In at least one embodiment, a deposition of spacer and interlayer dielectric around the FeRAM patterned devices may be followed by a chemical mechanical polish (CMP) process to planarize the hardmask. In at least one embodiment, the planarization process may form memory devices with various widths to have substantially the same height, which may facilitate formation of an electrical contact with each FeRAM device.

FIG. 1 illustrates a flow diagram of a method 100 to fabricate a plurality of memory devices, in accordance with at least one embodiment. In at least one embodiment, method 100 begins at operation 110 by forming a metallization structure above a substrate. In at least one embodiment, method 100 continues at operation 120 with the process to fabricate a transition electrode above the metallization structure. In at least one embodiment, method 100 continues at operation 130 with the process to deposit a multi-layer stack comprising a pair of conductive layers, a ferroelectric dielectric layer, and a conductive layer above the pair of conductive layers. In at least one embodiment, operation 130 further includes depositing an insulator layer on the conductive layer. In at least one embodiment, method 100 continues at operation 140 by patterning the conductive layer, to form a hardmask. In at least one embodiment, method 100 concludes at operation 150 by using the hardmask to complete patterning of the multi-layer stack.

In at least one embodiment, where operation 130 further includes depositing an insulator layer, the insulator layer and the conductive layer are patterned at operation 140 to form a dual hardmask. In at least one such embodiment, the dual hardmask is utilized to complete patterning of the multilayer stack at operation 150.

FIG. 2A illustrates a cross-sectional illustration of a plurality of metallization structures 200 formed in level 201A, above substrate 202, in accordance with at least one embodiment. In at least one embodiment, plurality of metallization structures 200 are formed within dielectric 204. In at least one embodiment, three metallization structures are shown, metallization structure 200A, metallization structure 200B, and metallization structure 200C. In at least one embodiment, there can be one or more levels of logic transistors and interconnects between plurality of metallization structures 200 and substrate 202. In at least one embodiment, in high density memory applications, the number of metallization structures can range between 1K and 5K within a given array. In at least one embodiment, plurality of metallization structures 200 have lateral thickness $W_M$. Lateral thickness $W_M$ may be set by a minimum acceptable electrical resistance. In at least one embodiment, plurality of metallization structures 200 are discrete structures that are substantially circular or elliptical in shape. In at least one embodiment, plurality of metallization structures 200 have a maximum lateral thickness between 20 nm and 40 nm (measured along the x-direction, as shown). In at least one embodiment, metallization structure 200A, metallization structure 200B, and metallization structure 200C are lines that extend into the plane of the Figure. In at least one embodiment, metallization structures 200A, 200B, and 200C have substantially the same lateral thickness. In at least one embodiment, a same lateral thickness can minimize variability in device performance.

In at least one embodiment, metallization structure 200A, metallization structure 200B, and metallization structure 200C include copper. In at least one embodiment, metallization structures 200A, 200B, and 200C include a liner layer and a fill metal on the liner layer. In at least one embodiment, liner layer may include a material, such as but not limited to, ruthenium, cobalt, or tantalum, and fill metal may include copper or tungsten. In at least one embodiment, any two adjacent metallization structures, such as metallization structure 200A, and metallization structure 200B, or metallization structure 200B and metallization structure 200C are separated by spacing $S_M$. In at least one embodiment, spacing $S_M$ is substantially determined by a designed density of memory devices to be fabricated within a given area, as well as by structures embedded within layers below metallization structures 200.

In at least one embodiment, etch stop layer 206 is deposited on plurality of metallization structures 200 as well as on dielectric 204. In at least one embodiment, etch stop layer 206 is in level 201B above level 201A. In at least one embodiment, etch stop layer 206 is deposited to a thickness that is chosen to accommodate a thickness of a transition electrode to be formed on metallization structures 200. In at least one embodiment, etch stop layer 206 can also serve as a diffusion barrier layer. In at least one embodiment, a diffusion barrier layer can be beneficial for preventing diffusion of copper from plurality of metallization structures 200 to the memory devices to be formed. In at least one embodiment, etch stop layer 206 includes material such as but not limited to silicon and one or more of nitrogen, oxygen, or carbon. In at least one embodiment, other dielectric materials such as substantially crystalline forms of metal oxides including hafnium, zirconium, niobium, or lanthanum may be used to provide a more robust surface while etching to form memory devices.

FIG. 2B illustrates a cross-sectional illustration of the structure in FIG. 2A following the process to form openings 208 in etch stop layer 206 above the plurality of metallization structures 200, in accordance with at least one embodiment. In at least one embodiment, openings 208 are formed in etch stop layer 206 as shown. In at least one embodiment, openings 208 can be formed by patterning photoresist mask 210 formed on etch stop layer 206. In at least one embodiment, photoresist mask 210 can be formed by a lithographic technique. In at least one embodiment, etch stop layer 206 can be etched by a plasma etch process through openings in photoresist mask 210. Openings 208 may have a lateral thickness $W_O$, as shown. In at least one embodiment, $W_O$ can be greater than or less than lateral thickness $W_M$, as indicated by dashed lines 211. In at least one embodiment, openings 208 have same lateral thickness $W_O$ as lateral thickness $W_M$ of metallization structures 200A, 200B, or 200C.

FIG. 2C illustrates a cross-sectional illustration of the structure in FIG. 2B following the process to form transition electrode 212 above metallization structures 200A, 200B, and 200C (or collectively, metallization structures 200), in accordance with at least one embodiment. In at least one embodiment, the photoresist mask is removed, and a conductive layer is deposited in openings 208, on uppermost surfaces 201 of respective metallization structures 200A, 200B, and 200C, and on etch stop layer 206. In at least one embodiment, after deposition, the conductive layer may be planarized. In at least one embodiment, conductive layer is planarized by a chemical mechanical polish (CMP) process to form transition electrode 212. In at least one embodiment, the CMP process removes the excess conductive layer from above uppermost surface 206A of etch stop layer 206 to form transition electrode 212 above metallization structures 200A, 200B, and 200C. In at least one embodiment, depending on size of openings 208, transition electrode 212 can be confined above respective metallization structure 200A, 200B, and 200C or extend laterally to a region above dielectric 204. In either case, uppermost surfaces 203 of respective metallization structures 200A, 200B, and 200C are not exposed to memory devices to be formed.

Figure 2D:
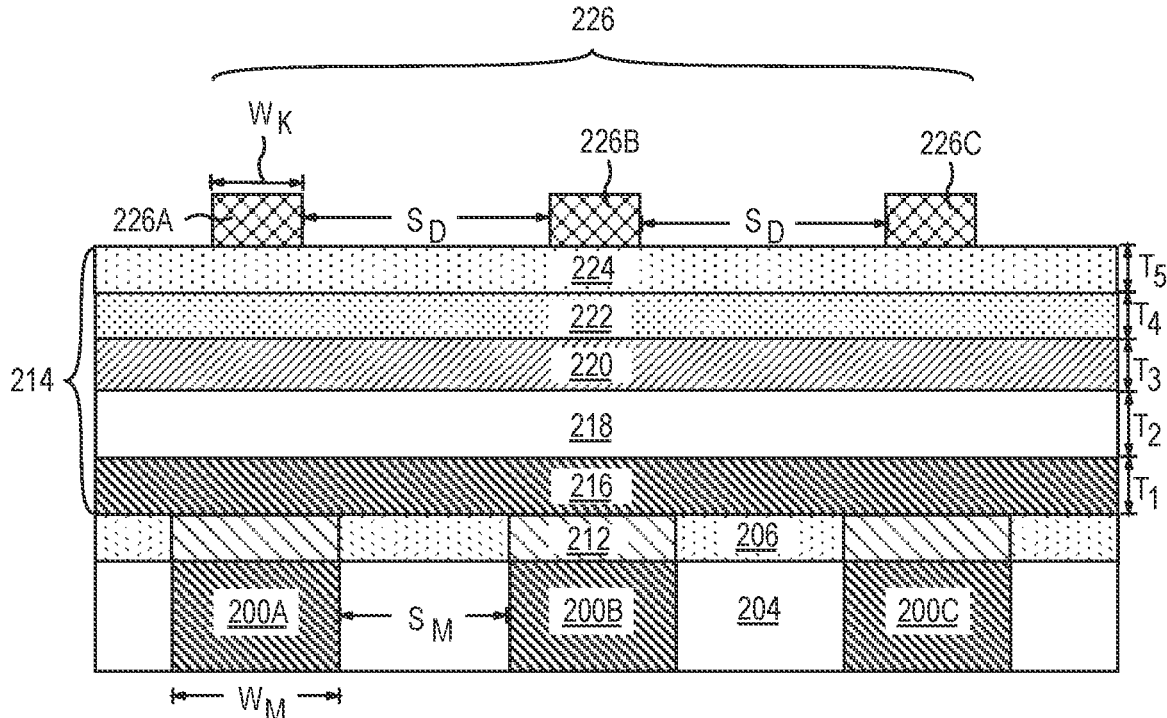
FIG. 2D illustrates a cross-sectional illustration of the structure in FIG. 2C following the process to form a multi-layer stack on the transition electrode, in accordance with at least one embodiment.

FIG. 2D illustrates a cross-sectional illustration of the structure in FIG. 2C following the process to form multilayer stack 214 on transition electrode 212, and etch stop layer 206, in at least one embodiment. In at least one embodiment, all layers of multi-layer stack 214 are deposited in situ, e.g., without breaking vacuum. In at least one embodiment, multi-layer stack 214 is deposited by an atomic layer deposition (ALD) process, a plasma enhanced chemical vapor deposition (PECVD), a chemical vapor deposition (CVD), or a physical vapor deposition (PVD) process.

In at least one embodiment, conductive layer 216 is blanket deposited on transition electrode 212 and on etch stop layer 206. In at least one embodiment, conductive layer 216 includes a conductive ferroelectric oxide. In at least one embodiment, the conductive ferroelectric oxide includes one of a non-Pb perovskite metal oxides, such as but not limited to, $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$ or $CaRuO_3$. In at least one embodiment, conductive layer 216 includes Ir, $Ir_2O_x$, Ru, $RuO_x$, Mo, $MoO_x$, W or $WO_x$. In at least one embodiment, conductive layer 216 includes hexagonal compounds including one or more of $PtCoO_2$, $PdCoO_2$, delafossite structured hexagonal conductive oxides including Al-doped ZnO, spinels including one or more of $Fe_3O_4$. $LiV_2O_4$ or cubic oxides including indium tin oxide or Sn-doped $In_2O_3$.

In at least one embodiment, conductive layer 216 is deposited to thickness $T_1$, that is suitable for minimizing electrical resistance as well as reducing taper in sidewalls during patterning to form memory devices. In at least one embodiment, conductive layer 216 has thickness that ranges between 3 nm and 30 nm. In at least one embodiment, a thickness of less than 30 nm can be useful to prevent significant tapering of sidewalls formed during the patterning process.

In at least one embodiment, deposition process is continued with deposition of dielectric layer 218. In at least one embodiment, dielectric layer 218 is blanket deposited on conductive layer 216. In at least one embodiment, dielectric layer 218 has a thickness, $T_2$, between (and inclusive of) 1 nm and 30 nm.

In at least one embodiment, dielectric layer 218 includes a non-Pb perovskite material in the form $ABO_3$, where A and B are two cations of different sizes and O is oxygen. A is generally larger than B in size. In at least one embodiment, non-Pb perovskites can also be doped, e.g., by La or lanthanides. The non-Pb perovskite material can include one or more of La, Sr, Co, Cr, K, Nb, Na, Sr, Ru, Y, Fe, Ba, Hf, Zr, Cu, Ta, Bi, Ca, Ti, or Ni. In at least one embodiment, non-Pb perovskite material includes one of: $BaTiO_3$, $KNbO_3$, or $NaTaO_3$.

In at least one embodiment, dielectric layer 218 is of the form $ABO_3$, where A and B are two cations of different sizes and O is oxygen. In at least one embodiment, the perovskite can be doped, e.g., by one or more elements from lanthanide series of the periodic table, or one or more elements of 3d, 4d, 5d, 6d, 4f, or 5f series of the periodic table. In at least one embodiment, perovskites can be suitably doped to achieve a spontaneous distortion in a range of 0.3% to 2%. In at least one embodiment, in chemically substituted lead titanate such as Zr in Ti site or La or Nb in Ti site, the concentration of these substitutes is such that it achieves the spontaneous distortion in the range of 0.3% to 2%. In at least one embodiment, the lead based perovskite material includes lead zirconium titanate (PZT) or PZT with a doping material, wherein the doping material is one of La or Nb.

In at least one embodiment, dielectric layer 218 includes a low voltage ferroelectric material. Low voltage FE materials can be of the form $AA'BB'O_3$, where A' is a dopant for atomic site A and can be an element from the lanthanides series, and B' is a dopant for atomic site B and can be an element from the transition metal elements such as Sc, Ti, V, Cr, Mn, Fe, Co, Ni, Cu, or Zn. A' may have the same valency of site A, with a different polarizability. Voltage below 3 volts is sufficiently low to be characterized as low voltage.

In at least one embodiment, dielectric layer 218 includes bismuth ferrite (BFO) or BFO with a first doping material, wherein the first doping material is one of lanthanum, elements from lanthanide series of a periodic table, or elements of 3d, 4d, 5d, 6d, 4f, or 5f series of the periodic table.

In at least one embodiment, BFO is doped with Mn or Sc, wherein Mn or Sc achieve a spontaneous distortion in BFO in a range of 0.3% to 2%.

In at least one embodiment, dielectric layer 218 includes a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST).

In at least one embodiment, dielectric layer 218 includes hexagonal ferroelectrics of a type h-$RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides. In at least one embodiment, dielectric layer 218 includes a hexagonal ferroelectric which includes one of: $YMnO_3$ or $LuFeO_3$.

In at least one embodiment, dielectric layer 218 includes a hafnium oxide of the form $Hf_{1-x}E_xO_z$, where 'x' denotes a fraction, and E includes one of Al, Ca, Ce, Dy, Er, Gd, Ge, La, Sc, Si, Sr, Sn, Zr, or Y.

In at least one embodiment, dielectric layer 218 includes $Al_{(1-x)}Sc_{(x)}N$, $Ga_{(1-x)}Sc_{(x)}N$, $Al_{(1-x)}Y_{(x)}N$ or $Al_{(a)}Mg_{(b)}Nb_{(c)}N$, where a, b, and c are the respective compositional fractions.

In at least one embodiment, dielectric layer 218 includes niobate type compounds such as $LiNbO_3$, $LiTaO_3$, $LiTaO_2F_2$, or $Sr_xBa1-xNb_2O_6$ where $0.32 \leq x \leq 0.8$, or $KSr_2Nb_5O_{15}$.

In at least one embodiment, dielectric layer 218 comprises multiple layers, for example, alternating layers of $[Bi_2O_2]$ 2+, and pseudo-perovskite blocks ($Bi_4Ti_3O_{12}$ and related Aurivillius phases), with perovskite layers that are 'n' octahedral layers. In at least one embodiment, examples of multiple layers includes improper ferroelectric material. An improper ferroelectric is a ferroelectric where the primary order parameter is an order mechanism such as strain or buckling of the atomic order. In at least one embodiment, the improper ferroelectric material includes an epitaxial bilayer stack including one of: [barium titanate/strontium titanate]n or [lanthanum aluminate/strontium titanate]n, wherein 'n' represents a number of bilayers, and wherein 'n' is between 1 and 100.

While various embodiments here are described with reference to ferroelectric material for storing the charge state, at least one embodiment may also be applicable for paraelectric material, anti-ferroelectric material, or a combination of them.

In at least one embodiment, dielectric layer 218 includes $LuFeO_3$ class of materials or super lattice of ferroelectric and paraelectric materials. In at least one embodiment, f-orbital materials (e.g., lanthanides) are doped to the ferroelectric material of dielectric layer 218 to make a paraelectric material. In at least one embodiment, room temperature paraelectric materials include: $SrTiO_3$, Ba(x)Sr(y)TiO3 (where x is −0.05, and y is 0.95), $HfZrO_2$, or Hf—Si—O. In at least one embodiment, dielectric layer 218 includes an anti-ferroelectric material. In at least one embodiment, anti-ferroelectric material may include one of: $HfSiO_2$ and HfZrOx with >30% Si and >30% Zr doping, $ZrO_2$, $NaNbO_3$, or >5% K doped $NaNbO_3$.

In at least one embodiment, the process is continued with blanket deposition of conductive layer 220 on dielectric layer 218. In at least one embodiment, conductive layer 220 includes a conductive ferroelectric oxide. In at least one embodiment, conductive ferroelectric oxide includes one of a non-Pb perovskite metal oxides, such as but not limited to, $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, or $CaRuO_3$. In at least one embodiment, conductive layer 216 includes Ir, $Ir_2O_x$, Ru, $RuO_x$, Mo, $MoO_x$, W, or $WO_x$. In at least one embodiment, conductive layer 220 includes a material that is the same or substantially the same as the material of conductive layer 216. In at least one embodiment, when conductive layers 216 and 220 include the same material, the multi-layer stack can be substantially symmetric in device voltage/current characteristics. In at least one embodiment, conductive layer 220 is deposited to thickness $T_3$. In at least one embodiment, it is useful for conductive layer 220 to be as thin as possible to facilitate fabrication. In at least one embodiment, thickness $T_3$ is between 3 nm and 30 nm. In at least one embodiment, conductive layer 220 can have a different thickness than conductive layer 216. In at least one embodiment, $T_3$ is substantially equal to $T_1$.

In at least one embodiment, the deposition process to form multi-layer stack 214 continues with the formation of conductive layer 222 on conductive layer 220. In at least one embodiment, conductive layer 222 is blanket deposited by a CVD or PVD process. In at least one embodiment, conductive layer 222 includes a material that has a favorable etch selectivity compared to ferroelectric materials in multi-layer stack 214. In at least one embodiment, conductive layer 222 includes ruthenium, platinum, or iridium. In at least one embodiment, ruthenium can be patterned with high fidelity with respect to a masking layer formed on conductive layer 222. In at least one embodiment, it is useful to deposit conductive layer 222 to thickness $T_4$, that enables patterning of conductive layer 220, dielectric layer 218 and conductive layer 216. In at least one embodiment, conductive layer 222 can be deposited to thickness $T_4$, that depends on a total desired thickness of multi-layer stack 214. In at least one embodiment, thickness $T_4$ is at least 20 nm.

In at least one embodiment, deposition process to form multi-layer stack 214 continues with the formation of insulator layer 224 on conductive layer 222. In at least one embodiment, insulator layer 224 includes a material, for example, $SiO_2$, $Si_3N_4$, DLC (Diamond Like Carbon), or $Al_2O_3$. In at least one embodiment, portions of insulator layer 224 are designed to be removed from conductive layer 222 at least prior to formation of contacts on conductive layer 222 or conductive layer 220. In other embodiments, insulator layer 224 is designed to be removed at least prior to etching dielectric layer 218. In at least one embodiment, insulator layer 224 is designed to be removed after completing pattering of multi-layer stack 214.

In at least one embodiment, a photoresist mask 226 is formed on the insulator layer 224 by a lithographic process. In at least one embodiment, photoresist mask 226 includes blocks 226A, 226B, and 226C. In at least one embodiment, blocks 226A, 226B, and 226C can act as a mask for patterning discrete memory devices. In at least one embodiment, adjacent blocks, for example, blocks 226A and 226B, and blocks 226B and 226C are separated from each other by spacing $S_D$. As discussed above, in at least one embodiment, a maximum density of memory devices may be determined by $W_M$ and $S_M$. In at least one embodiment, a maximum lateral thickness of memory devices to be formed is determined by lateral thickness $W_K$ of blocks 226A, 226B, or 226C and spacing $S_D$. In at least one embodiment, a ratio between the combined sum of thicknesses $T_1$, $T_2$, and $T_3$, and spacing $S_D$ places a limit on the profile or sidewall angles of layers of memory devices to be formed, especially if the sidewall angle is non-vertical. Non-vertical sidewall angles of the different layers in multi-layer stack 214 will be discussed below.

In at least one embodiment, blocks 226A, 226B, or 226C may have a lateral thickness $W_K$, that may be greater than, less than, or equal to the lateral thickness $W_M$ of metallization structure 200A, metallization structure 200B, or metallization structure 200C, respectively. In at least one embodiment, lateral thickness $W_K$ is substantially equal to lateral thickness $W_M$. In at least one embodiment, lateral thickness $W_K$ is approximately half the lateral thickness $W_M$.

The process to etch insulator layer 224 and multi-layer stack 214 is described next. In at least one embodiment, conductive layer 222 is etched by plasma etch process. In at least one embodiment, the plasma etch process may include a discharge produced by a magnetic enhanced reactive ion etching mechanism, an electron cyclotron resonance discharge, or an inductively coupled plasma discharge. In at least one embodiment, the plasma parameters may be characterized by a range of plasma densities, such as between 1e9-1e12 ions/cm³. pressures in the range of 0.001-10 Torr, and electron temperatures in the range of 1-8 eV. In at least one embodiment, ions may be accelerated to the surface from a plasma sheath by means of electrostatic chuck with biasing capabilities that are independent of the power delivered to sustain various plasma configurations. In at least one embodiment, it may be useful to pattern the insulator layer 224 to have substantially vertical side walls. In at least one embodiment, substantially vertical side walls can prevent increase in lateral thickness (or width) when patterning remaining layers in multi-layer stack 214 to form memory devices.

In at least one embodiment, insulator layer 224 is deposited to thickness $T_5$, that is sufficiently thick that it remains, at least partially, after etching conductive layer 222. In at least one embodiment, thickness $T_5$ is sufficiently thick that portions remain after all layers in multi-layer stack 214 are etched. In at least one embodiment, thickness $T_5$ is insufficient in that the plasma etch process completely removes insulator layer 224 by the time all layers in multi-layer stack 214 are etched.

In at least one embodiment, where PVD process is utilized to deposit conductive layer 222, conductive layer 220, dielectric layer 218, and conductive layer 216, PVD process may include a sputter or a co-sputtering processing with one or more targets.

Figure 2E:
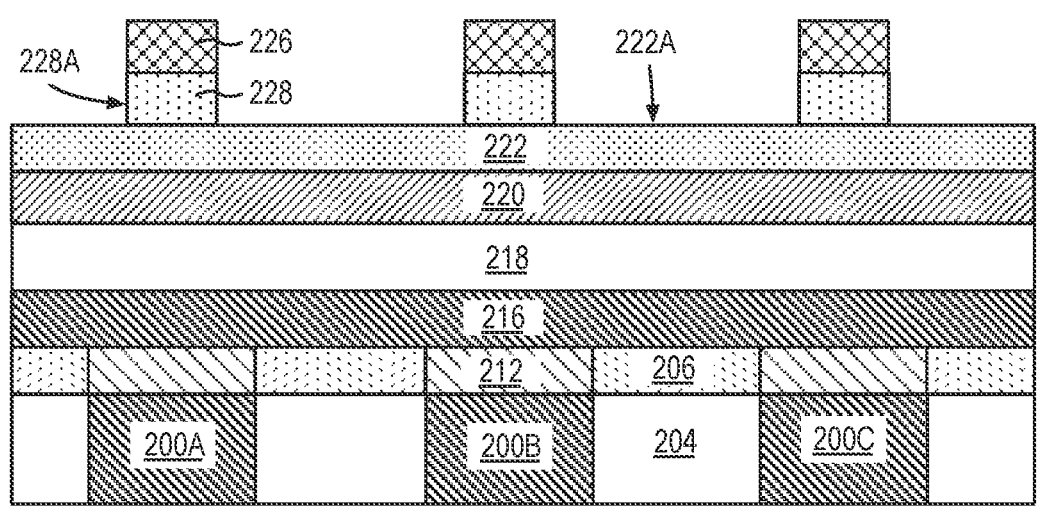
FIG. 2E illustrates a cross-sectional illustration of the structure in FIG. 2D following the process to pattern an uppermost layer in the multi-layer stack.

FIG. 2E is a cross-sectional illustration of the structure in FIG. 2D following the process to etch insulator layer 224 (FIG. 2D) to form hardmask 228. In at least one of the three different plasma discharges described above, the plasma etch process may include a combination of $CH_XF_Y$ (fluorocarbon), $O_2$, and Ar based gases. In at least one embodiment, hardmask 228 has substantially vertical sidewall 228A relative to surface 222A. In at least one embodiment, photoresist mask 226 is removed after forming hardmask 228. In at least one embodiment, a plasma etch chemistry utilized to etch conductive layer 222 can also remove photoresist mask 226.

Figure 3A:
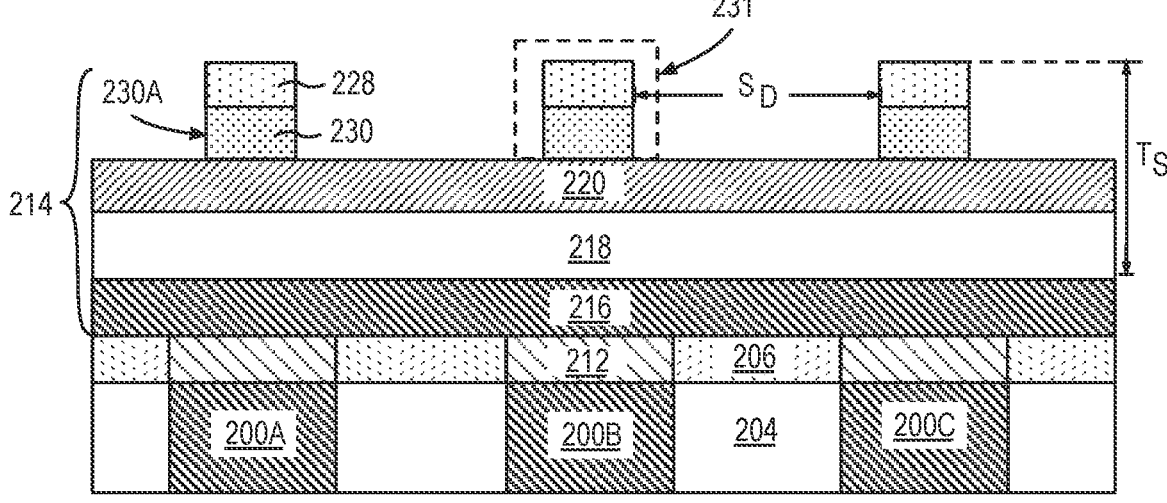
FIG. 3A illustrates a cross-sectional illustration of the structure in FIG. 2E following the process to pattern an insulator layer and a conductive layer in the multi-layer stack.

FIG. 3A illustrates a cross-sectional illustration of the structure in FIG. 2E following the process to form hardmask 230, in accordance with at least one embodiment. In at least one embodiment, a plasma etch is utilized. In at least one embodiment, plasma etch may utilize hardmask 228 to etch conductive layer 222 (FIG. 2E). In at least one embodiment, where conductive layer 222 (FIG. 2E) includes Ru, an oxygen containing plasma may be utilized to etch. In at least one embodiment, the oxygen containing chemistry may be utilized to etch and form hardmask 230. In at least one embodiment, oxygen containing chemistry may be highly selective to material of hardmask 228. Sidewalls 230A of hardmask 230 may be substantially vertical or tapered. In at least one embodiment, sidewalls 230A are substantially vertical.

In at least one embodiment, plasma etch process has a combination of features suitable to etch to form hardmask 230 selectively to hardmask 228. In at least one embodiment, hardmask 230 is formed using plasma etch process that utilizes a combination of gas chemistry including oxygen, fluorine, such as $CF_4$, $SF_6$, $NF_3$, or $CHF_3$, etc., and chlorine, such as, $BCl_3$ or $CH_3Cl$. In at least one embodiment, other gases such as $CH_4$, $N_2$, Ar, or HBr, can also be added to the chemistry either to act as a carrier gas or to aid various chemical pathways for etching. In at least one embodiment, plasma etch process utilizes chuck temperatures between 10 and 60 degrees Celsius while operating at sufficiently low pressure, such as below 1 Pa. In at least one embodiment, plasma etch process utilizes chuck temperatures above 60 degrees Celsius but lower than 300 degrees Celsius. In at least one embodiment, a combination of high plasma bias and low plasma bias may be utilized. A portion 231 of the structure in FIG. 3A is depicted in FIG. 3B.

Figure 3B:
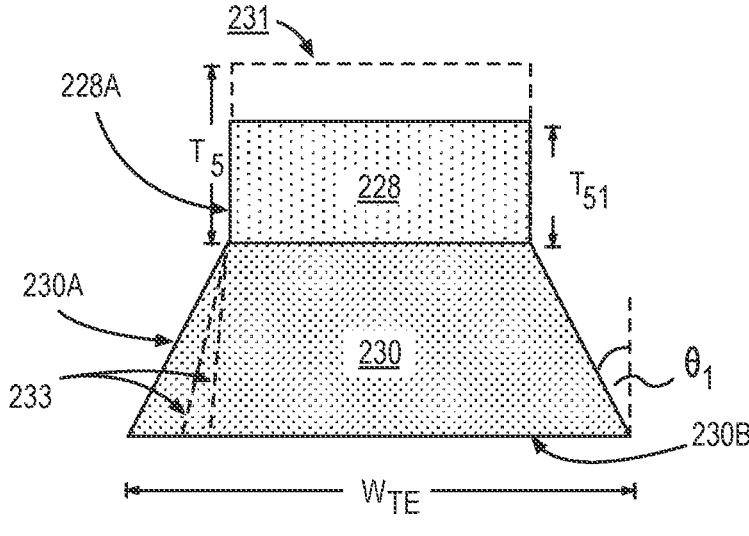
FIG. 3B illustrates an enhanced cross-sectional illustration of a portion of the multi-layer stack FIG. 3A.

FIG. 3B illustrates an enhanced cross-sectional illustration of portion 231 of the structure in FIG. 3A, in accordance with at least one embodiment. In at least one embodiment, sidewalls 230A are not vertical and have a slope that is different from 90 degrees with respect to normal to lowermost surface 230B of hardmask 230, as shown. In at least one embodiment, hardmask 230 is etched to have sidewalls 230A that are sloped, as shown. The slope may be defined by angle $theta_1$ ($\theta_1$). While it is useful for $theta_1$ to be substantially close to zero, in at least one embodiment, $theta_1$ can be in the range of 0 to 30 degrees with respect to normal relative to lowermost surface 230B. In at least one embodiment, $theta_1$ is in the range of 0 to 15 degrees. In general, a maximum allowable $theta_1$, e.g., $theta_{1max}$, is set by ratio $R_{HS}$ between thickness $T_S$ of multi-layer stack 214 and spacing $S_D$. In at least one embodiment, $theta_{1max}$ is inversely proportional to $R_{HS}$. In at least one embodiment, as spacing $S_D$ decreases, maximum permissible slope decreases to prevent merging between memory devices (to be formed). As indicated by dashed lines 233, in at least one embodiment, variation in the slope of sidewall 230A can change lateral thickness $W_{TE}$ of lowermost surface 230B. In at least one embodiment, lateral thickness $W_{TE}$ can determine lateral thickness of memory devices to be formed.

In at least one embodiment, increased oxygen content in gas chemistry can be utilized during an over-etch step compared to a main etch step once conductive layer 220 is exposed. In at least one embodiment, a main etch step may comprise up to 90% of an etch process, and an over etch step may comprise the remaining 10% of the etch process. In at least one embodiment, an increase in oxygen content during the over etch step can help provide selectivity against conductive layer 222, while shaping hardmask 230. In at least one embodiments oxygen content can be increased by at least 10%.

In at least one embodiment, hardmask 228 is eroded during the plasma etch process as shown. In at least one embodiment, anywhere between 30% to 50% of hardmask 228 may be removed during patterning to form hardmask 230, as shown. In at least one embodiment, hardmask 230 may have thickness $T_{S1}$ that is 30% to 50% of as deposited thickness $T_S$.

Figure 4A:
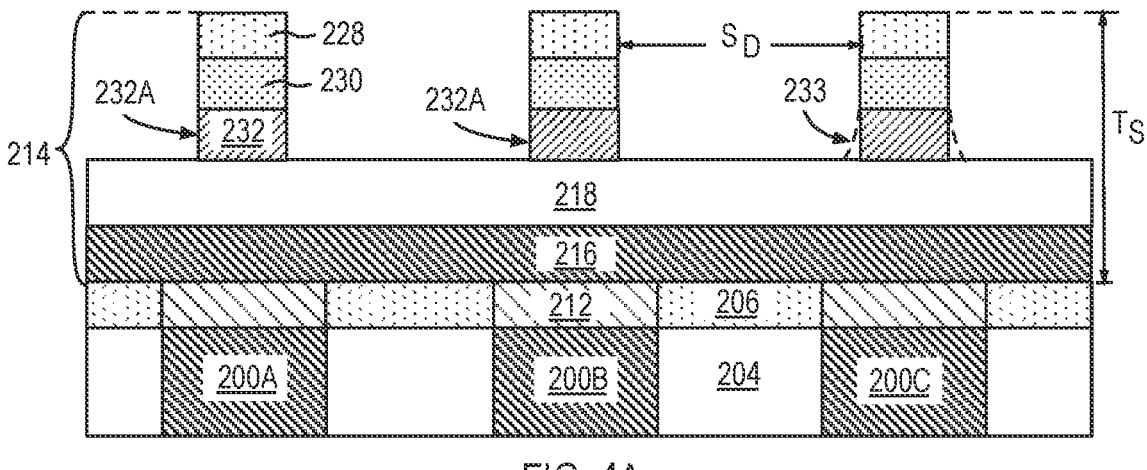
FIG. 4A illustrates a cross-sectional illustration of the structure in FIG. 3A following the process to etch a first conductive layer within the multi-layer stack.

FIG. 4A illustrates a cross-sectional illustration of the structure in FIG. 3A following the formation of top electrode 232, in accordance with at least one embodiment. In at least one embodiment, a plasma etch process is utilized to etch conductive layer 220 (FIG. 3A). In at least one embodiment, the plasma etch process may contain different gas chemistries from those utilized to pattern and form hardmask 230.

In at least one embodiment, the plasma etch process utilized leaves at least a portion of hardmask 228 intact after forming top electrode 232. In at least one embodiment, sidewalls 232A of top electrode may be substantially vertical or tapered. In at least one embodiment, sidewalls 232A are substantially vertical. Dashed lines 233 represent an embodiment where sidewalls 232A can be tapered.

Figure 4B:
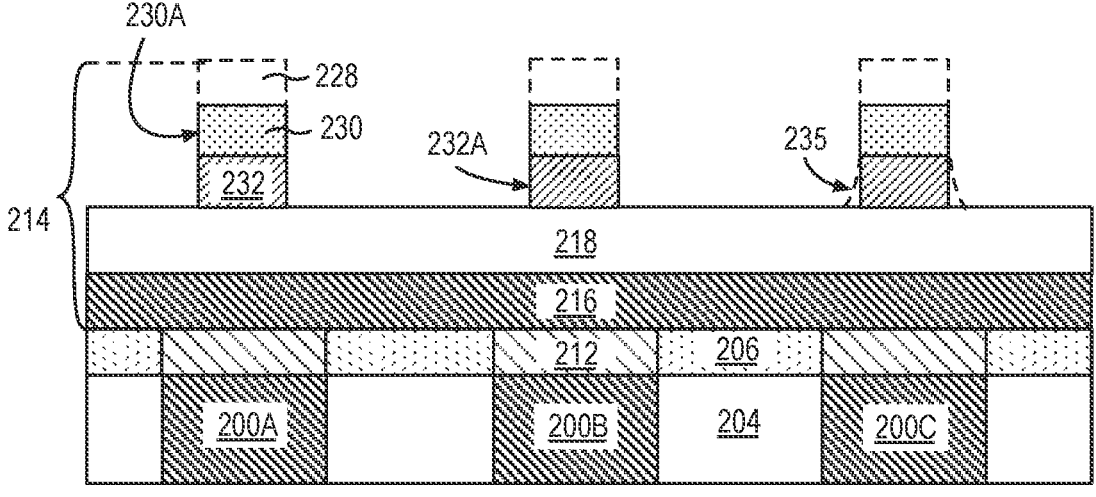
FIG. 4B illustrates a cross-sectional illustration of the structure in FIG. 3A following the process to etch a second conductive layer within the multi-layer stack.

FIG. 4B illustrates a cross-sectional illustration of the structure in FIG. 3A following the formation of top electrode 232, in accordance with at least one embodiment. In at least one embodiment, a plasma etch process is utilized to etch conductive layer 220 (FIG. 3A). In at least one embodiment, the plasma etch process may contain different gas chemistries from those utilized to pattern and form hardmask 230.

In at least one embodiment, plasma etch process etches hardmask 228 after forming top electrode 232. In at least one embodiment, the plasma etch process preserves hardmask 228 (as indicated by dashed lines), after forming top electrode 232.

In at least one embodiment, sidewalls 232A of top electrode are substantially vertical. In at least one embodiment, sidewalls 232A of top electrode are tapered. As shown, sidewalls 232A are substantially vertical. Dashed lines 235 illustrate at least one embodiment where sidewalls 232A are tapered.

Figure 5A:
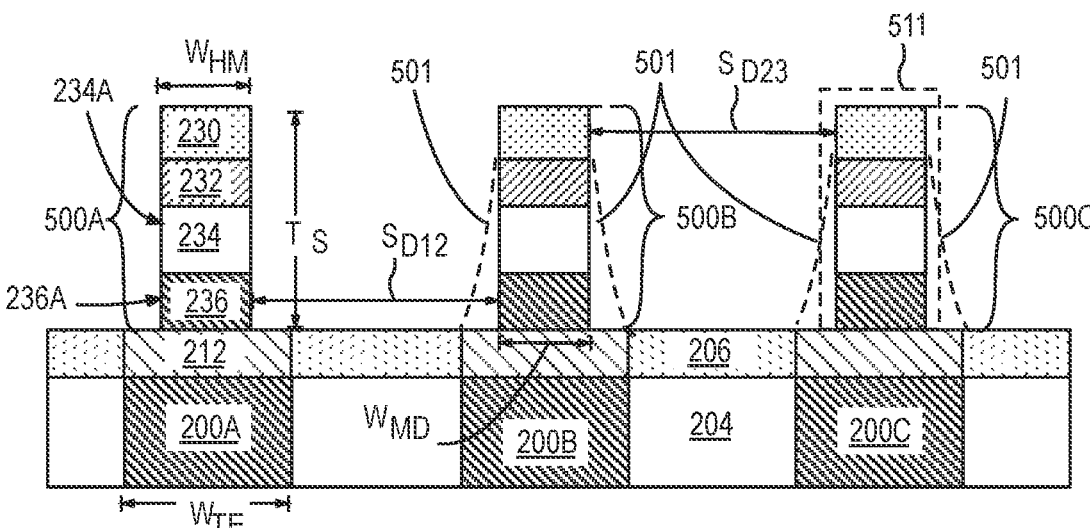
FIG. 5A illustrates a cross-sectional illustration of the structure in FIG. 4A following the process to etch remaining layers in the multi-layer stack.

FIG. 5A illustrates a cross-sectional illustration of the structure in FIG. 4A following the process to form memory devices such as memory devices 500A, 500B, and 500C, in accordance with at least one embodiment. In at least one embodiment, plasma etch process utilized to etch and form top electrode 232 is continued to etch remaining layers. In at least one embodiment, plasma etch is utilized to etch dielectric layer 218 (FIG. 4A) to form patterned dielectric layer (herein dielectric layer 234) and conductive layer 216 (FIG. 4A) to form bottom electrode 236.

In at least one embodiment, the plasma etch process utilized to etch dielectric layer 218 may utilize oxygen, carbon, or boron in conjunction with a halide species. In at least one embodiment, plasma etch may advantageously etch dielectric layer 234 selective to hardmask 230. In at least one embodiment, plasma etch process utilized to form bottom electrode 236 may be substantially same as the etch process utilized to form top electrode 232. In at least one embodiment, process of forming top electrode 232, dielectric layer 234, and bottom electrode 236 also completes formation of memory devices 500A, 500B, and 500C. In at least one embodiment, plasma etch process etches and removes hardmask 228 (FIGS. 4A-4B), during etching of layers in memory devices 500A, 500B, and 500C.

In at least one embodiment, sidewalls 234A of etched dielectric layer 234 are substantially vertical, as shown. In at least one embodiment, bottom electrode 236 is plasma etched to have sidewalls 236A that are substantially vertical, as shown. In at least one embodiment, hardmask 230 can also be substantially preserved through the etch process, and lateral width $W_{HM}$ of hardmask 230 is substantially preserved. In at least one embodiment, lateral width $W_{HM}$ is also a lateral width $W_{MD}$ of memory device 500A, memory device 500B or memory device 500C.

In at least one embodiment, if the material of top electrode 232 is same or substantially same as the material of bottom electrode 236, preservation of hardmask 230 is advantageous to prevent loss of top electrode 232 during etching to form bottom electrode 236. In at least one embodiment, preservation of hardmask 230 may use a lower plasma bias etch process while etching layers below top electrode 232.

In at least one embodiment, memory devices 500A and 500B are separated by lateral spacing $S_{D12}$, and memory devices 500B and 500C are separated by lateral spacing $S_{D23}$. In at least one embodiment, lateral spacing $S_{D12}$ is substantially the same as lateral spacing $S_{D23}$. In at least one embodiment, the height of memory devices 500A, 500B, and 500C is $H_{FD}$. In at least one embodiment, ratio of height to lateral spacing $H_{FD}{:}S_{D12}$ or $S_{D23}$ is between 1:2 and 5:1. In at least one embodiment, lateral spacing $S_{D12}$ or lateral spacing $S_{D23}$ are a function of the sidewall profile of top electrode 232, bottom electrode 236, and dielectric layer 234 in memory devices 500A, 500B, and 500C. In at least one embodiment, lateral spacing $S_{D12}$ and lateral spacing $S_{D23}$ are substantially uniform when sidewall profiles of memory devices 500A, 500B, and 500C are substantially vertical. In at least one embodiment, where sidewalls of memory devices 500A, 500B, and 500C are not vertical, as indicated by dashed lines 501, lateral spacing $S_{D12}$ and lateral spacing $S_{D23}$ are decreased compared to examples where sidewalls of memory devices 500A, 500B, and 500C are substantially vertical. A portion 511 of the structure in FIG. 5A is depicted in FIG. 5B.

Figure 5B:
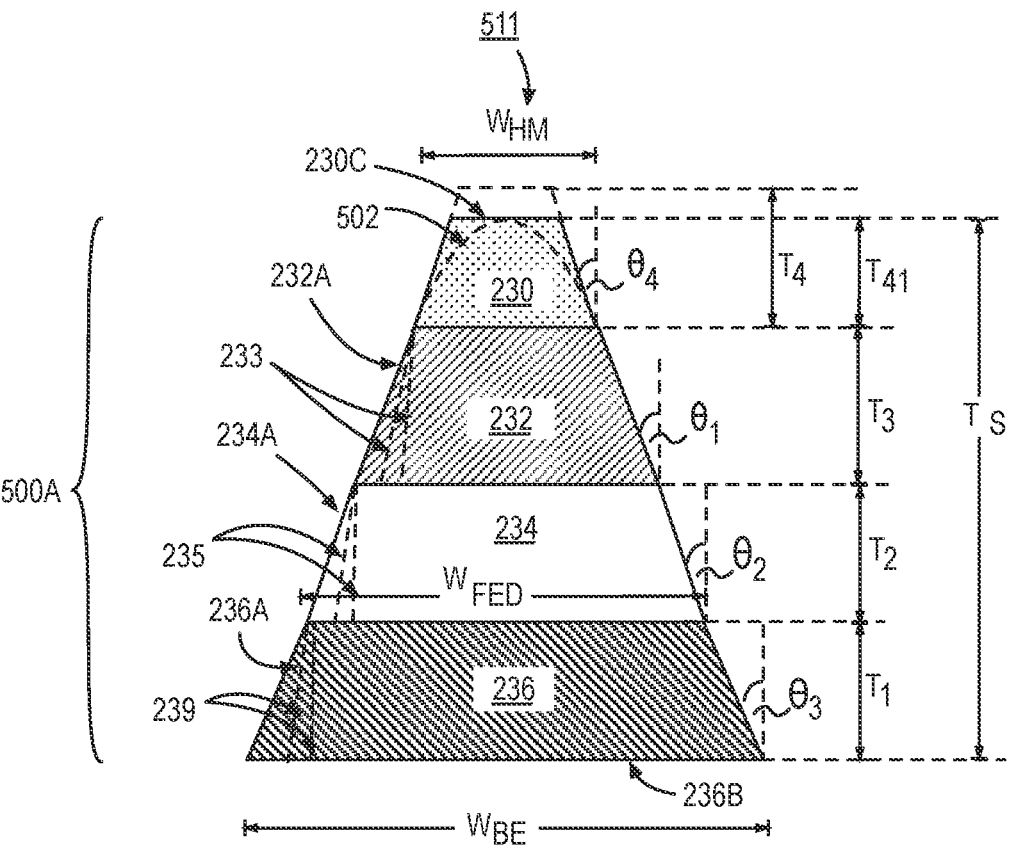
FIG. 5B illustrates an enhanced cross-sectional illustration of a portion of the structure in FIG. 5A, in accordance with at least one embodiment.

FIG. 5B illustrates an enhanced cross-sectional illustration of portion 511 of the structure in FIG. 5A, in accordance with at least one embodiment. In at least one embodiment, hardmask 230 may be further eroded during the etching process. In at least one embodiment, final thickness $T_{41}$ of hardmask 230 may be reduced compared to as deposited thickness $T_4$. In at least one embodiment, despite top surface 230C having a curved profile, lateral thickness $W_{HM}$ is preserved.

In at least one embodiment, top of hardmask 230 may be rounded due to ion bombardment. In at least one embodiment, top surface 230C may be curved as indicated by dashed lines 502. In at least one embodiment, curvature of top surface 230C may depend on several factors including length of etch time, energy of ions impinging on surface, thickness, and selectivity between material of hardmask 230 and layers below.

In at least one embodiment, memory device 500A includes sloped sidewalls. In at least one embodiment, slope can vary between 0 degrees and 30 degrees from a normal relative to lowermost surface 236B. In at least one embodiment, memory device 500A can have an average slope. In at least one embodiment, patterning memory device 500A results in sidewalls of constituent layers to have varying slopes. In at least one embodiment, top electrode 232 comprises a slope having angle theta$_1$ ($\theta_1$), dielectric layer 234 comprises a slope having angle theta$_2$ ($\theta_2$), bottom electrode 236 comprises a slope having angle theta$_3$ ($\theta_3$), and hardmask 230 comprises a slope having angle theta$_4$. In at least one embodiment, angles theta$_1$, theta$_2$, theta$_3$, and theta$_4$ ($\theta_4$) are individually measured relative to a normal to lowermost surface 236B of bottom electrode 236.

In at least one embodiment, maximum allowable theta$_1$, theta$_2$, theta$_3$, and theta$_4$, e.g., theta$_{1max}$ ($\theta_{1max}$), theta$_{2max}$ ($\theta_{2max}$), theta$_{3max}$ ($\theta_{3max}$), and theta$_{4max}$ ($\theta_{4max}$), are set by ratio $R_{HS}$ between thickness $T_S$ and lateral spacing $S_{D12}$ or $S_{D23}$, as shown in FIG. 5A, e.g., $R_{HS}=T_S:S_{D12}$ or $S_{D23}$. In at least one embodiment, thickness $T_S$ can be between 7 nm and 90 nm, while lateral spacing $S_{D12}$ or $S_{D23}$ can be between 20 nm and 50 nm. Referring again to FIG. 5B, in at least one embodiment, when ratio $R_{HS}$ is 1:1 or less, angles theta$_1$, theta$_2$, theta$_3$, and theta$_4$ can individually be up to 30 degrees. In at least one embodiment, for $R_{HS}$ greater than 1:1, it is useful to minimize the total flare or increase in width of memory devices 500A. In at least one embodiment, it is useful to minimize flare to provide adequate space between any two adjacent memory devices, such as memory devices 500A and 500B. In at least one embodiment, optimizing space between adjacent memory devices, such as memory devices 500A and 500B in FIG. 5A, is useful to fabricate an encapsulation layer on sidewalls of memory devices.

In at least one embodiment, maximum allowable angle theta$_2$, e.g., theta$_{2max}$, is also set by ratio $R_{HS}$ between thickness $T_S$, and lateral spacing $S_D$, as shown in FIG. 5A. In at least one embodiment, allowable angle theta$_{max}$ ($\theta_{max}$), of any layer is generally set by slopes and thicknesses of layers above. In at least one embodiment, angle theta$_{2max}$ is dependent on thickness $T_4$, angle theta$_4$, thickness $T_3$, angle theta$_1$, and thickness $T_2$ of dielectric layer 234. For example, dielectric layer 234 that is thinner has a greater angle theta$_{2max}$, where angle theta$_{2max}$ can be up to 30 degrees. In at least one embodiment, angle theta$_{2max}$ is between 0 and 10 degrees when thickness $T_2$ is less than 30 nm, and thickness $T_4$ and thickness $T_3$ are individually less than 10 nm. In at least one embodiment, as indicated by dashed lines 233, 235, and 239, variations in the slope of sidewalls 232A, 234A, and 236A can change lateral thickness $WB_E$ of lowermost surface 236B.

In at least one embodiment, sidewalls 232A, 234A, and 236A can have a same or different slopes. In at least one embodiment, where angle theta$_1$ is substantially the same as angle theta$_2$ and angle theta$_3$, sidewalls 232A, 234A, and 236A are substantially collinear. In at least one embodiment, angles theta$_1$, theta$_2$, and theta$_3$ are individually less than 10 degrees. In at least one embodiment, angles theta$_1$, theta$_2$, and theta$_3$ are individually less than 10 degrees but greater than 5 degrees.

In at least one embodiment, to preserve shape and thickness of hardmask 230, a lower plasma bias plasma etch process may be implemented while etching dielectric layer 234. In at least one embodiment, lower bias plasma can cause a taper in sidewalls 234A of dielectric layer 234. In at least one embodiment, implementations where thickness $T_2$ is less than 10 nm can be useful to reduce taper in dielectric layer 234. In at least one embodiment, where angle theta$_1$ is substantially close to 0, angle theta$_2$ can be less than 20 degrees, when thickness $T_2$ is less than 10 nm. In at least one embodiment, sidewalls 234A that are sloped can cause lateral thickness $W_{FED}$ of dielectric layer 234 that is etched to be wider than lateral thickness, $W_{TE}$ of top electrode 232.

In at least one embodiment, sidewalls 236A of bottom electrode 236 are sloped as illustrated. In at least one embodiment the slope defined by angle theta$_3$, can vary between 0 degrees to 30 degrees from a normal relative to lowermost surface 236B.

In at least one embodiment, where thickness $T_1$ is less than 30 nm, thickness $T_2$ is less than 10 nm, and thickness $T_3$ is less than 30 nm, angle theta$_{3max}$ is between 0 and 10 degrees. In at least one embodiment, as indicated by dashed lines 239, variations in the slope of sidewall 236A can change lateral thickness $W_{BE}$, of lowermost surface 236B.

In at least one embodiment, reduction in total thickness $T_S$ of memory device 500A may result while patterning to form bottom electrode 236 because of the same or substantially same materials between top electrode 232 and bottom electrode 236. In at least one embodiment, having selectivity between hardmask 230 and materials of top electrode 232 and bottom electrode 236 can be beneficial to prevent hardmask loss during etching of top electrode 232 and the bottom electrode 236. In at least one embodiment, it is useful to have thickness $T_4$ be greater than sum of thickness $T_1$ and thickness $T_3$. In at least one embodiment, thickness $T_{41}$ of hardmask 230 can be within 10% of thicknesses $T_1$ and $T_3$.

In at least one embodiment, angles theta$_1$, theta$_2$, and theta$_3$ are individually less than 10 degrees. In at least one embodiment, angles theta$_1$, theta$_2$, and theta$_3$ are individually less than 10 degrees but greater than 5 degrees. In at least one embodiment, angle theta$_1$<angle theta$_2$<angle theta$_3$, where angle theta1, angle theta2, and angle theta$_3$ individually remain less than 10 degrees. In at least one embodiment, angle theta$_1$ can be substantially close to 0, angle theta$_2$ can be between 10 and 30 degrees, and angle theta$_3$ can be less than 10 degrees. In at least one embodiment, angle theta$_1$ is substantially close to 0 degrees, angle $theta_2$ is less than 30 degrees, and angle $theta_3$ is substantially close to 0. In at least one embodiment, angle $theta_1$ is substantially close to 0 degrees, angle $theta_2$ is less than 30 degrees, and angle $theta_3$ is substantially close to 0 degrees, where angles $theta_1$, $theta_2$, and $theta_3$ are different from each other. In at least one embodiment, angle $theta_1$ is substantially less than 10 degrees, angle $theta_2$ is substantially close to 0, and angle $theta_3$ is substantially less than 10 degrees. In at least one embodiment, by scaling down thickness $T_S$ from 90 nm, an average flare of memory device 500A can be increased, for example by up to 30 degrees. An average flare is defined as a sum of different theta angles, such as angles $theta_1$, $theta_2$, and $theta_3$, divided by three.

In at least one embodiment, regardless of the difference between angle $theta_1$, angle $theta_2$, or angle $theta_3$, memory device 500A does not have a staircase sidewall profile. In at least one embodiment, a staircase sidewall profile is one where, for example, uppermost surface of bottom electrode 236 is wider than lowermost surface of dielectric layer 234, or where uppermost surface of dielectric layer 234 is wider than lowermost surface of top electrode 232 in memory device 500A. In at least one embodiment, regardless of the similarity between angle $theta_1$, angle $theta_2$, or angle $theta_3$, memory device 500A has a staircase sidewall profile.

Referring again to FIG. 5A, in at least one embodiment, memory devices 500A, 500B, or 500C have lateral thickness $W_{FED}$ that is less than lateral thickness $W_{TE}$ of the transition electrode 212. In at least one embodiment, immediately after etching material of bottom electrode 236, and exposing the material of transition electrode 212, an over etch can cause sputter the material of transition electrode 212. In at least one embodiment, because materials of bottom electrode 236 and transition electrode 212 are conductors, to prevent sputtering, a plasma etch that includes low chuck electrode bias power may be utilized. In at least one embodiment, low bias etch may limit reactive sputtering between ions and material of transition electrode 212.

In at least one embodiment, transition electrode 212 has lateral thickness $W_{TE}$ that is greater than lateral thickness $W_{BE}$. In at least one embodiment, high chuck electrode bias power may be utilized to influence slope of sidewalls 236A of bottom electrode 236. In at least one embodiment, by changing slope of sidewalls 236A, lateral spacing $S_{D12}$, and lateral spacing $S_{D23}$ between adjacent memory devices 500A and 500B and between memory devices 500B and 500C, respectively, can be changed.

In at least one embodiment, materials and thicknesses of individual layers in multi-layer stack 214 in FIG. 2D may be chosen to facilitate device functionality and accommodate thicknesses of one or more structures that may be present over the substrate in adjacent regions (for example, interconnect structures that are present over logic circuitry present in layers adjacent to and below metallization structure 200A, 200B, and 200C). In at least one embodiment, one or more additional layers may be added between conductive layer 216 and transition electrode 212.

Figures 6A, 6B:
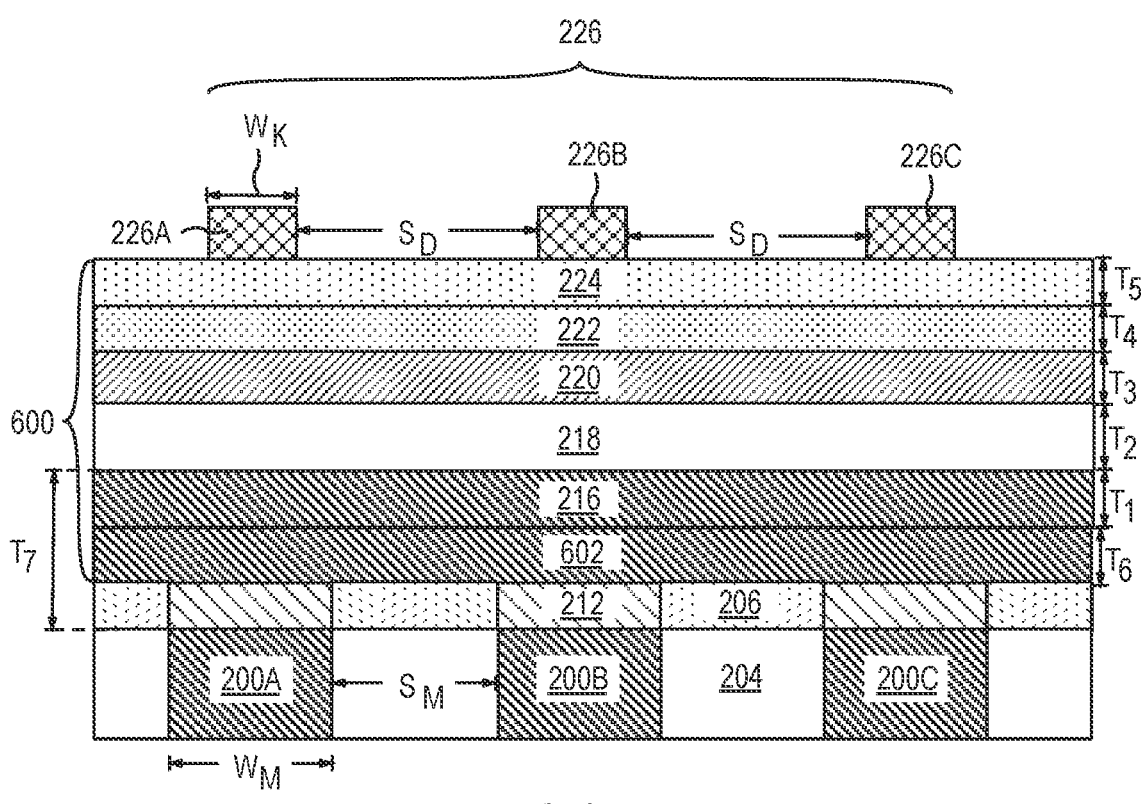
FIG. 6A illustrates a cross-sectional illustration of the structure in FIG. 2C following the process to form a multi-layer stack on the transition electrode, in accordance with at least one embodiment.
FIG. 6B illustrates a cross-sectional illustration of the structure in FIG. 6A following the process to pattern the multi-layer stack to form a plurality of memory devices, in accordance with at least one embodiment.

FIG. 6A illustrates a cross-sectional illustration of the structure in FIG. 2C following the process to form a multi-layer stack 600 on transition electrode 212, in accordance with at least one embodiment. In at least one embodiment, multi-layer stack 600 includes many features of multi-layer stack 214 in FIG. 2D, such as conductive layer 216, dielectric layer 218, conductive layer 220, conductive layer 222, and insulator layer 224. In at least one embodiment, multi-layer stack 600 further includes conductive layer 602 between transition electrode 212 and conductive layer 216.

In at least one embodiment, forming the multi-layer stack includes depositing conductive layer 602 on transition electrode 212 and on etch stop layer 206. In at least one embodiment, conductive layer 602 is deposited by PVD or CVD process. In at least one embodiment, conductive layer 602 includes one of $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SiCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W or $WO_x$, Pt, or Ru.

In at least one embodiment, conductive layer 216 is blanket deposited on conductive layer 602. In at least one embodiment, conductive layer 216 includes one of $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SiCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W, or $WO_x$.

In at least one embodiment, conductive layer 216 includes hexagonal compounds including one or more of $PtCoO_2$, $PdCoO_2$, delafossite structured hexagonal conductive oxides including Al-doped ZnO, spinels including one or more of $Fe_3O_4$ or $LiV_2O_4$ or cubic oxides including Indium tin oxide, or Sn-doped $In_2O_3$.

In at least one embodiment, conductive layer 216 includes a different material from the material of conductive layer 602. In at least one embodiment, conductive layer 602 may be a templating layer. In at least one embodiment, a templating layer can be used to appropriately lattice match material of dielectric layer 218 with conductive layer 216. In at least one embodiment, appropriate lattice matching can be beneficial for enhancing polarization in dielectric layer 218.

In at least one embodiment, the deposition process to form multi-layer stack 600 is continued with deposition of dielectric layer 218 on conductive layer 216, followed by deposition of conductive layer 220 on dielectric layer 218, deposition of conductive layer 222 on conductive layer 220, and deposition of insulator layer 224 on conductive layer 222. In at least one embodiment, materials and methods of deposition of dielectric layer 218, conductive layer 220, conductive layer 222 and insulator layer 224 are the same or substantially the same as described above in association with deposition of multi-layer stack 214 (FIG. 2D).

In at least one embodiment, conductive layer 216 includes a same material or substantially the same material as conductive layer 220. In at least one embodiment, multi-layer stack 600 can be considered to be a symmetric stack.

In at least one embodiment, conductive layer 602 includes a same material or substantially the same material as conductive layer 222. In at least one embodiment, conductive layer 602 includes a different material from the material of conductive layer 222. In at least one embodiment, thicknesses of layers within multi-layer stack 600 are chosen for a variety of physical, electrical, and fabrication reasons. Examples include stack electrical resistance, minimum thickness needed to obtain lattice matching or mismatching, and minimum thickness to enable patterning given etch selectivity between conductive layer 222 and other layers below conductive layer 222, in accordance with at least one embodiment.

In at least one embodiment, total thickness of multi-layer stack 600 may be substantially the same as the total thickness of multi-layer stack 214 (FIG. 2D). In at least one embodiment, combined thickness $T_7$ of conductive layer 602 and conductive layer 216 includes thicknesses $T_6$ and $T_1$, respectively. In at least one embodiment, combined thickness $T_7$ is equal to thickness $T_3$.

In at least one embodiment, thickness $T_4$ may be adjusted depending on thickness of relative layers within multi-layer stack 600. In at least one embodiment, thickness $T_4$ is equal to combined thickness of $T_3$, $T_6$, and $T_1$. In at least one embodiment, where thickness $T_4$ is equal to a combined thickness of $T_3$, $T_6$, and $T_1$, an etch selectivity of greater than 1:1 between conductive layer 222 and conductive layers 220, 216, and 602 can ensure that at least a portion of conductive layer 222 remains after patterning multi-layer stack 600.

In at least one embodiment, where conductive layer 216 includes the same material or substantially the same material as conductive layer 220, thicknesses $T_1$ and $T_3$ may or may not be equal.

FIG. 6B illustrates a cross-sectional illustration of the structure in FIG. 6A following the process to etch multi-layer stack 600 to form plurality of memory devices 610 (such as memory devices 610A, 610B, and 610C), in accordance with at least one embodiment. In at least one embodiment, a plasma etch process is utilized to fabricate memory devices 610A, 610B, and 610C. In at least one embodiment, utilizing the plasma etch process results in substantially vertical sidewalls of individual layers within the plurality of memory devices 610.

In at least one embodiment, insulator layer 224 (FIG. 6A) is etched to form hardmask 614, and conductive layers 222 and 220 (FIG. 6A) are etched to form hardmask 616, and electrode 618, respectively. In at least one embodiment, dielectric layer 218 (FIG. 6A) is etched to form dielectric layer 620 that is patterned with sidewalls, and conductive layer 216 and conductive layer 602 are etched to form electrodes 622 and 624, respectively.

In at least one embodiment, memory devices 610A, 610B, and 610C have height $H_{FD}$. Any pair of memory devices, such as memory devices 610A and 610B and memory devices 610B and 610C have lateral spacing $S_D$. In at least one embodiment, ratio of height $H_{FD}$ to lateral spacing $S_D$ is between 1:2 and 5:1. In at least one embodiment, where sidewalls of memory devices 610A, 610B, and 610C are tapered (to a greater lateral width at the bottom, as indicated by dashed lines 615), ratio between height $H_{FD}$ and lateral spacing $S_D$ also decreases depending on amount of taper.

While hardmask 614 is shown in FIG. 6B, in at least one embodiment, hardmask 614 is completely removed during the etch process. In an embodiment, hardmask 614 is removed while etching or after etching to form hardmask 616. In at least one embodiment, hardmask 614 is removed during the process to etch and form one or more of electrode 618, dielectric layer 620, or electrodes 622 and 624. In at least one embodiment, where hardmask 614 is completely removed, hardmask 616 can have a curved upper surface as indicated in FIG. 5B. In at least one embodiment, hardmask 616 has one or more properties of hardmask 230.

Figure 6C:
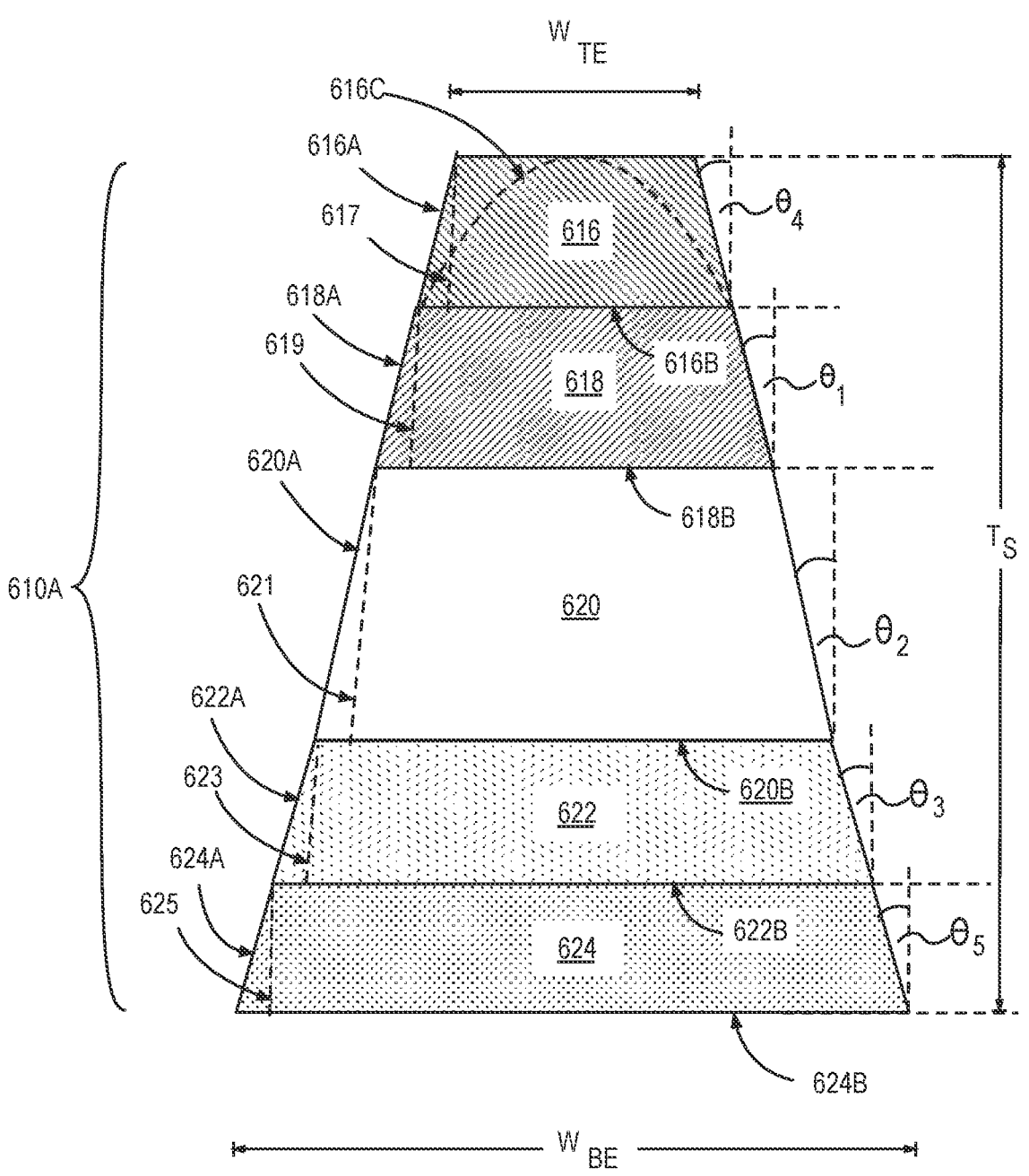
FIG. 6C illustrates an enhanced cross-sectional illustration of layers in a memory device illustrated in FIG. 6B, where individual layers can have varying slopes.

FIG. 6C illustrates an enhanced cross-sectional illustration of memory device 610A described in association with FIG. 6B, where individual layers can have varying slopes, in accordance with at least one embodiment. In at least one embodiment, hardmask 616, electrodes 618, dielectric layer 620, and electrode 622 include one or more properties of the sidewalls of hardmask 230, top electrode 232, dielectric layer 234, and bottom electrode 236 respectively (as described in association with FIGS. 5A and 5B).

In at least one embodiment, such as is illustrated, sidewalls 616A of hardmask 616 are sloped. In at least one embodiment, slope of sidewalls 616A, defined by angle theta$_4$, can vary between 0 degrees and 30 degrees from a normal relative to lower surface 616B. In at least one embodiment, as indicated by dashed lines 617, variations in the slope of sidewall 616A can change lateral thickness of lower surface 616B.

In at least one embodiment, sidewalls 618A of electrode 618 are sloped as illustrated. In at least one embodiment, the slope of sidewalls 618A, defined by angle theta$_1$, can vary between 0 degrees and 30 degrees from a normal relative to lower surface 618B. In at least one embodiment, as indicated by dashed lines 619, variations in the slope of sidewall 618A can change the lateral thickness of lower surface 618B.

In at least one embodiment, sidewalls 620A of dielectric layer 620 are sloped as illustrated. In at least one embodiment, the slope of sidewalls 620A, defined by angle theta$_2$, can vary between 0 degrees and 30 degrees from a normal relative to lower surface 620B. In at least one embodiment, as indicated by dashed lines 621, variations in the slope of sidewall 620A can change the lateral thickness of lower surface 620B.

In at least one embodiment, sidewalls 622A of electrode 622 are sloped as illustrated. In at least one embodiment, the slope of sidewalls 622A, defined by angle theta$_3$, can vary between 0 degrees and 30 degrees from a normal relative to lower surface 622B. In at least one embodiment, as indicated by dashed lines 623, variations in the slope of sidewalls 622A can change the lateral thickness of lower surface 622B.

In at least one embodiment, sidewalls 624A of electrode 624 are sloped as illustrated. In embodiments, the slope of sidewalls 624A, defined by angle theta$_5$, can vary between 0 degrees and 30 degrees from a normal relative to lower surface 624B. As indicated by dashed lines 625, in at least one embodiment, variations in the slope of sidewall 624A can change lateral thickness $W_{BE}$ of lower surface 624B and memory device 610A.

In at least one embodiment, sidewalls 616A, 618A, 620A, 622A, and 624A can have same or different slopes. In at least one embodiment, angles theta$_1$, theta$_2$, theta$_3$, theta$_4$, and theta$_5$ are substantially the same, and sidewalls 616A, 618A, 620A, 622A, and 624A are substantially collinear. In at least one embodiment, sidewalls 616A, 618A, 620A, 622A, and 624A can be substantially collinear, and maximum angles theta$_{1max}$, theta$_{2\,max}$, theta$_{3,max}$, theta$_{4\,max}$, and theta$_{5\,max}$ will depend on total thickness $T_S$. In at least one embodiment, where $R_{HS}$ (described in association with FIGS. 5A and 5B) is greater than 1:1, maximum theta$_1$, theta$_2$, theta$_3$, theta$_4$, and theta$_5$ will individually be less than 10 degrees. In at least one embodiment, where $R_{HS}$ is smaller than 1:1, maximum angles theta$_{1max}$, theta$_{2\,max}$, theta$_{3,max}$, theta$_{4\,max}$, and theta$_{5\,max}$ can individually be as much as 30 degrees. In at least one embodiment, differences in angles theta$_1$, theta$_2$, theta$_3$, theta$_4$, and theta$_5$ can be a result of an impact of plasma etch on different materials and different thicknesses of different materials.

In an at least one embodiment, top of hardmask 616 may be rounded due to ion bombardment. In at least one embodiment, top surface 616C may be curved as indicated by dashed lines. In at least one embodiment, sidewall 616A and top surface 616C can be indistinguishable. In at least one embodiment, curvature of top surface 616C may depend on several factors including length of etch time, energy of ions impinging on surface, thickness, and selectivity between material of hardmask 616 and layers below.

Figure 7A:
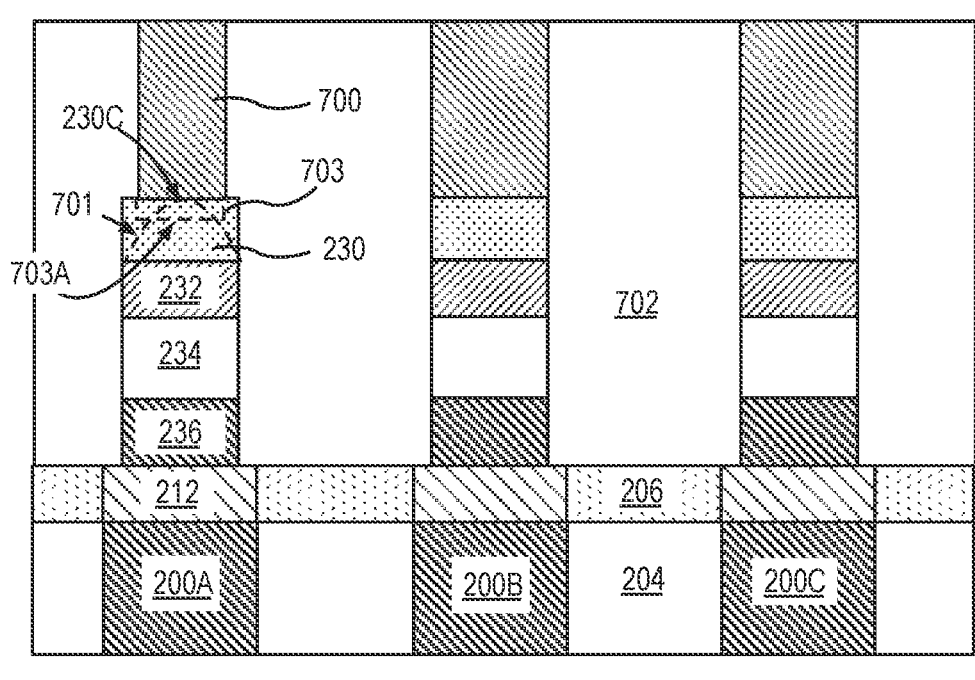
FIG. 7A illustrates a cross-sectional illustration of the structure in FIG. 5A following the process to form a contact structure on an uppermost conductive layer, in accordance with at least one embodiment.

FIG. 7A illustrates a cross-sectional illustration of the structure in FIG. 5A following the process to form contact 700 on hardmask 230. In at least one embodiment, contact 700 can be utilized to connect memory device 500A with a circuit element (not shown). In at least one embodiment, at least a portion of hardmask 230 is etched prior to formation of contact 700. In at least one embodiment, all hardmask 230 is etched prior to formation of contact 700. In at least one embodiment, prior to formation of contact 700, dielectric 702 is blanket deposited and an opening is formed in dielectric 702. In at least one embodiment, a conductive material is deposited in the opening and on hardmask 230. In at least one embodiment, a planarization process is utilized to form contact 700 by removing excess conductive material that is deposited on dielectric 702.

In at least one embodiment, contact 700 is formed at least partially on top surface 230C of hardmask 230. In at least one embodiment, contact 700 is formed on a curved upper surface such as top surface 701. In at least one embodiment, a portion of top surface 230C that is curved, can be partially etched while forming the opening in dielectric 702. Partial etching of top surface 230C is indicated by dashed line 703. In an embodiment, partially etching top surface 230C produces substantially rectangular recessed portion as indicated by dashed lines 703. In at least one embodiment, where top surface 230C is curved, partially etching top surface 230C can flatten out curved portion of top surface 230C, as indicated by line segment 703A of dashed line 703.

Figure 7B:
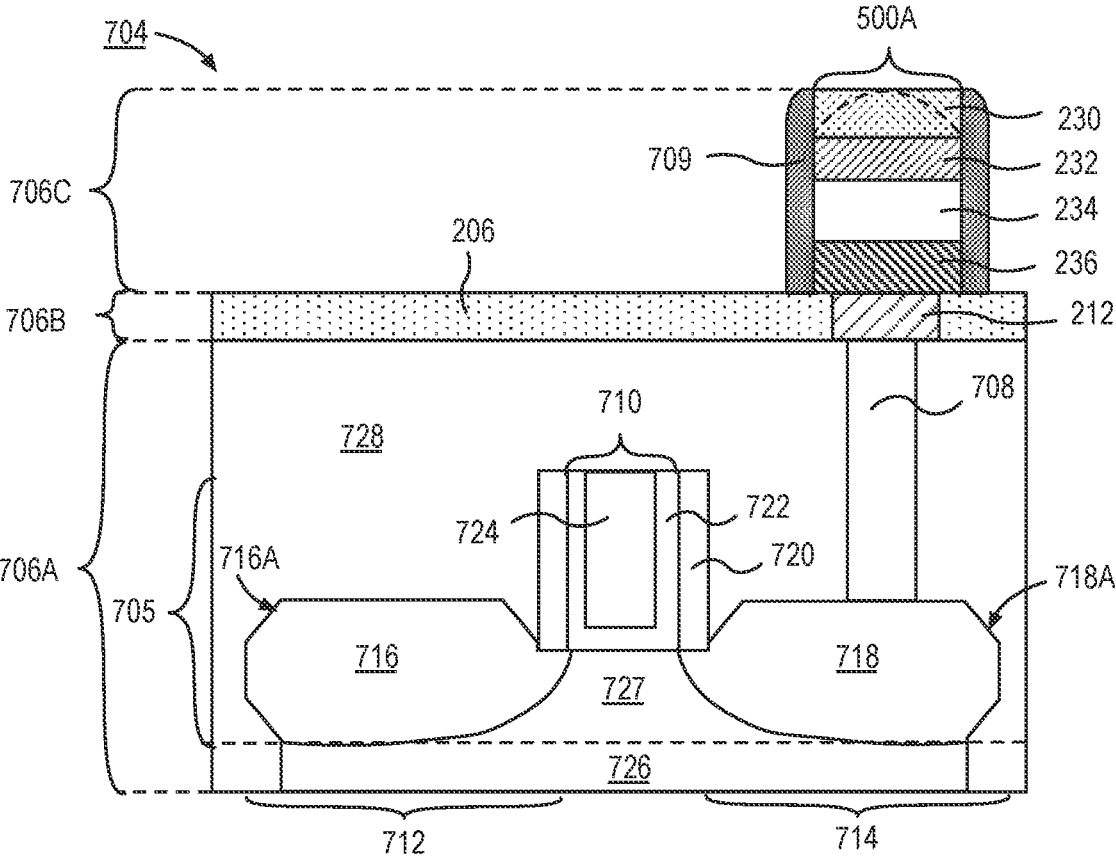
FIG. 7B illustrates a cross-sectional illustration of a system including a memory device coupled with a transistor, in at least one embodiment.

FIG. 7B illustrates cross-sectional illustration of system 704 that includes device 500A coupled with transistor 705, in at least one embodiment. In at least one embodiment, transistor 705 is within level 706A. In at least one embodiment, transition electrode 212 is within level 706B, above level 706A. In at least one embodiment, memory device 500A, is within level 706C above level 706B. In at least one embodiment, memory device 500A is coupled to transistor 705 through transition electrode 212 and drain contact 708.

In at least one embodiment, device 500A includes one or more features of memory device 500A, 500B, or 500C (FIG. 5A). In at least one embodiment, device 500A includes electrode 236, dielectric layer 234, electrode 232 and hardmask 230. In at least one embodiment, device 500A may be utilized for logic or memory applications.

In at least one embodiment, device 500A has a cylindrical profile. In at least one embodiment, device 500A can have a rectangular profile. In at least one embodiment, memory device 500A is electrically coupled with drain contact 708, there may be one or more intervening layers of conductive interconnects between drain contact 708 and transition electrode 212. In at least one embodiment, device 500A is laterally surrounded by dielectric spacer 709.

In at least one embodiment, transistor 705 is an example of a transistor that is non-planar. In at least one embodiment, transistor 705 may be, for example, an NMOS or a PMOS transistor. In at least one embodiment, transistor 705 includes gate structure 710 between source region 712 and drain region 714. In at least one embodiment, source region 712 includes an epitaxial source structure (herein source structure 716) and drain region 714 includes an epitaxial drain structure (herein drain structure 718). In at least one embodiment, source structure 716 and drain structure 718 are separated from gate structure 710 by spacer 720. In at least one embodiment, source structure 716 and drain structure 718 have faceted sidewall 716A and faceted sidewall 718A, respectively. Not all faceted surfaces of source structure 716 and drain structure 718 are shown. In at least one embodiment, a portion of gate structure 710 is on gate dielectric layer 722 that separates gate electrode 724 from substrate 726. In the illustrative embodiment, drain contact 708 is coupled to drain structure 718.

In at least one embodiment, channel 727 is part of a fin structure for a non-planar transistor. In at least one embodiment, the source structure 716 and drain structure 718 are epitaxial to the fin structure that is part of substrate 726.

In at least one embodiment, gate dielectric layer 722 has a base portion on channel 727 and sidewall portions that are adjacent to spacer 720. In at least one embodiment, gate electrode 724 is laterally confined within gate dielectric layer 722.

In at least one embodiment, gate dielectric layer 722 includes a suitable gate dielectric material such as but not limited to an oxide of one or more of Si, Hf, Zr, La, Ti, Ta, or Ga; or Al, such as $SiO_2$, $HfO_2$, $ZrO_2$, $HfSiO_x$, $HfZrO_2$, $Ta_2O_5$, $Al_2O_3$, $La_2O_3$, or $TaSiO_x$; or $Ga_2O_5$. In at least one embodiment, gate electrode 724 can include one or more of Ti, Al, W, Pt, Co, Ni, or Pd; nitrogen; one or more of Ti, Ta, Al, Hf, or Zr; or carbon and one or more of Ti, Al, Ta, Hf, or Zr. In at least one embodiment, source structure 716 and drain structure 718 can include amorphous Si, SiC, SiGe, or Ge and may be doped with As, P, or B, depending on the mobile charge carrier implemented. In at least one embodiment, spacer 720 includes silicon nitride, or silicon nitride doped with carbon. In at least one embodiment, drain contact 708 includes a conductive material such as Ru, Ti, Co, Mo, Co, Ni, W, or Ta; or nitrides of Ti, W, or Ta. In at least one embodiment, drain contact 708 includes a liner layer including TiN, TaN, or WN; and a fill metal including one or more of Ru, Ti, Co, Mo, Co, Ni, W, or Ta.

In at least one embodiment, gate structure 710, source structure 716, drain structure 718, drain contact 708 are surrounded by dielectric 728. In at least one embodiment, dielectric 728 includes silicon and one or more of oxygen, nitrogen, or carbon.

In at least one embodiment, device 500A (e.g., a memory or logic device) can be coupled with a gate terminal of transistor 705 through a gate contact (not shown).

Figure 8:
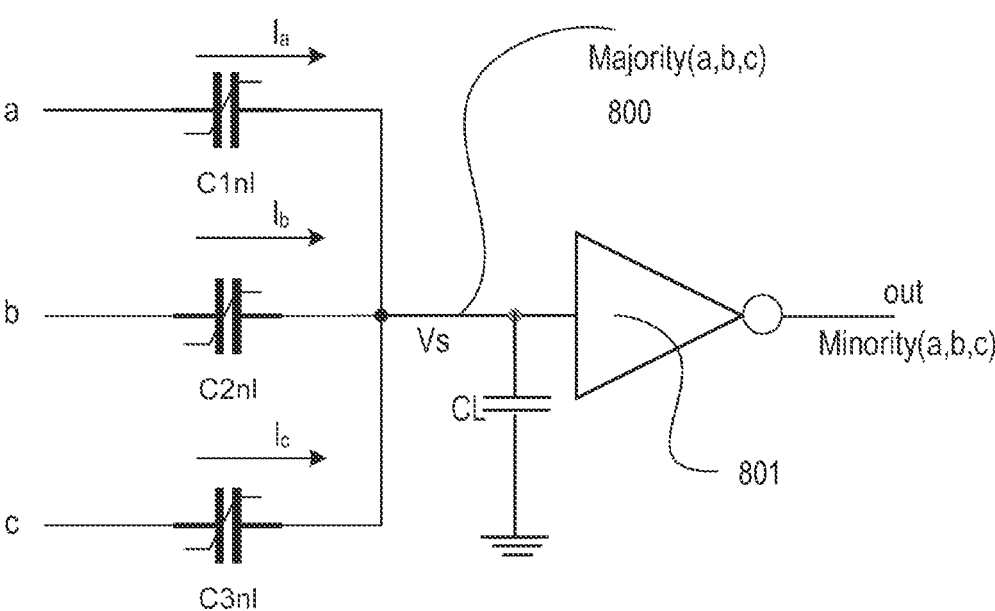
FIG. 8 illustrates a 3-input majority gate using non-linear input capacitors, in accordance with at least one embodiment.

FIG. 8 illustrates 3-input majority gate 800 using non-linear input capacitors, in accordance with at least one embodiment. In at least one embodiment, 3-input majority gate 800 comprises non-linear input capacitors C1n1, C2n1, and C3n1 that receive digital signals a, b, and c, respectively. Here, signal names and node names are interchangeably used. For example, 'a' refers to node 'a' or signal 'a' depending on the context of the sentence. In at least one embodiment, one end or terminal of capacitor C1n1 is coupled to node a while the other end of capacitor C1n1 is coupled to summing node Vs. The same is true for other non-linear capacitors C2n1 and C3n1, as shown. In at least one embodiment, 3-input majority gate 800 comprises driver circuitry 801. In at least one embodiment, driver circuitry 801 is an inverter. In at least one embodiment, other types of driver circuitries can be used, such as an NAND gate, an NOR gate, a multiplexer, a buffer, or other logic gates. In at least one embodiment, majority function is performed at summing node Vs as Majority(a,b,c). In at least one embodiment, driver circuitry 801 is an inverter, and minority function is performed at output "out" as Minority(a,b,c).

In at least one embodiment, in addition to the gate capacitance of driver circuitry 801, an additional linear capacitor CL is coupled to summing node Vs and ground as shown. In at least one embodiment, linear capacitor CL is a non-ferroelectric capacitor. In at least one embodiment, the non-ferroelectric capacitor includes one of: a dielectric capacitor, a paraelectric capacitor, or a non-linear dielectric capacitor. In at least one embodiment, a dielectric capacitor comprises a first metal plate and a second metal plate with a dielectric between them. In at least one embodiment, dielectric includes one or more of: $HfO_x$, $ABO_3$ perovskites, nitrides, oxy-fluorides, oxides, etc. In at least one embodiment, a paraelectric capacitor comprises a first metal plate and a second metal plate with paraelectric material between them. In at least one embodiment, f-orbital materials (e.g., lanthanides) are doped to the ferroelectric materials to make paraelectric material. Examples of room temperature paraelectric material include: SrTiO3, Ba(x)Sr(y)TiO3, $HfZrO_2$, Hf—Si—O, La-substituted $PbTiO_3$, or PMN-PT based relaxor ferroelectrics. In at least one embodiment, a dielectric capacitor comprises a first metal plate and a second metal plate with a non-linear dielectric capacitor between them. In at least one embodiment, the range for dielectric constant is 1.2 to 10000. In at least one embodiment, capacitor CL can be implemented as MIM (metal-insulator-metal) capacitor technology, transistor gate capacitor, hybrid of metal capacitors, or transistor capacitor. In at least one embodiment, capacitor CL can be implemented as MIM (metal-insulator-metal) capacitor technology, transistor gate capacitor, hybrid of metal capacitors, or transistor capacitor.

In at least one embodiment, non-linear input capacitors C1$n$1, C2$n$1, and C3$n$1 comprise non-linear polar material. In at least one embodiment, non-linear polar material includes one of: a ferroelectric (FE) material, a paraelectric material, a relaxor ferroelectric, or a non-linear dielectric. In at least one embodiment, paraelectric material is same as FE material, but with chemical doping of the active ferroelectric ion by an ion with no polar distortion. In at least one embodiment, non-polar ions are non-s orbital ions formed with p, d, or f external orbitals. In at least one embodiment, non-linear dielectric materials are same as paraelectric materials, relaxors, and dipolar glasses.

In at least one embodiment, the FE material can be any suitable low voltage FE material that allows the FE material to switch its state by a low voltage (e.g., 100 mV). In at least one embodiment, threshold in the FE material has a highly non-linear transfer function in the polarization versus voltage response. The threshold is related to: a) non-linearity of switching transfer function; and b) the squareness of the FE switching. In at least one embodiment, non-linearity of switching transfer function is the width of the derivative of the polarization versus voltage plot. In at least one embodiment, squareness is defined by the ratio of the remnant polarization to the saturation polarization; perfect squareness will show a value of 1.

In at least one embodiment, squareness of FE switching can be suitably manipulated with chemical substitution. In at least one embodiment, in $PbTiO_3$ a P-E (polarization-electric field) square loop can be modified by La or Nb substitution to create an S-shaped loop. The shape can be systematically tuned to ultimately yield a non-linear dielectric. In at least one embodiment, squareness of FE switching can also be changed by granularity of the FE layer. In at least one embodiment, a perfect epitaxial, single crystalline FE layer may show higher squareness (e.g., ratio is closer to 1) compared to polycrystalline FE. In at least one embodiment, a perfect epitaxial can be accomplished by use of lattice matched bottom and top electrodes. In at least one embodiment, BiFeO (BFO) can be epitaxially synthesized using lattice matched $SrRuO_3$ bottom electrode yielding P-E loops that are square. In at least one embodiment, progressive doping with La may reduce squareness.

In at least one embodiment, FE material includes one of: hafnium (H), zirconium (Zr), aluminum (Al), silicon (Si), their oxides, or their alloyed oxides. In at least one embodiment, FE material includes bismuth ferrite (BFO), wherein the first doping material is one of lanthanum, one or more elements from lanthanide series of a periodic table, or one or more elements of a 3d, 4d, 5d, 6d, 4f, and 5f series of the periodic table.

In an embodiment, BFO is doped with Mn or Sc, and wherein Mn or Sc achieves a spontaneous distortion in BFO in a range of 0.3% to 2%. In at least one embodiment, FE material includes a relaxor ferroelectric which includes one of: barium titanium-bismuth zinc niobium tantalum (BT-BZNT) or barium titanium-barium strontium titanium (BT-BST).

In at least one embodiment, FE material includes hafnium oxides of a form, $Hf_{1-x}E_xO_Z$, where E includes one of Al, Ca, Ce, Dy, Er, Gd, Ge, La, Sc, Si, Sr, Sn, or Y. In at least one embodiment, FE material includes niobate type compounds $LiNb$ $O_3$, $LiTa$ $O_3$, lithium iron tantalum oxy fluoride, barium strontium niobate, sodium barium niobate, or potassium strontium niobate.

In at least one embodiment, FE material includes $Al_{(1-x)}Sc_{(x)}N$, $Ga_{(1-x)}Sc_{(x)}N$, $Al_{(1-x)}$ $Y_{(x)}N$ or $Al_{(a)}Mg_{(b)}Nb_{(c)}N$, where a, b, and c are respective compositional fractions. In at least one embodiment, FE material comprises multiple layers. In at least one embodiment, alternating layers of $[Bi_2O_2]2+$ and pseudo-perovskite blocks ($Bi_4Ti_3O_{12}$ and related Aurivillius phases), with perovskite layers that are n octahedral layers in thickness can be used.

In at least one embodiment, FE material comprises organic material. In at least one embodiment, polyvinylidene fluoride or polyvinylidene difluoride (PVDF) may be used. In at least one embodiment, FE material can be any suitable low voltage FE material that allows FE material to switch its state by a low voltage (e.g., 100 mV). In at least one embodiment, FE material comprises a perovskite of the type $ABO_3$, where 'A' and 'B' are two cations of different sizes, and 'O' is oxygen which is an anion that bonds to both the cations. Generally, the size of A atoms is larger than the size of B atoms. In at least one embodiment, the perovskite can be doped, e.g., by one or more elements from lanthanide series of a periodic table, or one or more elements of a 3d, 4d, 5d, 6d, 4f, and 5f series of the periodic table. In at least one embodiment, perovskites can be suitably doped to achieve a spontaneous distortion in a range of 0.3% to 2%. In at least one embodiment, for chemically substituted lead titanate such as Zr in Ti site and La or Nb in Ti site, the concentration of substitutes is such that the spontaneous distortion in the range of 0.3% to 2% is achieved. In at least one embodiment, for chemically substituted $BiFeO_3$, $BiCrO_3$, and $BiCoO_3$ class of materials, La or rare earth substitution into the Bi site can tune the spontaneous distortion. In at least one embodiment, perovskite includes one of: $BaTiO_3$, $KNbO_3$, or $NaTaO_3$.

In at least one embodiment, FE material is perovskite, which includes one or more of: La, Sr, Co, Sr, Ru, Y, Ba, Cu, Bi, Ca, and Ni. In at least one embodiment, perovskites can be suitably doped to achieve a spontaneous distortion in a range of 0.3 to 2%. In at least one embodiment, for chemically substituted $BiFeO_3$, $BrCrO_3$, and $BuCoO_3$ class of materials, La or rare earth substitution into the Bi site can tune the spontaneous distortion. In at least one embodiment, the perovskite can be doped (e.g., by La or lanthanides).

In at least one embodiment, FE material comprises hexagonal ferroelectrics of the type h-$RMnO_3$, where R is a rare earth element such as: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). Ferroelectric phase is characterized by a buckling of the layered MnO5 polyhedra, accompanied by displacements of Y ions, which lead to net electric polarization. In at least one embodiment, hexagonal FE includes one of YMnO$_3$ or LuFeO$_3$.

In at least one embodiment, when the ferroelectric comprises hexagonal ferroelectric material, electrodes can have hexagonal metals, spinels, or cubic metals. In at least one embodiment, hexagonal metals include PtCoO$_2$, PdCoO$_2$, and other delafossite structured hexagonal metallic oxides, such as Al-doped ZnO. In at least one embodiment, spinels include Fe$_3$O$_4$ and LiV$_2$O$_4$. In at least one embodiment, cubic metals include indium tin oxide (ITO), such as Sn-doped In2O3.

In at least one embodiment, FE material comprises improper FE material. An improper ferroelectric is a ferroelectric where the primary order parameter is an order mechanism such as strain or buckling of the atomic order. In at least one embodiment, improper FE material include LuFeO$_3$ class of materials or super lattice of ferroelectric and paraelectric materials. While various embodiments here are described with reference to ferroelectric material for storing the charge state, the embodiments are also applicable for paraelectric material. In at least one embodiment, the capacitor of various embodiments can be formed using paraelectric material instead of ferroelectric material.

In at least one embodiment, ferroelectric materials are doped with s-orbital material (e.g., materials for first period, second period, and ionic third and fourth periods). In at least one embodiment, f-orbital materials (e.g., lanthanides) are doped to ferroelectric material to make paraelectric material. Examples of room temperature paraelectric materials include: SrTiO$_3$, Ba(x)Sr(y)TiO3, HfZrO$_2$, and Hf—Si—O.

In at least one embodiment, FE material comprises a stack of layers including low voltage FE material between oxides. In at least one embodiment, when FE material is a perovskite, the conductive oxides are of the type AA'BB'O$_3$. In at least one embodiment, A' is a dopant for atomic site A, it can be an element from the lanthanides series. In at least one embodiment, B' is a dopant for atomic site B, it can be an element from the transition metal elements especially Sc, Ti, V, Cr, Mn, Fe, Co, Ni, Cu, and Zn. A' may have the same valency of site A, with a different ferroelectric polarizability. In various embodiments, when metallic perovskite is used for the FE material, the conductive oxides can include one or more of: IrO$_2$, RuO$_2$, PdO$_2$, OsO$_2$, or ReO$_3$.

In at least one embodiment, the FE material is contacted with a conductive metal oxide that includes one of the conducting perovskite metallic oxides exemplified by: La—Sr—CoO$_3$, SrRuO$_3$, La—Sr—MnO$_3$, YBa$_2$Cu$_3$O$_7$, Bi$_2$Sr$_2$CaCu$_2$O$_8$, and LaNiO$_3$.

In at least one embodiment, when FE material comprises hexagonal ferroelectrics, the conductive oxides are of A$_2$O$_3$ (e.g., In$_2$O$_3$, Fe$_2$ O$_3$) and ABO$_3$ type, where 'A' is a rare earth element and B is Mn.

In at least one embodiment, FE material is between two electrodes that comprise perovskite templated conductors. In at least one embodiment, a templated structure comprises a thin layer (e.g., approximately 10 nm) of a perovskite conductor (such as SrRuO$_3$) is coated on top of O$_2$, RuO$_2$, PdO$_2$, or PtO$_2$ (which have a non-perovskite structure but higher conductivity) to provide a seed or template for the growth of pure perovskite ferroelectric material at low temperatures.

In at least one embodiment, the charge developed on node Vs produces a voltage and current that is the output of 3-input majority gate 800. In at least one embodiment, any suitable driver circuitry 801 can drive this output. In at least one embodiment, non-FE logic, FE logic, CMOS logic, BJT logic, etc. can be used to drive the output to a downstream logic. In at least one embodiment, drivers include one or more of inverters, buffers, NAND gates, NOR gates, XOR gates, amplifiers, comparators, digital-to-analog converters, analog-to-digital converters, multiplexers, etc.

In at least one embodiment, the majority function is performed at the summing node Vs, and the resulting voltage is projected on to capacitance of driver circuitry 801. In at least one embodiment, majority function of the currents (I$_a$, I$_b$, and I$_c$) on node Vs results in a resultant current that charges capacitor. Table 1 illustrates the majority function f(Majority a, b, c).

TABLE 1

| a | b | c | Vs (f(Majority a, b, c)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

In at least one embodiment, charge developed on node Vs produces a voltage and current that is the output of 3-input majority gate 800. In at least one embodiment, any suitable driver circuitry 801 can drive this output. For example, a non-FE logic, FE logic, CMOS logic, or BJT logic, etc. can be used to drive the output to a downstream logic. In at least one embodiment, drivers include inverters, buffers, NAND gates, NOR gates, XOR gates, amplifiers, comparators, digital-to-analog converters, analog-to-digital converters, or multiplexers, etc.

While FIG. 8 illustrates a 3-input majority gate, the same concept can be extended to more than 3 inputs to make an N-input majority gate, where N is greater than 2, in accordance with at least one embodiment. In at least one embodiment, 'N' is an odd number. In at least one embodiment, 5-input majority gate is similar to a 3-input majority gate 800 but for additional inputs 'd' and 'e'. In at least one embodiment, inputs can come from the same drivers or from different drivers.

In at least one embodiment, the 3-input majority gate can be configured as a fast inverter with a much faster propagation delay compared to a similar sized (in terms of area footprint) CMOS inverter. In at least one embodiment, this may be useful when the inputs have a significantly slower slope compared to the propagation delay through the non-linear input capacitors. In at least one embodiment, one way to configurate the 3-input majority gate as an inverter is to set one input to a logic high (e.g., b=1) and set another input to a logic low (e.g., b=0). In at least one embodiment, third input is the driving input which is to be inverted. In at least one embodiment, inversion will be at the Vs node. The same technique can also be applied to N-input majority gate, where 'N' is 1 or any other odd number. In at least one embodiment, in an N-input majority gate, (N−1)/2 inputs are set to '1' and (N−1)/2 inputs are set to '0', and one input is used to decide the inversion function. The various embodiments are described as a majority gate, the same concepts are applicable to a minority gate. In a minority gate the driving circuitry is an inverting circuitry coupled to the summing node Vs. The minority function is seen at the output of the inverting circuitry.

In at least one embodiment, (2N−1) input majority gate can operate as an N-input AND gate where (N−1) inputs of the majority gate are set to zero. In at least one embodiment, AND function will be seen at the summing node Vs. In at least one embodiment, N-input NAND, OR, or NOR gates can be realized. In at least one embodiment, summing node Vs is driven by a driver circuitry (e.g., inverter, buffer, NAND gate, AND gate, OR gate, NOR gate, or any other logic circuitry). In at least one embodiment, driver circuitry 801 can be replaced with another majority or minority gate. In at least one embodiment, storage node Vs is directly coupled to a non-linear capacitor of another majority or minority gate.

In at least one embodiment, any logic function $f(x_1, x_2, \ldots x_n)$ can be represented by two levels of logic as given by the min-term expansion:

$$f(x_1, x_2, \ldots x_n) = V_{C_1, C_2, \ldots C_n} f(x_1, x_2, \ldots x_n) \wedge x_1^{C_1} \wedge x_2^{C_2} \wedge x_3^{C_3} \ldots \wedge x_n^{C_n}$$

where $C_i$ is either 0 or 1. When $C_i$ is 1, $$x_i^{C_i} = x_i$$

(the input is used in its original form). When $C_i$ is 0, $$x_i^{C_i} = \overline{x_i}$$

(the input is used in its inverted form). In at least one embodiment, first level of logic is represented by at most $2^n$ AND gates (Δ), one for each of the $2^n$ possible combinations of 0 and 1 for $C_1, C_2, \ldots C_n$. The second level of logic is represented by a single OR gate (V). Each operand of the OR gate is a representation of a row in the truth table for $f(x_1, x_2, \ldots x_n)$.

In at least one embodiment, a (2N−1)-input majority gate can represent an N-input AND gate, by tying (N−1) of the majority gate's inputs to a ground level. Similarly, a (2N−1)-input majority gate can represent an N-input OR gate, by tying (N−1) of the majority gate's inputs to a supply level (Vdd). In at least one embodiment, since a majority gate can represent AND and OR gates, and the inputs to the AND and OR gates are either original or inverted forms of the input digital signals, any logic function can be represented by majority gates and inverters.

Figure 9:
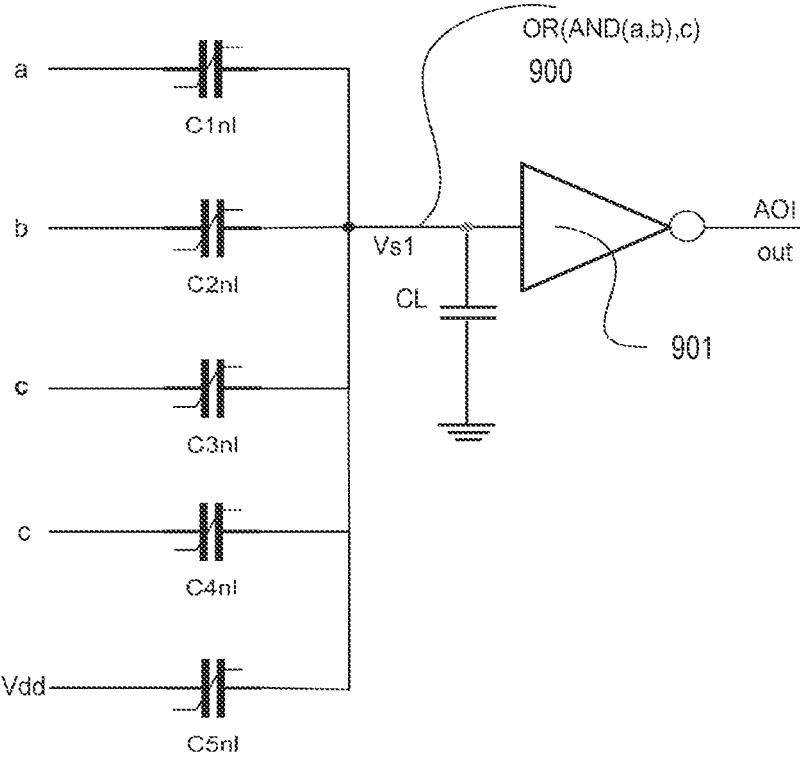
FIG. 9 illustrates a complex logic gate implemented using a 5-input majority gate, in accordance with at least one embodiment.

FIG. 9 illustrates complex logic gate 900 implemented using a 5-input majority gate, in accordance with at least one embodiment. In at least one embodiment, an AOI (and-or-invert) logic comprises a 5-input majority gate. In at least one embodiment, 5-input majority gate includes non-linear capacitors C1*n*1, C2*n*1, C3*n*1, C4*n*1, and C5*n*1, and driving circuitry 901 coupled as shown. In at least one embodiment, two of the non-linear capacitors receive the same input. Here, capacitors C3*n*1 and C4*n*1 receive input 'c'. In at least one embodiment, C5*n*1 is coupled to Vdd to produce an OR function at node Vs, where the OR function is OR(AND(a, b),c). In at least one embodiment, other logic gates can be realized by changing Vdd to ground for capacitor C5*n*1, and/or changing other inputs.

Figure 10:
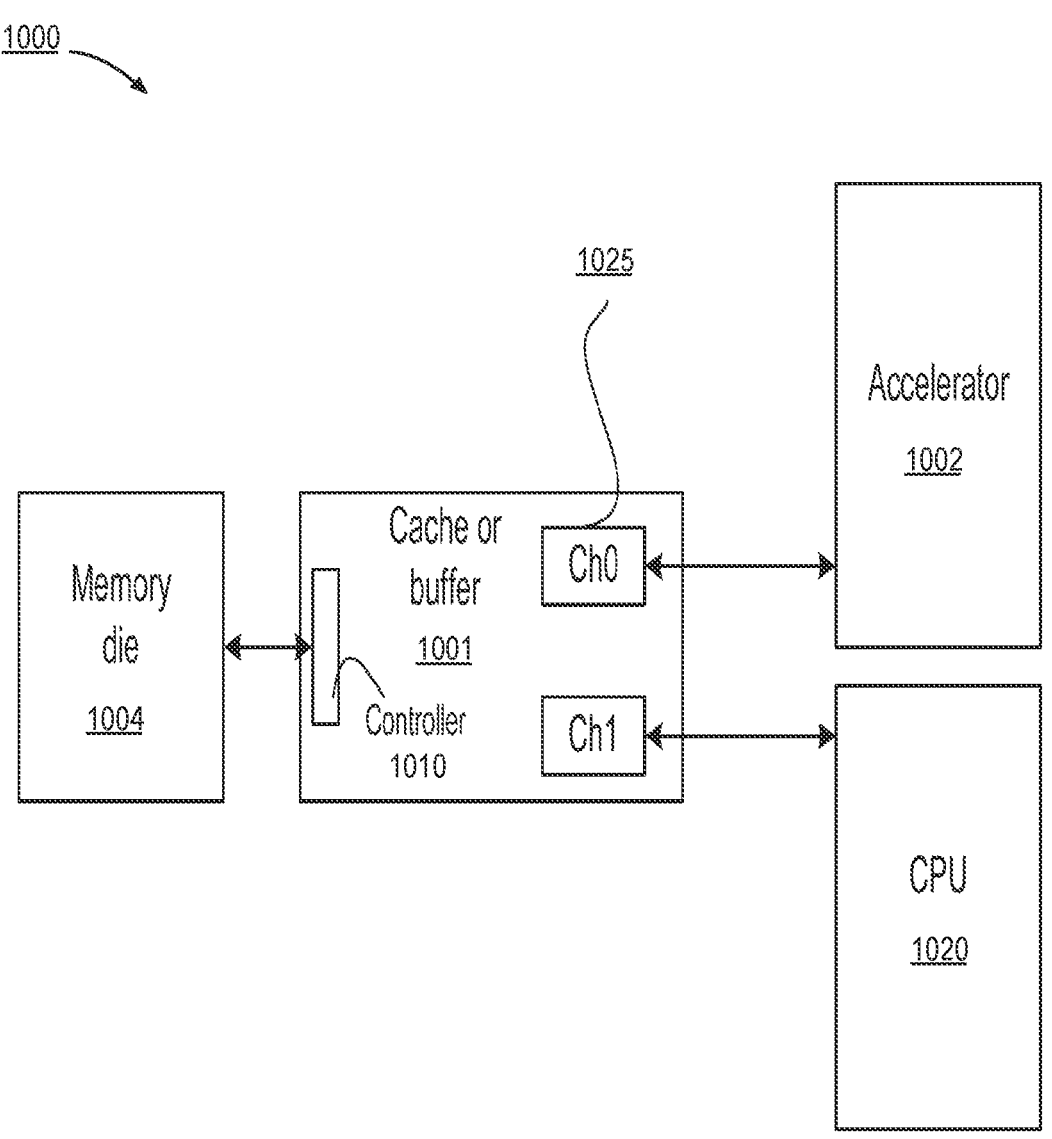
FIG. 10 illustrates a computing architecture with a coherent cache or memory-side buffer chiplet that includes a memory controller, wherein the coherent cache or memory-side buffer chiplet is coupled to an accelerator, a processor, and a memory, in accordance with at least one embodiment.

FIG. 10 illustrates computing architecture 1000 with a coherent cache or memory-side buffer chiplet that includes a memory controller, wherein the coherent cache or memory-side buffer chiplet is coupled to an accelerator, a processor, and a memory, in accordance with at least one embodiment. In at least one embodiment, computing architecture 1000 comprises coherent cache or memory-side buffer chiplet 1001, accelerator 1002 (e.g., inference chip), processor (e.g., processor 1020), and memory die 1004. In at least one embodiment, coherent cache or memory-side buffer chiplet 1001 comprises at least two channels 1025 which are configured to connect with accelerator 1002 and processor 1020. In at least one embodiment, coherent cache or memory-side buffer chiplet 1001 comprises I/O and controller 1010 to manage data traffic with memory die 1004. By moving controller 1010 from processor 1020 to coherent cache or memory-side buffer chiplet 1001, cost in terms of power and die area for processor 1020 is reduced. In at least one embodiment, coherent cache or memory-side buffer chiplet 1001 is a cache memory that comprises ferroelectric memory cells. For example, coherent cache or memory-side buffer chiplet 1001 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation.

Figure 11:
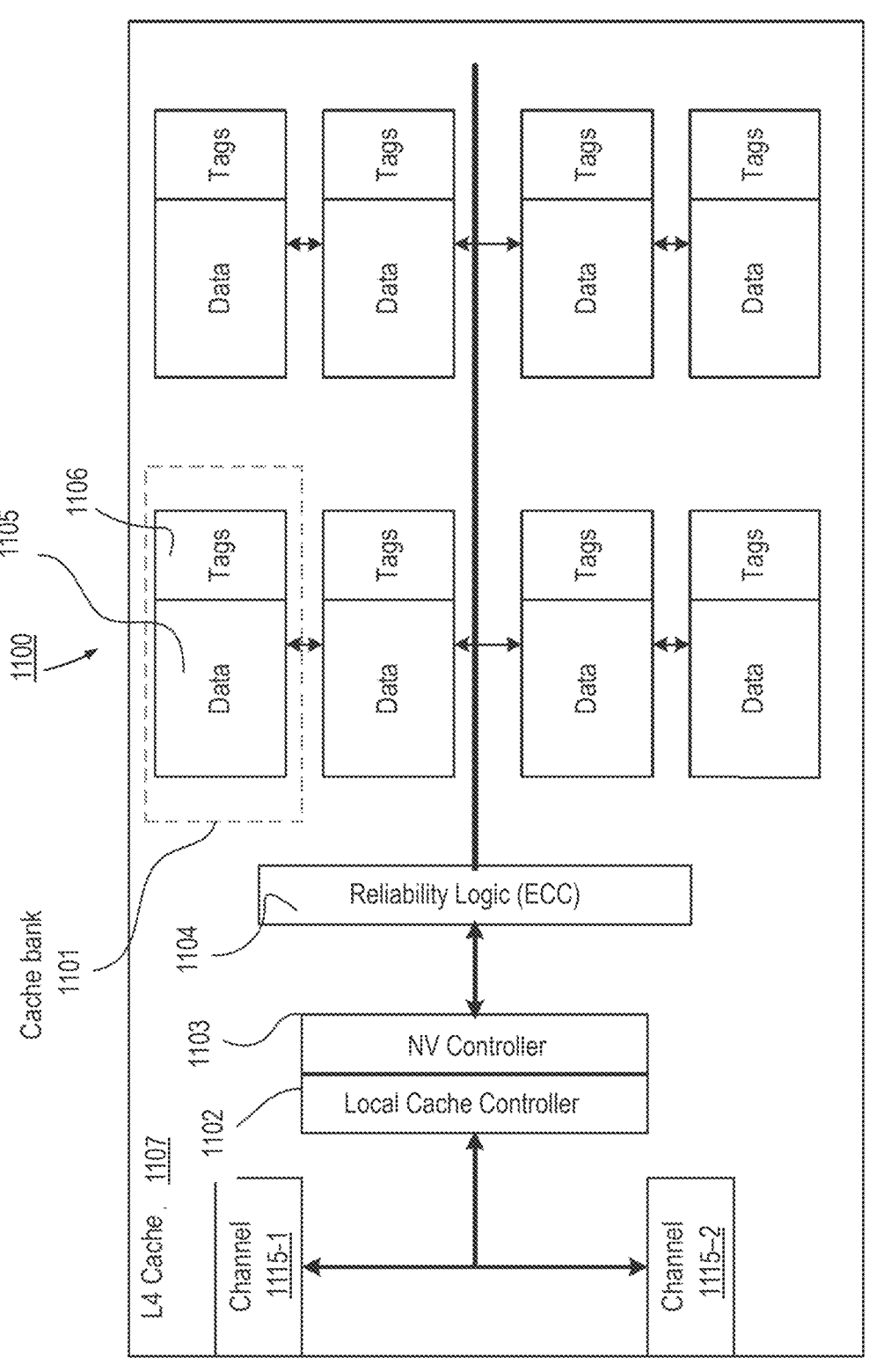
FIG. 11 illustrates an architecture of the coherent cache or memory-side buffer chiplet with multiple controllers and multiple cache banks, in accordance with at least one embodiment.

FIG. 11 illustrates architecture 1100 of the coherent cache or memory-side buffer chiplet 1107 with multiple controllers and multiple cache banks, in accordance with at least one embodiment. In at least one embodiment, architecture 1100 comprises channels (e.g., channel 1115-1, which can be ch0 and channel 1115-2, which can be ch1), cache banks 1101, cache controller 1102, non-volatile (NV) controller 1103, and reliability logic 1104. In at least one embodiment, cache controller 1102 is a local cache controller. In at least one embodiment, coherent cache or memory-side buffer chiplet 1107 may function as a cache or memory buffer. In at least one embodiment, cache lookups can map a large physical memory into a small physical cache using indirection via tags. Here, indirection refers to the use of tags to specify which address maps to which physical location. In at least one embodiment, if multiple addresses can map to a single physical location, a tag is used to figure out which address is currently mapped.

In at least one embodiment, each cache bank 1101 includes data bank 1105 (e.g., comprising memory cells) and associated tags 1106. In at least one embodiment, data bank 1105 comprises ferroelectric memory cells. In at least one embodiment, data bank 1105 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation. In at least one embodiment, when data bank 1105 includes ferroelectric memory, it uses NV controller 1103 and a stronger reliability logic (e.g., error correction code) for security compared to non-ferroelectric memory for data bank 1105.

In at least one embodiment, when data bank 1105 is used to implement a cache, tags may be used to identify which addresses map to which physical locations in the bank. In at least one embodiment, cache may be set associative, in which a particular address can map to several physical locations. The specific physical location a newly allocated address is mapped to may be determined by a replacement algorithm, such as LRU (least recently used) or pseudo-LRU, or even random. On the other hand, the cache might be direct mapped, with each address mapping to merely a single physical cache line. In at least one embodiment, in both set associative and direct mapped caches, several addresses map to a single physical cache line. In at least one embodiment, to identify the address currently occupying the physical cache line, tag 1106 may be coupled with a physical line. Tag 1106 may comprise some address bits, sufficient to uniquely identify which address currently occupies the physical line coupled with the tag.

In at least one embodiment, cache controller 1102 could be used to control state transitions used for cache look ups such as comparing requested addresses with tags stored in an array of tags 1106, and identifying a candidate for replacement (replacement algorithm) when a cache miss occurs. In at least one embodiment, cache controller could be tasked with initializing the cache when the cache power is on. In at least one embodiment, when FE memory of data bank 1105, which retains state across power cycles, is used, cache controller 1102 could write Os to all memory locations to ensure that data associated with previously executed programs is erased, thus preventing any data leakage to subsequently executed programs, in at least one embodiment. In at least one embodiment, non-volatile memory may also include an NV bit, which could indicate that cache data is meant to be non-volatile and remain across power cycles. In at least one embodiment, cache controller 1102 may skip locations marked thus when initializing memory.

In at least one embodiment, reliability logic 1104 performs error correction to the data. Any suitable error correction scheme (e.g., with error correction code (ECC)) may be used by reliability logic 1104. In at least one embodiment, non-volatile (NV) controller 1103 is provided to explicitly clear the cache when using a non-volatile memory, such as FM memory for data bank 1105. In at least one embodiment, NV controller 1103 may include an NV bit which indicates cache lines that should not be cleared but are expected to retain their contents across power cycles. In at least one embodiment, functions of NV controller 1103 can be combined in cache controller 1102, or vice versa.

Figure 12:
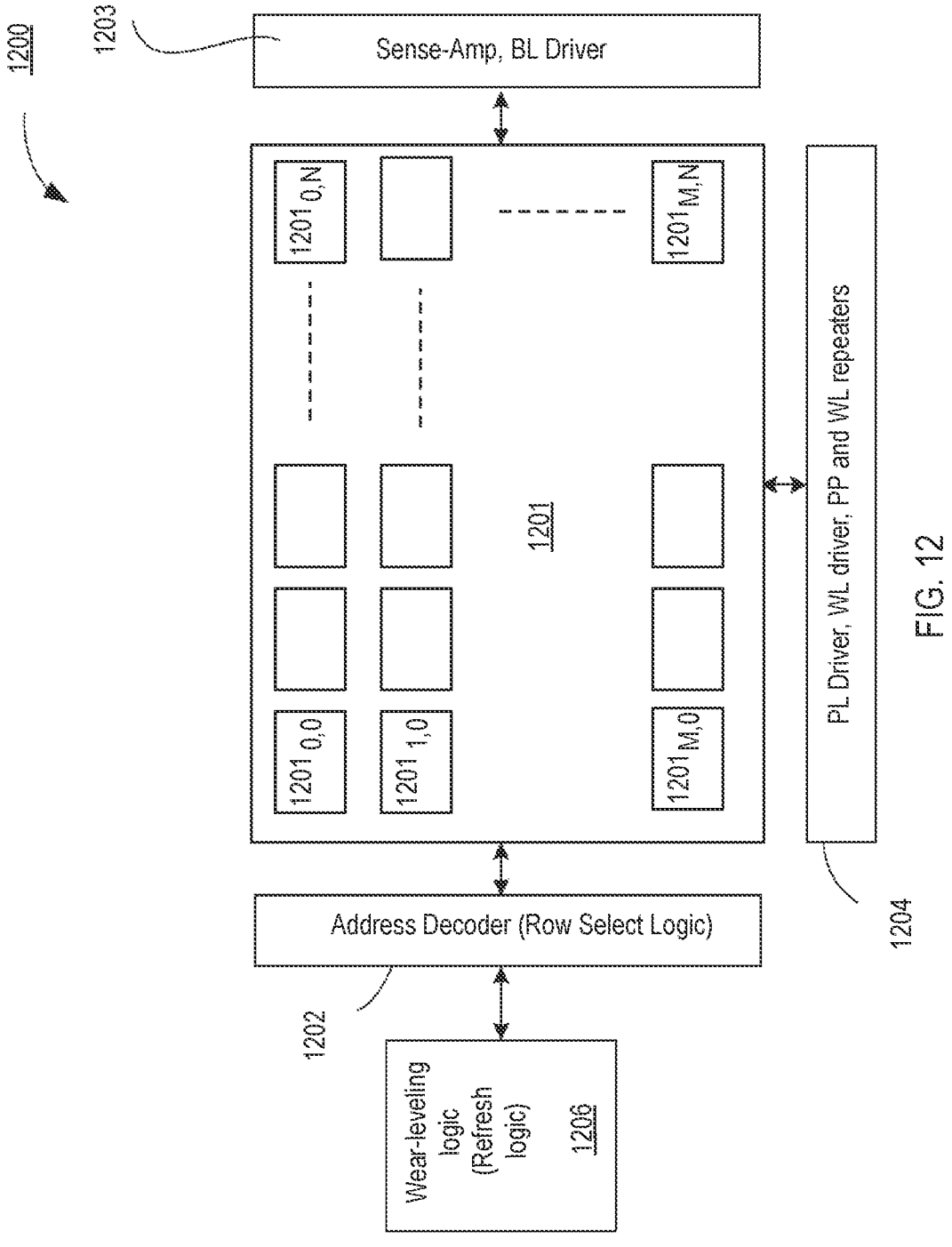
FIG. 12 illustrates an apparatus comprising memory and corresponding logic, wherein the memory comprises ferroelectric (FE) memory bit-cells, in accordance with at least one embodiment.

FIG. 12 illustrates apparatus 1200 comprising an M×N memory array of bit-cells and corresponding periphery circuitry, in accordance with at least one embodiment. In at least one embodiment, apparatus 1200 comprises M×N memory array 1201 of bit-cells, logic circuitry 1202 for address decoding, and logic circuitry 1203 for sense amplifier and BL driver, logic circuitry 1204 for write drivers, and plate-line (PL) drivers. In at least one embodiment, plate-lines PL0, PL1 through PLN are parallel to word-lines WL0, WL1, through WLM while bit-lines BL0, BL1 through BLN are orthogonal to the plate-lines and the word-lines, where 'N' is a number greater than 1. In at least one embodiment, plate-lines PL0, PL1, through PLN are parallel to bit-lines BL0, BL1 through BLN, while word-lines WL0, WL1, through WLM are orthogonal to the plate-lines and the bit-lines, where 'N' is a number greater than 1. In at least one embodiment, individual memory bit-cells in memory array 1201 are organized in rows and columns. In at least one embodiment, memory bit-cells 1201$_{0,0}$ through 1201$_{M,N}$ are organized in an array.

In at least one embodiment, an individual memory bit-cell (e.g., 1201$_{0,0}$) is a 1TnC bit-cell. An example of a 1TnC bit-cell is described with reference to FIGS. 14A-14B. In at least one embodiment, an individual memory bit-cell (e.g., 1201$_{0,0}$) is a multi-element FE gain bit-cell. An example of a 1TnC bit-cell is described with reference to FIGS. 15A-15B. In at least one embodiment, an individual memory bit-cell (e.g., 1201$_{0,0}$) is a multi-element FE gain bit-cell, where an individual capacitor of the bit-cell is connected to a transistor switch. In at least one embodiment, such a memory bit-cell is described with reference to FIG. 16.

In at least one embodiment, when multiple capacitors are used per bit-cell, the access transistor may be made larger. In at least one embodiment, the access transistor is connected to the bit-line as the bit-line drives a gate terminal of the access transistor. In an embodiment, a larger access transistor can add capacitance to the bit-line. In at least one embodiment, one way to reduce the bit-line capacitance is to route the bit-line on higher level metal layers. In at least one embodiment, higher-level metal layers are usually occupied by ground and supply routes. In at least one embodiment, connecting the gate of the access transistor to higher-level metal layers to access the bit-line means traversing through contact regions and vias. Such signal path may increase resistance and capacitance on the bit-line. In at least one embodiment, memory array 1201 is split into two or more subarrays with bit-line multiplexers between the subarrays. In at least one embodiment, by splitting the array, bit-line routes are split along the subarrays via a selection circuitry. In at least one embodiment, the selection circuitry decouples the bit-line into separate bit-line routes which allows the capacitance on the bit-line to reduce as parasitic capacitance from the bit-line route is reduced, and bit-line is not driving all the access transistors in a row of the array.

In at least one embodiment, wear-leveling logic 1206 provides one or more endurance mechanisms for the 1TnC memory bit-cells. In at least one embodiment, one of the endurance mechanisms involves refreshing of the data content in the capacitor(s).

Figure 13:
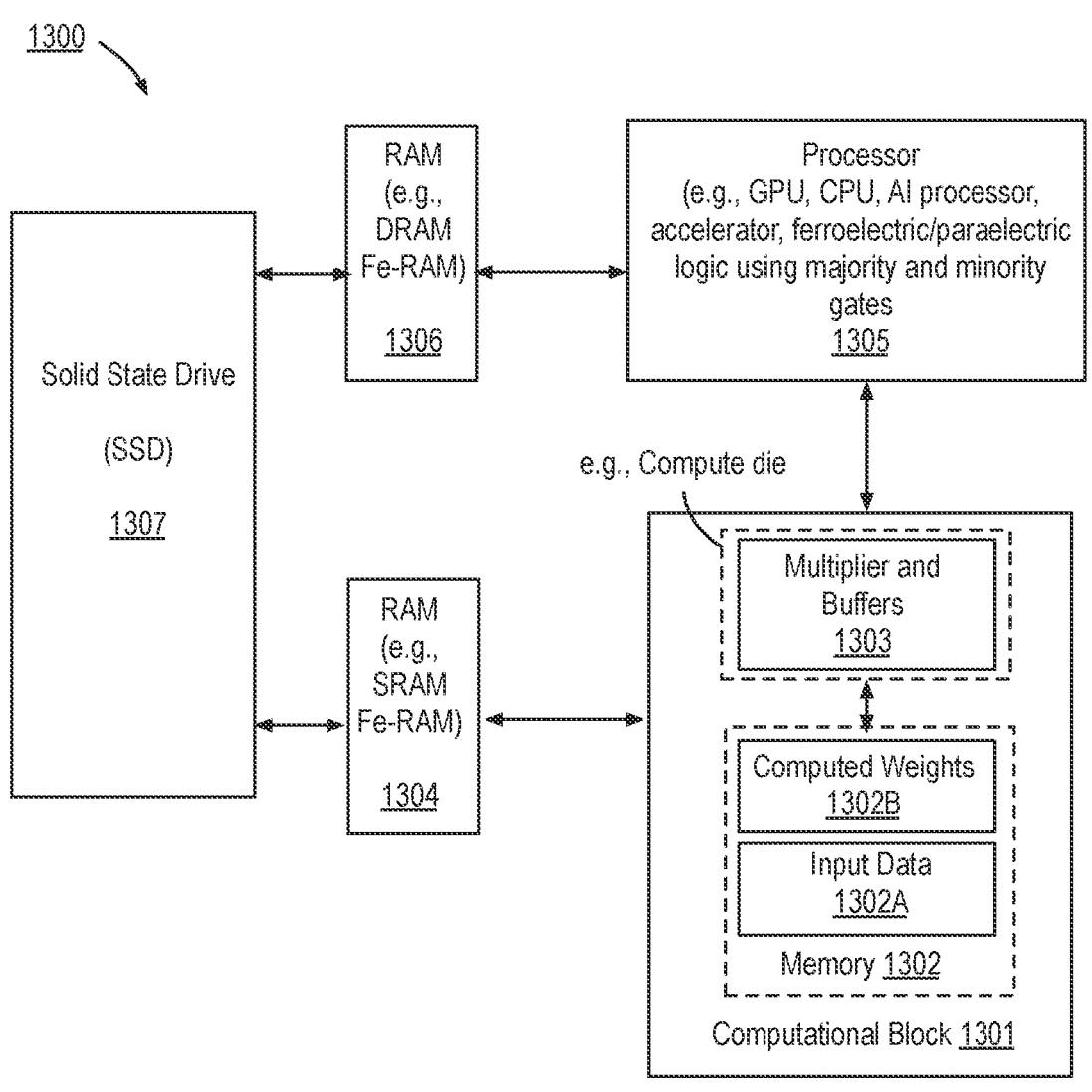
FIG. 13 illustrates a high-level architecture of an artificial intelligence (AI) machine comprising a compute die positioned on top of a memory die, in accordance with at least one embodiment.

FIG. 13 illustrates a high-level architecture of artificial intelligence (AI) machine 1300 comprising a compute die positioned on top of a memory die, in accordance with at least one embodiment. In at least one embodiment, AI machine 1300 comprises computational block 1301 or processor having random-access memory (RAM) 1302 and compute die 1303; RAM 1304 (e.g., static RAM (SRAM), ferroelectric or paraelectric RAM (FeRAM), ferroelectric or paraelectric static random-access memory (FeSRAM)), processor 1305, RAM 1306 (dynamic RAM (DRAM), FeRAM)), and solid-state memory or solid-state drive 1307. In at least one embodiment, some or all components of AI machine 1300 are packaged in a single package forming a system-on-chip (SoC). In at least one embodiment, SoC can be configured as a logic-on-logic configuration, which can be in a 3D configuration or a 2.5D configuration.

In at least one embodiment, computational block 1301 is packaged in a single package and then coupled to processor 1305 and RAM 1304 and 1306, and solid-state drive 1307 on a printed circuit board (PCB). In at least one embodiment, computational block 1301 is configured as a logic-on-logic configuration, which can be in a 3D configuration or a 2.5D configuration. In at least one embodiment, computational block 1301 comprises special purpose compute die 1303 or microprocessor. In at least one embodiment, compute die 1303 is a compute chiplet that performs a function of an accelerator or inference. In at least one embodiment, memory 1302 is DRAM which forms a special memory/cache for the special purpose compute die 1303. In at least one embodiment, DRAM can be embedded DRAM (eDRAM) such as 1T-1C (one transistor and one capacitor) based memories. In at least one embodiment, memory 1302 is ferroelectric or paraelectric RAM (Fe-RAM).

In at least one embodiment, compute die 1303 is specialized for applications such as Artificial Intelligence, graph processing, and algorithms for data processing. In at least one embodiment, compute die 1303 further has logic computational blocks, for example, for multipliers and buffers, special data memory block (e.g., buffers) comprising DRAM, FeRAM, or a combination of them. In at least one embodiment, memory 1302 has weights and inputs stored in-order to improve the computational efficiency. In at least one embodiment, interconnects between processor 1305 (also referred to as special purpose processor), RAM 1304, and compute die 1303 are optimized for high bandwidth and low latency. In at least one embodiment, architecture of FIG. 13 allows efficient packaging to lower the energy, power, or cost and provides for ultra-high bandwidth between memory 1302 and compute die 1303 of computational block 1301.

In at least one embodiment, memory 1302 is partitioned to store input data (or data to be processed) 1302A and computed weights 1302B. In at least one embodiment, input data 1302A are stored in a separate memory (e.g., a separate memory die) and computed weights 1302B are stored in a separate memory (e.g., separate memory die).

In at least one embodiment, computational logic or compute die 1303 comprises matrix multiplier, adder, concatenation logic, buffers, and combinational logic. In at least one embodiment, compute die 1303 performs multiplication operation on input data 1302A and computed weights 1302B. In at least one embodiment, computed weights 1302B are fixed weights. For example, processor 1305 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 1302. In at least one embodiment, input data, that is to be analyzed using a trained model, is processed by computational block 1301 with computed weights 1302B to generate an output (e.g., a classification result).

In at least one embodiment, RAM 1304 is ferroelectric or paraelectric based SRAM. For example, six transistor (6T) SRAM bit-cells having ferroelectric or paraelectric transistors are used to implement non-volatile FeSRAM. In at least one embodiment, solid-state drive 1307 comprises NAND flash cells. In at least one embodiment, solid-state drive 1307 comprises NOR flash cells. In at least one embodiment, solid-state drive 1307 comprises multi-threshold NAND flash cells.

In at least one embodiment, non-volatility of FeRAM is used to introduce new features such as security, functional safety, and faster reboot time of AI machine 1300. The non-volatile FeRAM is a low power RAM that provides fast access to data and weights. In at least one embodiment, RAM 1304 that is an FeRAM can also serve as a fast storage for computational block 1301 (or accelerator), which typically has low capacity and fast access requirements.

In various embodiments, the FeRAM (FeDRAM or FeSRAM) includes ferroelectric or paraelectric material. In at least one embodiment, ferroelectric or paraelectric (FE) material may be in a transistor gate stack or in a capacitor of the memory. In at least one embodiment, ferroelectric material can be any suitable low voltage FE material that allows the FE material to switch its state by a low voltage (e.g., 1300 mV). In at least one embodiment, threshold in the FE material has a highly non-linear transfer function in the polarization versus voltage response. In at least one embodiment, threshold is related to: a) non-linearity of switching transfer function, and b) to the squareness of the FE switching. The non-linearity of switching transfer function is the width of the derivative of the polarization versus voltage plot. In at least one embodiment, squareness is defined by the ratio of the remnant polarization to the saturation polarization; perfect squareness will show a value of 1.

In at least one embodiment, squareness of the FE switching can be suitably manipulated with chemical substitution. For example, in $PbTiO_3$ a P-E (polarization-electric field) square loop can be modified by La or Nb substitution to create an S-shaped loop. In at least one embodiment, shape can be systematically tuned to ultimately yield a non-linear dielectric. The squareness of FE switching can also be changed by the granularity of FE layer. In at least one embodiment, a perfectly epitaxial, single crystalline FE layer will show higher squareness (e.g., ratio is closer to 1) compared to a polycrystalline FE. In at least one embodiment, this perfect epitaxial can be accomplished using lattice matched bottom and top electrodes. In one example, BiFeO (BFO) can be epitaxially synthesized using a lattice matched $SrRuO_3$ bottom electrode yielding P-E loops that are square. In at least one embodiment, progressive doping with La will reduce the squareness.

In at least one embodiment, FE material includes one of: hafnium (H), zirconium (Zr), aluminum (Al), silicon (Si), their oxides, or their alloyed oxides. In at least one embodiment, FE material includes bismuth ferrite (BFO), wherein the first doping material is one of lanthanum, one or more elements from lanthanide series of a periodic table, or one or more elements of a 3d, 4d, 5d, 6d, 4f, and 5f series of the periodic table.

In at least one embodiment, BFO is doped with Mn or Sc, and wherein Mn or Sc achieve a spontaneous distortion in BFO in a range of 0.3% to 2%. In at least one embodiment, FE material includes a relaxor ferroelectric including one of barium titanium-bismuth zinc niobium tantalum (BT-BZNT), or barium titanium-barium strontium titanium (BT-BST).

In at least one embodiment, FE material includes hafnium oxides of a form, $Hf_{1-x}E_xO_z$ where E includes one of Al, Ca, Ce, Dy, Er, Gd, Ge, La, Sc, Si, Sr, Sn, or Y. In at least one embodiment, FE material includes niobate type compounds $LiNb\ O_3$, $LiTa\ O_3$, lithium iron tantalum oxy fluoride, barium strontium niobate, sodium barium niobate, or potassium strontium niobate.

In at least one embodiment, FE material includes $Al_{(1-x)}Sc_{(x)}N$, $Ga_{(1-x)}Sc_{(x)}N$, $Al_{(1-x)}\ Y_{(x)}N$ or $Al_{(a)}Mg_{(b)}Nb_{(c)}N$, where a, b, and c are respective compositional fractions.

In at least one embodiment, the FE material comprises multiple layers. For example, alternating layers of $[Bi_2O_2]$ 2+, and pseudo-perovskite blocks ($Bi_4Ti_3O_{12}$ and related Aurivillius phases), with perovskite layers that are n octahedral layers in thickness can be used.

In at least one embodiment, FE material comprises organic material. For example, polyvinylidene fluoride or polyvinylidene difluoride (PVDF).

In various embodiments, FE material can be any suitable low voltage FE material that allows FE material to switch its state by a low voltage (e.g., 100 mV). In at least one embodiment, FE material comprises a perovskite of the type $ABO_3$, where 'A' and 'B' are two cations of different sizes, and 'O' is oxygen which is an anion that bonds to both the cations. In at least one embodiment, size of A atoms is larger than the size of B atoms. In at least one embodiment, the perovskite can be doped, e.g., by one or more elements from lanthanide series of a periodic table, or one or more elements of a 3d, 4d, 5d, 6d, 4f, and 5f series of the periodic table. In at least one embodiment, perovskites can be suitably doped to achieve a spontaneous distortion in a range of 0.3% to 2%. In at least one embodiment, for chemically substituted lead titanate such as Zr in Ti site; La or Nb in Ti site, the concentration of these substitutes is such that it achieves the spontaneous distortion in the range of 0.3% to 2%. In at least one embodiment, for chemically substituted $BiFeO_3$, $BiCrO_3$, or $BiCoO_3$ class of materials, La or rare earth substitution into the Bi site can tune the spontaneous distortion. In at least one embodiment, perovskite includes one of: $BaTiO_3$, $KNbO_3$, or $NaTaO_3$.

In at least one embodiment, FE material is perovskite, which includes one or more of: La, Sr, Co, Sr, Ru, Y, Ba, Cu, Bi, Ca, and Ni. In at least one embodiment, perovskites can be suitably doped to achieve a spontaneous distortion in a range of 0.3% to 2%. In at least one embodiment, for chemically substituted $BiFeO_3$, $BrCrO_3$, or $BuCoO_3$ class of materials, La or rare earth substitution into the Bi site can tune the spontaneous distortion. In at least one embodiment, the perovskite can be doped (e.g., by La or Lanthanides).

In at least one embodiment, FE material comprises hexagonal ferroelectrics of the type h-$RMnO_3$, where R is a rare earth element such as: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered $MnO_5$ polyhedra, accompanied by displacements of the Y ions, which lead to a net electric polarization. In at least one embodiment, hexagonal FE includes one of: $YMnO_3$ or $LuFeO_3$.

In at least one embodiment, when the ferroelectric comprises hexagonal ferroelectric material, the electrodes can have hexagonal metals, spinels, or cubic metals. Examples of hexagonal metals include: $PtCoO_2$, $PdCoO_2$, and other delafossite structured hexagonal metallic oxides such as Al-doped ZnO. Examples of spinels include $Fe_3O_4$ and $LiV_2O_4$. Examples of cubic metals include indium tin oxide (ITO) such as Sn-doped In2 O3.

In at least one embodiment, FE material comprises improper FE material. An improper ferroelectric is a ferroelectric where the primary order parameter is an order mechanism such as strain or buckling of the atomic order. In at least one embodiment, improper FE material are $LuFeO_3$ class of materials or super lattice of ferroelectric and paraelectric materials. While various embodiments here are described with reference to ferroelectric material for storing the charge state, the embodiments are also applicable for paraelectric material. For example, the capacitor of various embodiments can be formed using paraelectric material instead of ferroelectric material.

In at least one embodiment, ferroelectric materials are doped with s-orbital material (e.g., materials for first period, second period, and ionic third, and fourth periods). In at least one embodiment, f-orbital materials (e.g., lanthanides) are doped to the ferroelectric material to make paraelectric material. Examples of room temperature paraelectric materials include: $SrTiO_3$, $Ba(x)Sr(y)TiO3$, $HfZrO_2$, or Hf—Si—O.

In at least one embodiment, FE material comprises a stack of layers including low voltage FE material between conductive oxides. In at least one embodiment, when FE material is a perovskite, the conductive oxides are of the type $AA'BB'O_3$. A' is a dopant for atomic site A, it can be an element from the lanthanides series. B' is a dopant for atomic site B, it can be an element from the transition metal elements especially Sc, Ti, V, Cr, Mn, Fe, Co, Ni, Cu, or Zn. A' may have the same valency of site A, with a different ferroelectric polarizability. In various embodiments, when metallic perovskite is used for the FE material, the conductive oxides can include one or more of: $IrO_2$, $RuO_2$, $PdO_2$, $OsO_2$, or $ReO_3$.

In at least one embodiment, FE material is contacted with a conductive metal oxide that includes one of the conducting perovskite metallic oxides exemplified by: La—Sr—$CoO_3$, $SrRuO_3$, La—Sr—$MnO_3$, $YBa_2Cu_3O_7$, $Bi_2Sr_2CaCu_2O_8$, and $LaNiO_3$.

In various embodiments, when FE material comprises hexagonal ferroelectrics, the conductive oxides are of $A_2O_3$ (e.g., $In_2O_3$, $Fe_2 O_3$) and $ABO_3$ type, where 'A' is a rare earth element and B is Mn.

In at least one embodiment, FE material is between two electrodes that comprise perovskite templated conductors. In such a templated structure, a thin layer (e.g., approximately 10 nm) of a perovskite conductor (such as $SrRuO_3$) is coated on top of $IrO_2$, $RuO_2$, $PdO_2$, or $PtO_2$ (which have a non-perovskite structure but higher conductivity) to provide a seed or template for the growth of pure perovskite ferroelectric material at low temperatures.

Figures 14A, 14B:
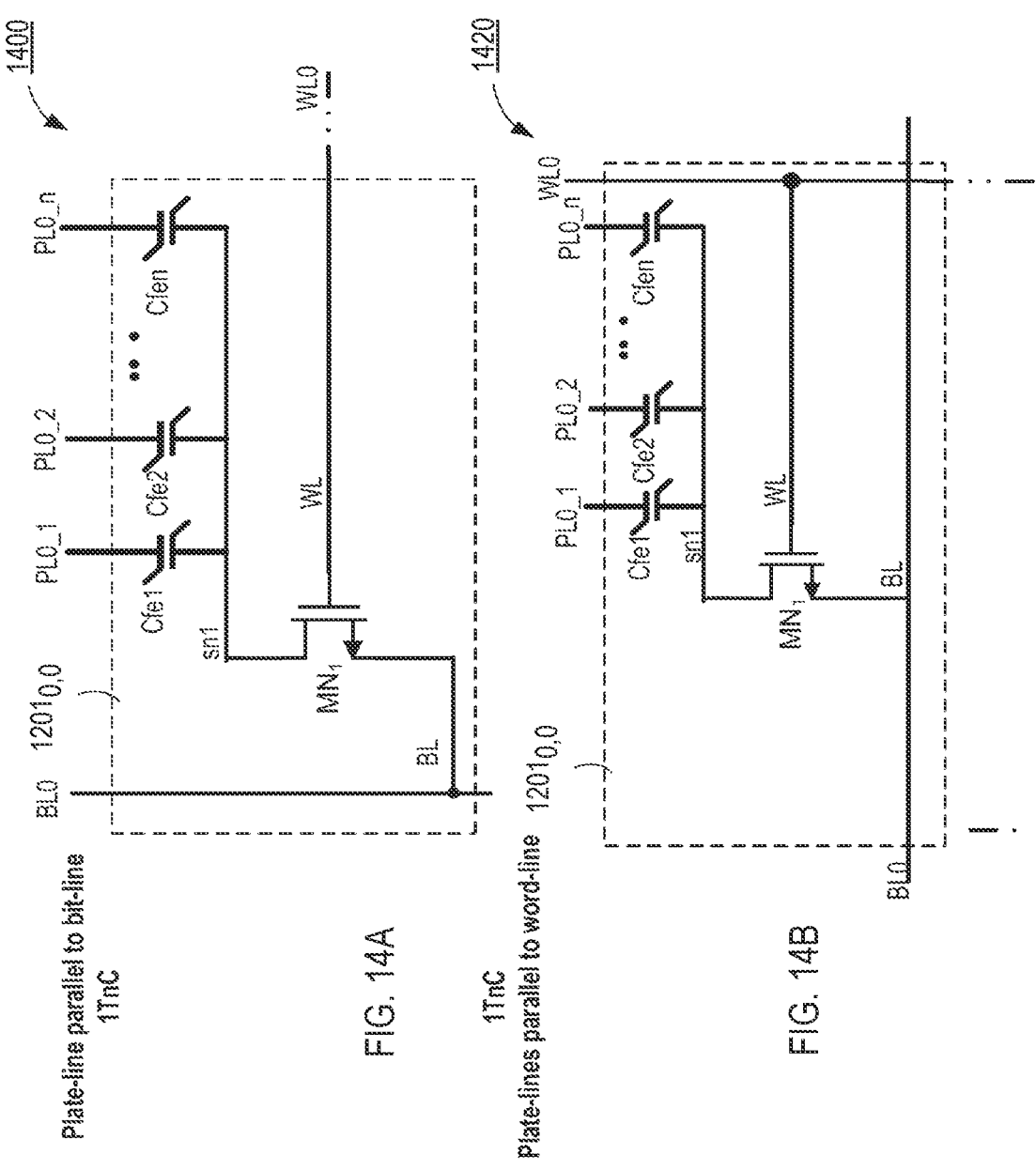
FIG. 14A illustrates a 1TnC bit-cell comprising non-linear polar material for its capacitors, where the plate-lines are parallel to the bit-line, in accordance with at least one embodiment.
FIG. 14B illustrates a 1TnC bit-cell comprising non-linear polar material for its capacitors, where the plate-lines are parallel to the word-line, in accordance with at least one embodiment.

FIG. 14A illustrates 1TnC bit-cell 1400 comprising non-linear polar material for its capacitors, where plate-lines are parallel to the bit-line, in accordance with at least one embodiment. In at least one embodiment, 1TnC bit-cell 1400 (e.g., 1201$_{0,0}$) comprises one select transistor $MN_1$ and a plurality of capacitors Cfe1, Cfe2, through Cfen (where 'n' is a number greater than 1) comprising non-linear polar material (e.g., a ferroelectric, a paraelectric, or a non-linear dielectric). In at least one embodiment, capacitors can be a planar or non-planar capacitor as described. In at least one embodiment, the plurality of capacitors Cfe1, Cfe2, through Cfen are stacked and folded capacitors.

In at least one embodiment, the gate terminal of transistors $MN_1$ is controllable by WL. In at least one embodiment, BL is coupled to a source or drain terminal of transistor $MN_1$. In at least one embodiment, an individual PL of a plurality of PLs is coupled to an individual capacitor. In at least one embodiment, capacitor Cfe1 is coupled to plate-line PL0_1, capacitor Cfe2 is coupled to plate_line PL0_2, and capacitor Cfen is coupled to plate_line PL0_$n$. In at least one embodiment, the plurality of capacitors is coupled to storage node sn1, which is coupled to a drain or source terminal of transistor $MN_1$. In at least one embodiment, a first terminal of capacitor Cfe1 is coupled to PL0_1 and a second terminal of capacitor Cfe1 is coupled to storage node sn1. In at least one embodiment, apparatus 1200 (FIG. 12) has n-number of PLs (e.g., PL0_1 through PL0_$n$) per column which are parallel to a PL for that column.

While the various embodiments are illustrated with reference to an n-type transistor, the embodiments are also applicable to a p-type transistor or a combination of n-type or p-type transistors. In at least one embodiment, when a transistor of a different conductivity type is used than what is shown in FIG. 14A, then driving logic for BL, PLs, and/or WL may also change for proper read and/or write operations. In at least one embodiment, PLs are parallel to BL. In at least one embodiment, PL0_1, PL0_2, PL0_$n$ are parallel to BL. In at least one embodiment, transistor $MN_1$ is fabricated on the frontend of the die and capacitors are stacked over transistor. In at least one embodiment, the capacitors are stacked along the z-direction and folded along the x-axis. In at least one embodiment, capacitors can be planar or non-planar capacitors. In at least one embodiment, a taller and wider bit-cell is formed with a footprint comparable to the footprint of the transistor $MN_1$. In at least one embodiment, the x-y footprint is determined by the size of transistor $MN_1$ and its connections to BL, WL, and storage node sn1.

In at least one embodiment, PL (e.g., PL$0\_1$, PL$\_2$, . . . PL$0\_n$) controls which capacitor of the bit-cell is programmed, and the value of programming. In at least one embodiment, BL acts as a sense-line. In at least one embodiment, voltage on BL (e.g., sense voltage) can create disturbance on other bit-lines during read operation. To mitigate such disturbances. In at least one embodiment, the 1TnC bit-cell is periodically refreshed (e.g., every 1 second). In at least one embodiment, periodic refresh is minimized by refreshing in active mode of operation. In at least one embodiment, in standby mode (e.g., low power mode), the 1TnC bit-cell is not refreshed as there is no disturb mechanism during standby. In at least one embodiment, wear-leveling logic 1206 (FIG. 12) provides one or more endurance mechanisms for the 1TnC memory bit-cells. One of the endurance mechanisms involves refreshing of the data content in the capacitor(s).

In at least one embodiment, in the 1TnC bit-cell case (e.g., bit-cell 7014$_{.0}$) with PL parallel to BL, the activities seen on an unselected or un-intended bit-cell while performing read/write operations on the same column as that of the selected bit-cell can have large disturb effects on the unselected or unintended bit-cells. In at least one embodiment, this may be true if the PL within the same column toggles (during read or write) a particular value to the desired bit-cell. In at least one embodiment, this signal on the PL of that column, which is shared with other unselected cells, can create a field across the non-linear polar material based capacitors or devices of the unselected cells. In at least one embodiment, the field across the unselected non-linear polar material based capacitors or devices is a function of the dielectric component of individual non-linear polar material based capacitors or devices and the total capacitance on the storage node sn1 of those bit-cells. In at least one embodiment, since in the 1TnC bit-cells the storage capacitor has much larger capacitance load, the activity seen on the unselected bit-line can result into almost all voltage getting dropped across the ferroelectric capacitors (e.g., $Vfe=Vpl*(Cp/(Cfed+Cp))$, which creates a disturb effect, which in turn causes unintentional modification of the polarization stage of the ferroelectric capacitor.

FIG. 14B illustrates 1TnC bit-cell 1420 comprising non-linear polar material for its capacitors, where plate-lines are parallel to the word-line, in accordance with at least one embodiment. 1TnC bit-cell 1420 is similar to 1TnC bit-cell 1400 but plate-lines are parallel to the word line.

Figures 15A, 15B:
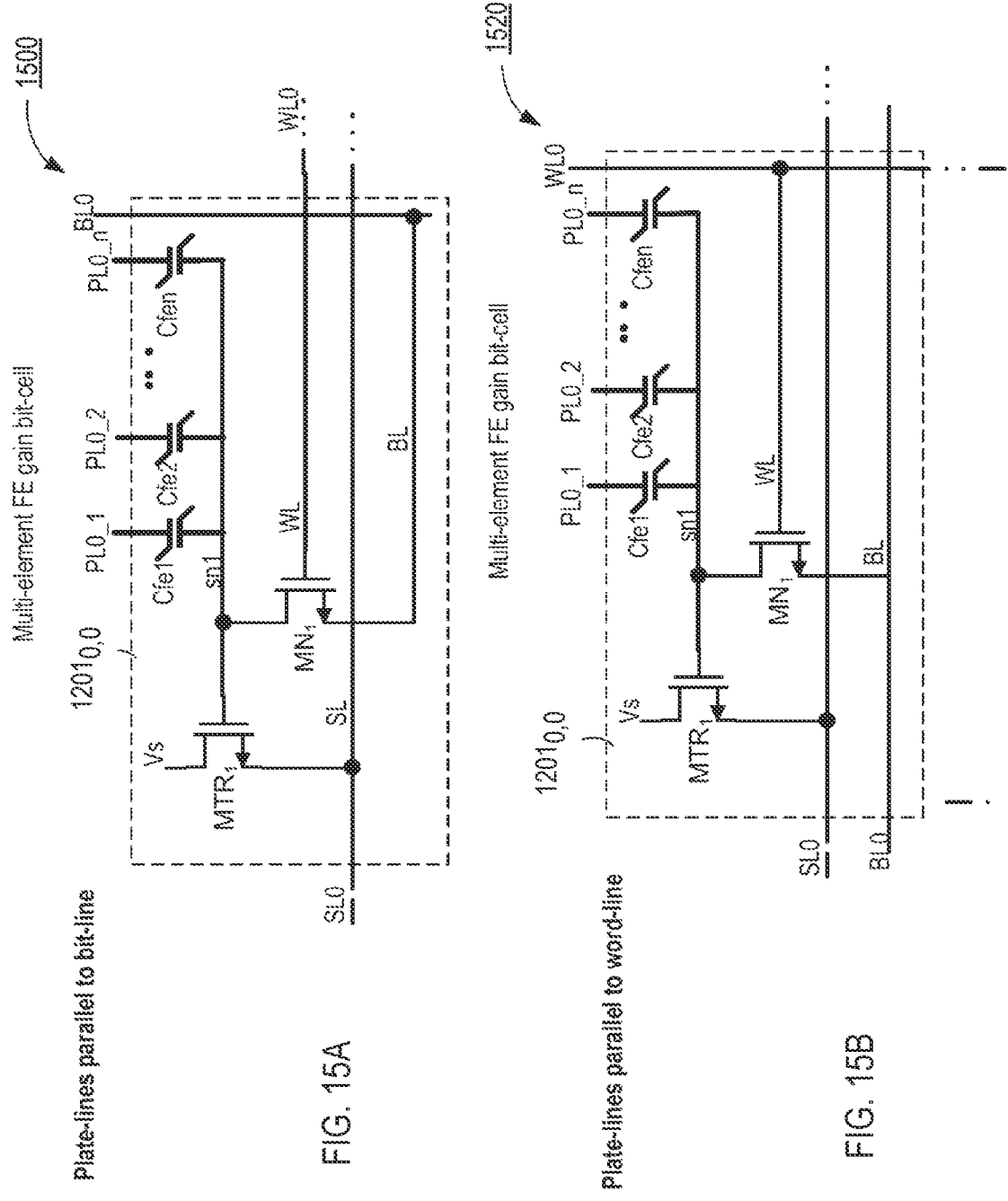
FIG. 15A illustrates a multi-element FE gain bit-cell with plate-lines parallel to the bit-line, in accordance with at least one embodiment.
FIG. 15B illustrates a multi-element FE gain bit-cell with plate-lines parallel to the word-line, in accordance with at least one embodiment.

FIG. 15A illustrates a multi-element FE gain bit-cell 1500 with plate-lines parallel to the bit-line, in accordance with at least one embodiment. In at least one embodiment, bit-cell 1500 (e.g., 701$_{0.0}$) comprises n-type select transistor MN$_1$, n-type transistor MTR$_1$, bit-line (BL), word-line (WL), sense-line (SL), and 'n' number of ferroelectric (or paraelectric) capacitors Cfe1 through Cfen. In at least one embodiment, the gate terminal of the n-type transistor MN$_1$ is coupled to WL (e.g., WL1). In at least one embodiment, the drain or source terminal of the n-type transistor MN$_1$ is coupled to BL. In at least one embodiment, first terminals of each of the capacitors Cfe1 through Cfen is coupled to a storage node sn1. In at least one embodiment, the storage node sn1 is coupled to a source or drain terminal of n-type transistor MN$_1$ and to a gate of transistor MTR$_1$. In at least one embodiment, drain or source terminal of MTR$_1$ is coupled to a bias voltage Vs. In at least one embodiment, Vs is a programmable voltage that can be generated by any suitable source. In at least one embodiment, Vs voltage can help in biasing the gain transistor in conjunction with the sense-voltage that builds at sn1 node. In at least one embodiment, the source or drain terminal of transistor MTR$_1$ is coupled to SL (e.g., SL1). In at least one embodiment, a p-type transistor can be used as well for gain.

In at least one embodiment, second terminals of each of the capacitors Cfe1 through Cfen is coupled to a corresponding plate-line (PL). In at least one embodiment, the second terminal of Cfe1 is coupled to PL$0\_1$, the second terminal of Cfe2 is coupled to PL$0\_2$, and so on. In at least one embodiment, apparatus 1200 has n-number of PLs (e.g., PL$0\_1$ through PL$0\_n$) per column which are parallel to a BL for that column. In at least one embodiment, the SL is parallel to the PL. In at least one embodiment, the SL is parallel to the WL.

In at least one embodiment, ferroelectric (or paraelectric) capacitors Cfe1 through Cfen are planar capacitors such as those discussed with reference to various embodiments herein. In at least one embodiment, ferroelectric (or paraelectric) capacitors Cfe1 through Cfen are pillar capacitors such as those discussed with reference to various embodiments herein. In at least one embodiment, the ferroelectric (or paraelectric) capacitors Cfe1 through Cfen are vertically stacked and horizontally folded allowing for tall bit-cells (e.g., higher in the z-direction) but with x-y footprint of two transistors. In at least one embodiment, by folding the capacitors, the diffusion capacitance on the BL can be reduced for a given array size, which can improve reading speed. In at least one embodiment, folding the capacitors lowers the effective routing capacitance on the BL. In at least one embodiment, the larger footprint in the x-y direction of multi-element FE gain bit-cell compared to the footprint in the x-y direction of 1TnC bit-cell, vertical height of the capacitor can be reduced as the capacitors can expand in the x-y direction more than before for a given height. In at least one embodiment, capacitors are folded more effectively. In at least one embodiment, n/2 capacitors per metal or via layer can be packed. In at least one embodiment, more capacitors can be stacked in multi-element FE gain bit-cell because storage node sn1 is decoupled from the BL. In at least one embodiment, multi-element FE gain bit-cell can reduce the thickness scaling requirement for the pillar capacitor. In at least one embodiment, the polarization density requirements are reduced for multi-element FE gain bit-cell compared to 1TnC bit-cell.

In at least one embodiment, the x-y footprint is determined by the size of transistor MN$_1$ and its connections to BL, WL, and storage node sn1. In at least one embodiment, the footprint can still be decided by other factors such as: a number of capacitors that connect to the node; how the capacitors are arranged, e.g., more folding on the same node versus stacking; effective size constraints on those capacitors; and number of capacitors that share the same bit-cell. In at least one embodiment, PL (e.g., PL$0\_1$, PL$0\_2$, . . . PL$\_n$) controls which cell within the same access transistor gets programmed, and the value of programming. In at least one embodiment, BL acts as a sense-line. In at least one embodiment, the voltage on BL (e.g., sense voltage) can create disturbance on other bit-lines during read operation. To mitigate such disturbances, in at least one embodiment, multi-element FE gain bit-cell (e.g., 701$_{0.0}$) may be periodically refreshed (e.g., every 1 second). In at least one embodiment, periodic refresh is minimized by refreshing in active mode of operation that can be coupled with advance schemes for wear leveling. In standby mode (e.g., low power mode), multi-element FE gain bit-cell (e.g., 701$_{0.0}$) is not refreshed as there is no disturb mechanism during standby. In at least one embodiment, multi-element FE gain bit-cell (e.g., 701$_{0.0}$) relies on isolating the read mode from BL or SL capacitance by isolating through access transistor $MN_1$, where $MN_1$ transistor facilitates pre-charging the sn1 node, prior to read operation.

In at least one embodiment, there is a possibility of disturbance at the storage node sn1 during read operation. In at least one embodiment, PL is toggled for other capacitors to the average value of the disturbance that will be seen on the sn1 node, e.g., when a read pulse of some polarity is applied at PL of the capacitor to be read, a non-zero voltage is applied on other PLs of multi-element FE gain bit-cell (e.g., $701_{0,0}$), that matches the expected disturbance seen on the shared node. In at least one embodiment, the PL driver is configured to support driving different voltage levels on different PLs. In at least one embodiment, wear-leveling logic 1206 (FIG. 12) provides one or more endurance mechanisms for the multi-element FE gain bit-cell 1500. In at least one embodiment, one of the endurance mechanisms involves refreshing of the data content in the capacitor(s).

FIG. 15B illustrates a multi-element FE gain bit-cell 1520 with plate-lines parallel to the word-line, in accordance with at least one embodiment. In at least one embodiment, multi-element FE gain bit-cell 1520 is similar to multi-element FE gain bit-cell 1500 but plate-lines are parallel to the word line.

Figure 16:
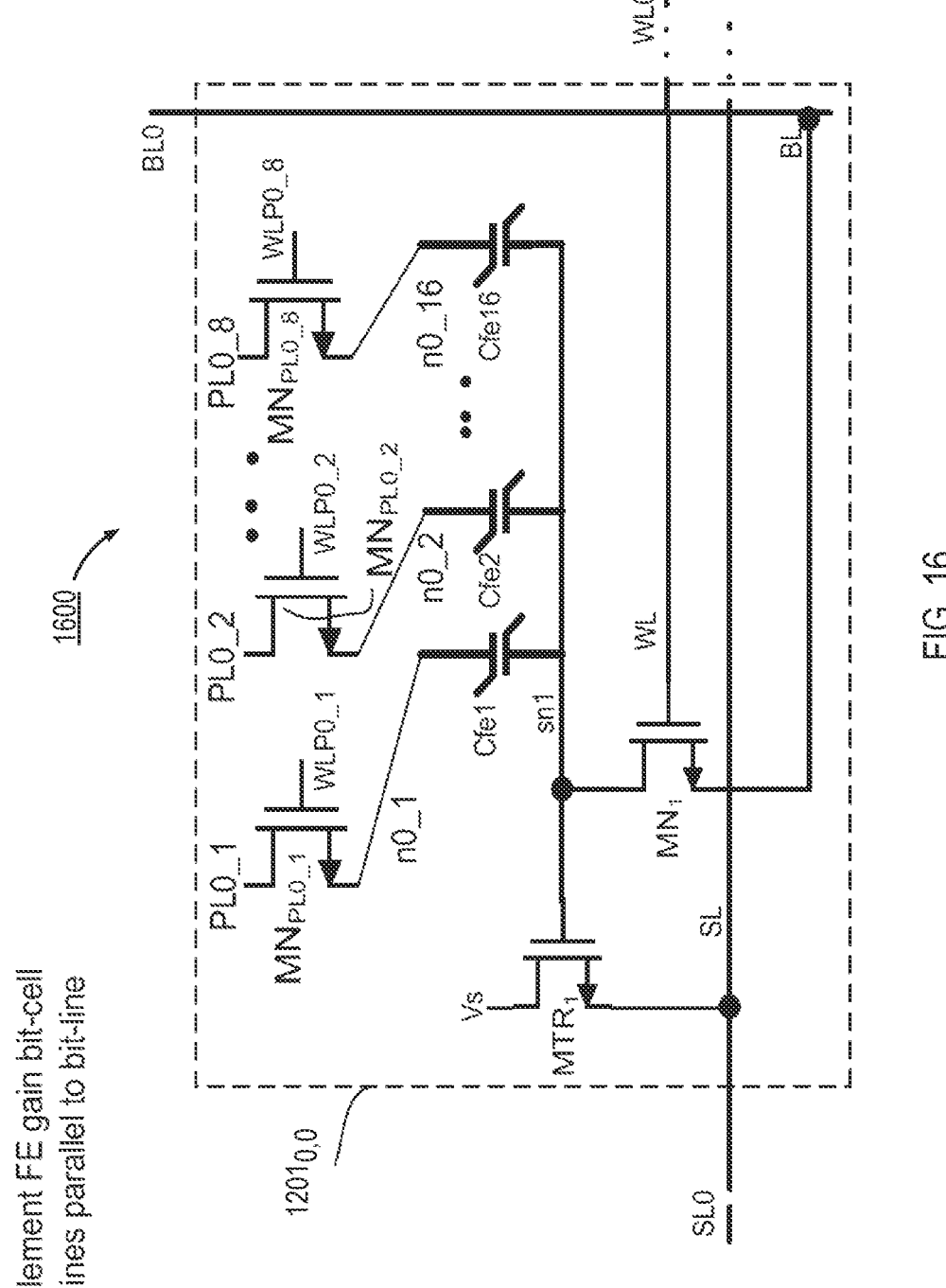
FIG. 16 illustrates a multi-element FE gain bit-cell with plate-line switches, in accordance with at least one embodiment.

FIG. 16 illustrates multi-element FE gain bit-cell or bit-cell 1600 with plate-line switches, in accordance with at least one embodiment. In at least one embodiment, bit-cell 1600 is like bit-cell 1500 (FIG. 15A), but with switches in the path of the plate-lines and hence a different kind of memory bit-cell. In at least one embodiment, these switches can be added to remove the charge disturb effect of unselected bit-cells when bit-lines are arranged parallel to the plate-lines. In at least one embodiment, charge disturb effect here is on the stored state of the capacitors with non-linear polar material. In at least one embodiment, by adding the switches, the plate-lines are no longer directly affecting the charge disturb effect because of the corresponding WLs that control the switches.

In at least one embodiment, each memory bit-cell in bit-cell 1600 is organized in rows and columns like in apparatus 1200 (FIG. 12), but with bit-lines running parallel to the plate-lines. In at least one embodiment, n-type transistor $MN_{PLO\_1}$ is coupled to Cfe1 and plate-line PL0_1. In at least one embodiment, n-type transistor $MN_{PLO\_2}$ is coupled to Cfe2 and plate-line PL0_2. In at least one embodiment, n-type transistor $MN_{PLO\_n}$ is coupled to Cfen and plate-line PL0_n. In at least one embodiment, each transistor (or switch) is controlled separately. In at least one embodiment, transistor $MN_{PLO\_1}$ is controllable by WLP0_1, transistor $MN_{PLO\_2}$ is controllable by WLP0_2, and so on. In at least one embodiment, transistor $MN_{PLO}\_n$ is controllable by WLP0_n. Here, WLP0_1 .... WLP0_n are the extensions of an address space. In this case, depending upon which storage element is being programmed or read, the corresponding WLP0_1 . . . WLP0_n are kept high (e.g., Vdd) whenever the plate-line voltage of 0V or Vdd is applied, while the unselected storage element sees 0V.

While the various embodiments are illustrated with reference to an n-type transistor or switch, the embodiments are also applicable to a p-type transistor or a combination of n-type or p-type transistors. In at least one embodiment, when a transistor of a different conductivity type is used than what is shown in FIG. 16, then driving logic for BL, PLs, WL, and/or WLPs may also change for proper read and/or write operations.

In at least one embodiment, the switches added to the plate-lines are fabricated in different layers of a die. In at least one embodiment, transistor $MN_1$ is fabricated on the frontend of the die while transistors $MN_{PLO\_1}$, $MN_{PLO\_2}$ . . . and $MN_{PLO\_n}$, are fabricated in the backend of the die. In at least one embodiment, the capacitor Cfe is fabricated between the frontend and the backend of the die. In at least one embodiment, capacitors Cfe are vertically stacked capacitors and horizontally folded. In at least one embodiment, each switch and its corresponding coupled capacitor is formed in the backend of the die. In at least one embodiment, each switch and its corresponding coupled capacitor is stacked vertically. In at least one embodiment, transistor $MN_{PLO\_1}$ and capacitor Cfe1 are stacked vertically in a first vertical stack, and transistor $MN_{PLO\_2}$ and capacitor Cfe2 are stacked vertically in a second vertical stack. In at least one embodiment, capacitors Cfe1 and Cfe2 are stacked and folded. In at least one embodiment, these backed transistors or switches can be fabricated using any suitable technology such as IGZO (indium gallium zinc oxide).

The method of forming the structures described herein are applicable to various logic embodiments. For example, the memory devices or capacitive structures formed herein can be used to form other ferroelectric/paraelectric circuits. These circuits can be implemented as a majority gate, a minority gate, and/or a threshold gate.

The following examples are provided that illustrate the various embodiments. The examples can be combined with other examples. As such, various embodiments can be combined with other embodiments without changing the scope of the invention.

Example 1: A method of fabricating a capacitor device, the method comprising: forming a multi-layer stack, the forming comprising: depositing a first conductive layer; depositing a dielectric layer comprising a non-Pb based material on the first conductive layer; depositing a second conductive layer on the dielectric layer; depositing a third conductive layer comprising one or more of ruthenium, platinum or iridium on the second conductive layer; forming a mask above the multi-layer stack; and patterning the multi-layer stack to form the capacitor device by utilizing a plasma etch process, the plasma etch process comprising: etching the third conductive layer to form a hardmask; etching the second conductive layer to form a first electrode; etching the dielectric layer to form an etched dielectric layer; and etching the first conductive layer to form a second electrode.

Example 2: The method of example 1, wherein the plasma etch process comprises a plasma having a plasma density in a range of 1e9 to 1e12 ions/cm$^3$.

Example 3: The method of example 1, wherein depositing the first conductive layer comprises depositing one of (La, Sr)FeO$_3$, (La,Sr)CoO$_3$, (La,Ca)MnO$_3$, (La,Sr)MnO$_3$, SrRuO$_3$, Sr$_2$RuO$_4$, (Ba,Sr)RuO$_3$, SrMoO$_3$, (La,Sr)MnO$_3$, SrCoO$_3$, SrCrO$_3$, SrFeO$_3$, SrVO$_3$, CaMoO$_3$, SrNbO$_3$, LaNiO$_3$, YBa$_2$Cu$_3$O$_7$, Bi$_2$Sr$_2$CaCuO$_8$, CaRuO$_3$, Ir, Ir$_2$O$_x$, Ru, RuO$_x$, Mo, MoO$_x$, W or WO$_x$; wherein depositing the dielectric layer comprises depositing one of: a perovskite material which includes one of: BaTiO$_3$, KNbO$_3$, or NaTaO$_3$; lead zirconium titanate (PZT) or PZT with a first doping material, wherein the first doping material is one of La or Nb; bismuth ferrite (BFO) with a second doping material, wherein the second doping material is one of lanthanum, one or more elements from lanthanide series of a periodic table, or one or more elements of a 3d, 4d, 5d, 6d, 4f and 5f series of the periodic table; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a hexagonal ferroelectric which includes one of: $YMnO_3$ or $LuFeO_3$; hexagonal ferroelectrics of a type $h\text{-}RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxide of a form $Hf_{1-x}E_xO_z$, wherein 'x' denotes a fraction, and E includes one of Al, Ca, Ce, Dy, Er, Gd, Ge, La, Sc, Si, Sr, Sn, Zr, or Y; $HfO_2$ doped with $E_y$, where E includes one of Al, Ca, Ce, Dy, Er, Gd, Ge, La, Sc, Si, Sr, Sn, or Y, and wherein 'y' is a fraction; $Al_{(1-x)}Sc_{(x)}N$, $Ga_{(1-x)}Sc_{(x)}N$, $Al_{(1-x)}Y_{(x)}N$ or $Al_{(a)}Mg_{(b)}Nb_{(c)}N$, wherein a, b, and c are respective compositional fractions; niobate type compounds including $LiNbO_3$, $LiTaO_3$, $LiTaO_2F_2$, $Sr_xBa_{1-x}Nb_2O_6$ where $0.32 \le x \le 0.8$, or $KSr_2Nb_5O_{15}$; or an improper ferroelectric material which comprises an epitaxial bilayer stack including one of: [barium titanate/strontium titanate]n or [lanthanum aluminate/strontium titanate]n, wherein 'n' represents a number of bilayers, and wherein 'n' is between 1 and 100; or a paraelectric material that comprises $SrTiO_3$, $Ba(x)Sr(y)TiO3$, $HfZrO_2$, Hf—Si—O, or a PMN-PT based relaxor ferroelectrics; and wherein depositing the second conductive layer comprises depositing one of $(La,Sr)FeO_3$, $(La,Sr)CoO_3$. $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W, or $WO_x$.

Example 4: The method of example 3, wherein the dielectric layer is a ferroelectric material and wherein the ferroelectric material comprises bismuth ferrite (BFO) and wherein BFO is doped with Mn or Sc, and wherein Mn or Sc achieves a spontaneous distortion in BFO in a range of 0.3% to 2%.

Example 5: The method of example 4, wherein the hardmask is a first hardmask, and wherein the method further comprises: forming an insulator layer on the third conductive layer; etching the insulator layer to form a second hardmask, wherein the first hardmask comprises sloped sidewalls, and wherein the sloped sidewalls are between 0 and 30 degrees.

Example 6: The method of example 1, wherein patterning the multi-layer stack further comprises: forming the hardmask comprising a first slope having a first angle; forming the first electrode comprising a second slope having a second angle; forming the dielectric layer comprising a third slope having a third angle; and forming the second electrode comprising a fourth slope having a fourth angle, wherein the first angle, the second angle, the third angle, and the fourth angle are individually measured relative to a normal to a lowermost surface of the second electrode, wherein the first angle is between 0 and 30 degrees, wherein the second angle is between 0 and 30 degrees, wherein the third angle is between 0 and 30 degrees, and wherein the fourth angle is between 0 and 30 degrees.

Example 7: The method of example 6, wherein the first angle, the second angle, the third angle, and the fourth angle are individually greater than 0 degrees.

Example 8: The method of example 5, wherein the plasma etch process removes the second hardmask and forms the first hardmask comprising a semicircular top surface.

Example 9: The method of example 5, the method further comprises etching at least a portion of the second hardmask above the first hardmask, prior to forming a metal contact above the first electrode, wherein the plasma etch process comprises argon and oxygen.

Example 10: A method of fabricating a device, the method comprising: forming a multi-layer stack, the forming comprising: depositing a first conductive layer; depositing a second conductive layer on the first conductive layer; depositing a dielectric layer on the second conductive layer; depositing a third conductive layer on the dielectric layer; depositing a fourth conductive layer comprising ruthenium, platinum and/or iridium on the third conductive layer, wherein depositing the fourth conductive layer comprises performing a sputter or a co-sputter deposition; forming a mask on the multi-layer stack; and patterning the multi-layer stack to form a capacitor device by applying a plasma etch process, the plasma etch process comprising: etching the fourth conductive layer to form a hardmask; etching the third conductive layer to form a first electrode; etching the dielectric layer to form an etched dielectric layer; etching the second conductive layer to form a second electrode; and etching the first conductive layer to form a third electrode.

Example 11: The method of example 10, wherein the first conductive layer comprises a first material, wherein the fourth conductive layer comprises a second material, and wherein the first material is substantially same as the second material.

Example 12: The method of example 10, wherein the hardmask is a first hardmask, and wherein the method further comprises: forming an insulator layer on the fourth conductive layer; etching the insulator layer to form a second hardmask, wherein the first hardmask comprises sloped sidewalls, and wherein the sloped sidewalls are between 0 and 30 degrees.

Example 13: The method of example 10, wherein depositing the first conductive layer comprises depositing one of Ru, Pt, or Ir.

Example 14: The method of example 10, wherein depositing the first conductive layer comprises depositing one of $(La,Sr)FeO_3$, $(La,Sr)CoO_3$. $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W or $WO_x$, wherein depositing the second conductive layer comprises depositing one of $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SiCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W, or $WO_x$, and wherein the first conductive layer comprises a different material from a material of the second conductive layer.

Example 15: The method of example 10, wherein depositing the second conductive layer comprises depositing one of $(La,Sr)FeO_3$, $(La,Sr)CoO_3$. $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SiCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W or $WO_x$; wherein depositing the dielectric layer comprises depositing one of: a perovskite material which includes one of: $BaTiO_3$, $KNbO_3$, or $NaTaO_3$; lead zirconium titanate (PZT) or PZT with a first doping material, wherein the frist doping material is one of La or Nb; bismuth ferrite (BFO) with a second doping material, wherein the second doping material is one of lanthanum, one or more elements from lanthanide series of a periodic table, or one or more elements of a 3d, 4d, 5d, 6d, 4f and 5f series of the periodic table; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); hexagonal ferroelectric which includes one of: $YMnO_3$ or $LuFeO_3$; a hexagonal ferroelectrics of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxide of a form $Hf_{1-x}E_xO_z$, wherein 'x' denotes a fraction, and E includes one of Al, Ca, Ce, Dy, Er, Gd, Ge, La, Sc, Si, Sr, Sn, Zr, or Y; $HfO_2$ doped with $E_y$, where E includes one of Al, Ca, Ce, Dy, Er, Gd, Ge, La, Sc, Si, Sr, Sn, or Y, and wherein 'y' is a fraction; $Al_{(1-x)}Sc_{(x)}N$, $Ga_{(1-x)}Sc_{(x)}N$, $Al_{(1-x)}Y_{(x)}N$ or $Al_{(a)}Mg_{(b)}Nb_{(c)}N$, wherein a, b, and c are respective compositional fractions; niobate type compounds including $LiNbO_3$, $LiTaO_3$, $LiTaO_2F_2$, $Sr_xBa_{1-x}Nb_2O_6$ where $0.32 \le x \le 0.8$, or $KSr_2Nb_5O_{15}$; or an improper ferroelectric material which comprises an epitaxial bilayer stack including one of: [barium titanate/strontium titanate]n or [lanthanum aluminate/strontium titanate]n, wherein 'n' represents a number of bilayers, and wherein 'n' is between 1 and 100; or a paraelectric material that comprises $SrTiO_3$, Ba(x)Sr(y)TiO3, $HfZrO_2$, Hf—Si—O, or a PMN-PT based relaxor ferroelectrics; and wherein depositing the third conductive layer comprises depositing one of (La,Sr)$FeO_3$, (La,Sr)$CoO_3$, (La,Ca)$MnO_3$, (La,Sr)$MnO_3$, $SrRuO_3$, $Sr_2RuO_4$, (Ba,Sr)$RuO_3$, $SrMoO_3$, (La,Sr)$MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W, or $WO_x$.

Example 16: The method of example 10, wherein the device is a first device in an array of devices, wherein a second device is simultaneously formed in the array of devices by patterning the multi-layer stack, wherein the second device is laterally separated from the first device by a spacing and wherein the first device and the second device comprise a same height, and wherein a ratio of the height to the spacing is less than 2.5:1.

Example 17: The method of example 10, wherein patterning the multi-layer stack forms the hardmask comprising a first slope having a first angle, wherein patterning the multi-layer stack forms the first electrode comprising a second slope having a second angle, wherein patterning the multi-layer stack forms the dielectric layer comprises a third slope having a third angle, wherein patterning the multi-layer stack forms the second electrode comprising a fourth slope having a fourth angle and wherein patterning the multi-layer stack forms the third electrode comprising a fifth slope having a fifth angle, wherein the first angle, the second angle, the third angle, the fourth angle and the fifth angle are individually measured relative to a normal to a lowermost surface of the second electrode.

Example 18: The method of example 17, wherein the second slope, the third slope, the fourth slope and the fifth slope vary from each other by less than 10%.

Example 19: The method of example 10 wherein the hardmask is a first hardmask, and wherein the method further comprises: forming an insulator layer on the fourth conductive layer; etching the insulator layer to form a second hardmask; and wherein the plasma etch process removes the second hardmask, and forms the first hardmask comprising sloped sidewalls, wherein the sloped sidewalls are between 0 and 30 degrees.

Example 20: A method of fabricating a memory device, the method comprising: forming a conductive interconnect within a dielectric, the conductive interconnect in a first level; forming a transition electrode on at least a portion of the conductive interconnect, the transition electrode in a second level, wherein the transition electrode comprises a conductive hydrogen barrier material; forming a multi-layer stack in a third level, the forming comprising: depositing a first conductive layer; depositing a dielectric layer comprising a non-Pb based material on the first conductive layer; depositing a second conductive layer on the dielectric layer; depositing a third conductive layer comprising one or more of ruthenium, platinum or iridium on the second conductive layer, wherein depositing the third conductive layer comprises performing a sputter or a co-sputter deposition process; and patterning the multi-layer stack to form the memory device by utilizing a plasma etch process, the plasma etch process comprising: etching the third conductive layer to form a hardmask; etching the second conductive layer to form a first electrode; etching the dielectric layer to form an etched dielectric layer; and etching the first conductive layer to form a second electrode.

Example 21: The method of example 20, wherein the method further comprises depositing a fourth conductive layer on the transition electrode prior to depositing the multi-layer stack, wherein the fourth conductive layer comprises one of Pt, Ir, Ru, (La,Sr)$FeO_3$, (La,Sr)$CoO_3$, (La,Ca)$MnO_3$, (La,Sr)$MnO_3$, $SrRuO_3$, $Sr_2RuO_4$, (Ba,Sr)$RuO_3$, $SrMoO_3$, (La,Sr)$MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W, or $WO_x$.

Example 22: The method of example 20, wherein depositing the first conductive layer comprises depositing one of (La,Sr)$FeO_3$, (La,Sr)$CoO_3$, (La,Ca)$MnO_3$, (La,Sr)$MnO_3$, $SrRuO_3$, $Sr_2RuO_4$, (Ba,Sr)$RuO_3$, $SrMoO_3$, (La,Sr)$MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W or $WO_x$; wherein depositing the dielectric layer comprises depositing one of: a perovskite material which includes one of: $BaTiO_3$, $KNbO_3$, or $NaTaO_3$; lead zirconium titanate (PZT), or PZT with a first doping material, wherein the first doping material is one of La or Nb; bismuth ferrite (BFO) with a second doping material, wherein the second doping material is one of lanthanum, one or more elements from lanthanide series of a periodic table, or one or more elements of a 3d, 4d, 5d, 6d, 4f or 5f series of the periodic table; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a hexagonal ferroelectric which includes one of: $YMnO_3$ or $LuFeO_3$; hexagonal ferroelectrics of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides;

hafnium oxide of a form $Hf_{1-x}E_xO_z$, wherein 'x' denotes a fraction, and E includes one of Al, Ca, Ce, Dy, Er, Gd, Ge, La, Sc, Si, Sr, Sn, Zr, or Y; $HfO_2$ doped with $E_y$, where E includes one of Al, Ca, Ce, Dy, Er, Gd, Ge, La, Sc, Si, Sr, Sn, or Y, and wherein 'y' is a fraction; $Al_{(1-x)}Sc_{(x)}N$, $Ga_{(1-x)}$ $Sc_{(x)}N$, $Al_{(1-x)}Y_{(x)}N$ or $Al_{(a)}Mg_{(b)}Nb_{(c)}N$, wherein a, b, and c are respective compositional fractions; niobate type compounds including $LiNbO_3$, $LiTaO_3$, $LiTaO_2F_2$, $Sr_xBa_{1-x}$ $Nb_2O_6$ where $0.32 \leq x \leq 0.8$, or $KSr_2Nb_5O_{15}$; or an improper ferroelectric material which comprises an epitaxial bilayer stack including one of: [barium titanate/strontium titanate]n or [lanthanum aluminate/strontium titanate]n, wherein 'n' represents a number of bilayers, and wherein 'n' is between 1 and 100; or a paraelectric material that comprises $SrTiO_3$, $Ba(x)Sr(y)TiO3$, $HfZrO_2$, Hf—Si—O, or a PMN-PT based relaxor ferroelectrics; and wherein depositing the second conductive layer comprises depositing one of $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W, or $WO_x$.

Example 23: The method of example 20 wherein, the conductive interconnect comprises a first lateral thickness, the transition electrode comprises a second lateral thickness and the memory device comprises a third lateral thickness, wherein the first lateral thickness is substantially equal to the second lateral thickness and wherein the third lateral thickness is not equal to the second lateral thickness.

Example 24: The method of example 20 wherein, the conductive interconnect comprises a first lateral thickness, the transition electrode comprises a second lateral thickness and the memory device comprises a third lateral thickness, wherein the first lateral thickness is substantially equal to the second lateral thickness and wherein the third lateral thickness is greater than the second lateral thickness.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. A method of fabricating a capacitor device, the method comprising:
   forming a multi-layer stack, the forming comprising:
      depositing a first conductive layer;
      depositing a dielectric layer comprising a non-Pb based material on the first conductive layer;
      depositing a second conductive layer on the dielectric layer; and
      depositing a third conductive layer comprising one or more of ruthenium, platinum or iridium on the second conductive layer; and
   patterning the multi-layer stack to form the capacitor device by utilizing a plasma etch process, the plasma etch process comprising:
      etching the third conductive layer to form a hardmask, the hardmask comprising a first slope having a first angle;
      etching the second conductive layer to form a first electrode, the first electrode comprising a second slope having a second angle;
      etching the dielectric layer to form an etched dielectric layer, the etched dielectric layer comprising a third slope having a third angle; and etching the first conductive layer to form a second electrode, the second electrode comprising a fourth slope having a fourth angle, wherein the first angle, the second angle, the third angle, and the fourth angle are individually measured relative to a normal to a lowermost surface of the second electrode, wherein the second angle is less than the third angle, wherein the third angle is less than the fourth angle, wherein the second angle, the third angle and the fourth angle are individually less than 10 degrees, and wherein the first angle is less than 30 degrees.

2. The method of claim 1, wherein the plasma etch process comprises a plasma having a plasma density in a range of 1e9 to 1e12 ions/cm³.

3. The method of claim 1, wherein depositing the first conductive layer comprises depositing one of $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W, or $WO_x$;

wherein depositing the dielectric layer comprises depositing one of:
      a perovskite material which includes one of: $BaTiO_3$, $KNbO_3$, or $NaTaO_3$;
      lead zirconium titanate (PZT) or PZT with a first doping material, wherein the first doping material is one of La or Nb;
      bismuth ferrite (BFO) with a second doping material, wherein the second doping material is one of lanthanum, one or more elements from lanthanide series of a periodic table, or one or more elements of a 3d, 4d, 5d, 6d, 4f, and 5f series of the periodic table;
      a relaxor ferroelectric material which includes one of; lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);
      a hexagonal ferroelectric which includes one of: $YMnO_3$ or $LuFeO_3$;
      hexagonal ferroelectrics of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides;
      hafnium oxide of a form $Hf_{1-x}E_xO_z$, wherein 'x' denotes a fraction, and E includes one of Al, Ca, Ce, Dy, Er, Gd, Ge, La, Sc, Si, Sr, Sn, Zr, or Y;
      $HfO_2$ doped with $E_y$, where E includes one of Al, Ca, Ce, Dy, Er, Gd, Ge, La, Sc, Si, Sr, Sn, or Y, and wherein 'y' is a fraction;
      $Al_{(1-x)}Sc_{(x)}N$, $Ga_{(1-x)}Sc_{(x)}N$, $Al_{(1-x)}Y_{(x)}N$ or $Al_{(a)}Mg_{(b)}$ $Nb_{(c)}N$, wherein a, b, and c are respective compositional fractions;
      niobate type compounds including $LiNbO_3$, $LiTaO_3$, $LiTaO_2F_2$, and $Sr_xBa1-xNb_2O_6$, where $0.32 \leq x \leq 0.8$, or $KSr_2Nb_5O_{15}$;
      an improper ferroelectric material which comprises an epitaxial bilayer stack including one of: [barium titanate/strontium titanate]n or [lanthanum aluminate/strontium titanate]n, wherein 'n' represents a number of bilayers, and wherein 'n' is between 1 and 100; or a paraelectric material that comprises $SrTiO_3$, $Ba_{(x)}Sr_{(y)}TiO_3$, $HfZrO_2$, Hf—Si—O, or a PMN-PT based relaxor ferroelectric; and wherein depositing the second conductive layer comprises depositing one of $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W, or $WO_x$.

4. The method of claim 3, wherein the dielectric layer is a ferroelectric material, wherein the ferroelectric material comprises bismuth ferrite (BFO) and wherein BFO is doped with Mn or Sc, and wherein Mn or Sc achieves a spontaneous distortion in BFO in a range of 0.3% to 2%.

5. The method of claim 4, wherein the hardmask is a first hardmask, and wherein the method further comprises:

forming an insulator layer on the third conductive layer; and etching the insulator layer to form a second hardmask, wherein the first hardmask comprises sloped sidewalls, and wherein the sloped sidewalls are between 0 and 30 degrees.

6. The method of claim 1, wherein the first angle, the second angle, the third angle, and the fourth angle are individually greater than 0 degrees.

7. The method of claim 5, wherein the plasma etch process removes the second hardmask and forms the first hardmask comprising a semicircular top surface.

8. The method of claim 5, further comprises etching at least a portion of the second hardmask above the first hardmask, prior to forming a metal contact above the first electrode, wherein the plasma etch process comprises argon and oxygen.

9. A method of fabricating a device, the method comprising:

forming a multi-layer stack, the forming comprising:

depositing a first conductive layer;

depositing a second conductive layer on the first conductive layer;

depositing a dielectric layer on the second conductive layer;

depositing a third conductive layer on the dielectric layer;

depositing a fourth conductive layer comprising ruthenium, platinum and/or iridium on the third conductive layer, wherein depositing the fourth conductive layer comprises performing a sputter or a co-sputter deposition;

forming a mask on the multi-layer stack; and patterning the multi-layer stack to form a capacitor device by applying a plasma etch process, the plasma etch process comprising:

etching the fourth conductive layer to form a hardmask, the hardmask comprising a first slope having a first angle;

etching the third conductive layer to form a first electrode, the first electrode comprising a second slope having a second angle;

etching the dielectric layer to form an etched dielectric layer, the etched dielectric layer comprising a third slope having a third angle;

etching the second conductive layer to form a second electrode, the second electrode comprising a fourth slope having a fourth angle; and etching the first conductive layer to form a third electrode, the third electrode comprising a fifth slope having a fifth angle, wherein the first angle, the second angle, the third angle, the fourth angle, and the fifth angle are individually measured relative to a normal to a lowermost surface of the second electrode, wherein the second angle is less than the third angle, wherein the third angle is less than the fourth angle, wherein the second angle, the third angle, the fourth angle and the fifth angle are individually less than 10 degrees, and wherein the first angle is less than 30 degrees.

10. The method of claim 9, wherein the first conductive layer comprises a first material, wherein the fourth conductive layer comprises a second material, and wherein the first material is same as the second material.

11. The method of claim 9, wherein the hardmask is a first hardmask, and wherein the method further comprises:

forming an insulator layer on the fourth conductive layer; and etching the insulator layer to form a second hardmask, wherein the first hardmask comprises sloped sidewalls, and wherein the sloped sidewalls are between 0 and 30 degrees.

12. The method of claim 9, wherein depositing the first conductive layer comprises depositing one of Ru, Pt, or Ir.

13. The method of claim 9, wherein depositing the first conductive layer comprises depositing one of $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W or $WO_x$, wherein depositing the second conductive layer comprises depositing one of $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W, or $WO_x$, and wherein the first conductive layer comprises a different material from a material of the second conductive layer.

14. The method of claim 9, wherein depositing the second conductive layer comprises depositing one of $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W, or $WO_x$;

wherein depositing the dielectric layer comprises depositing one of:

a perovskite material which includes one of: $BaTiO_3$, $KNbO_3$, or $NaTaO_3$;

lead zirconium titanate (PZT) or PZT with a first doping material, wherein the first doping material is one of La or Nb;

bismuth ferrite (BFO) with a second doping material, wherein the second doping material is one of lanthanum, one or more elements from lanthanide series of a periodic table, or one or more elements of a 3d, 4d, 5d, 6d, 4f, and 5f series of the periodic table;

a relaxor ferroelectric material which includes one of; lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);

a hexagonal ferroelectric which includes one of: $YMnO_3$ or $LuFeO_3$;

hexagonal ferroelectrics of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides;

hafnium oxide of a form $Hf_{1-x}E_xO_2$, where 'x' denotes a fraction, and E includes one of Al, Ca, Ce, Dy, Er, Gd, Ge, La, Sc, Si, Sr, Sn, Zr, or Y;

$HfO_2$ doped with $E_y$, where E includes one of Al, Ca, Ce, Dy, Er, Gd, Ge, La, Sc, Si, Sr, Sn, or Y, and wherein 'y' is a fraction;

$Al_{(1-x)}Sc_{(x)}N$, $Ga_{(1-x)}Sc_{(x)}N$, $Al_{(1-x)}Y_{(x)}N$ or $Al_{(a)}Mg_{(b)}Nb_{(c)}N$, wherein a, b, and c are respective compositional fractions;

niobate type compounds including $LiNbO_3$, $LiTaO_3$, $LiTaO_2F_2$, or $Sr_xBa_{1-x}Nb_2O_6$, where $0.32 \leq x \leq 0.8$, or $KSr_2Nb_5O_{15}$; or an improper ferroelectric material which comprises an epitaxial bilayer stack including one of: [barium titanate/strontium titanate]n or [lanthanum aluminate/strontium titanate]n, wherein 'n' represents a number of bilayers, and wherein 'n' is between 1 and 100; or a paraelectric material that comprises $SrTiO_3$, $Ba_{(x)}Sr_{(y)}TiO_3$, $HfZrO_2$, Hf—Si—O, or a PMN-PT based relaxor ferroelectric; and wherein depositing the third conductive layer comprises depositing one of $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W, or $WO_x$.

15. The method of claim 9, wherein the device is a first device in an array of devices, wherein a second device is simultaneously formed in the array of devices by patterning the multi-layer stack, wherein the second device is laterally separated from the first device by a spacing and wherein the first device and the second device comprise a same height, and wherein a ratio of the height to the spacing is less than 2.5:1.

16. The method of claim 9, wherein the second slope, the third slope, the fourth slope and the fifth slope vary from each other by less than 10%.

17. The method of claim 9 wherein the hardmask is a first hardmask, and wherein the method further comprises:

forming an insulator layer on the fourth conductive layer;

etching the insulator layer to form a second hardmask;

wherein the plasma etch process removes the second hardmask, and forms the first hardmask comprising sloped sidewalls, and wherein the sloped sidewalls are between 0 and 30 degrees.

18. A method of fabricating a memory device, the method comprising:

forming a conductive interconnect within a dielectric, the conductive interconnect in a first level;

forming a transition electrode on at least a portion of the conductive interconnect, the transition electrode in a second level, wherein the transition electrode comprises a conductive hydrogen barrier material;

forming a multi-layer stack in a third level, the forming comprising:

depositing a first conductive layer;

depositing a dielectric layer comprising a non-Pb based material on the first conductive layer;

depositing a second conductive layer on the dielectric layer; and depositing a third conductive layer comprising one or more of ruthenium, platinum or iridium on the second conductive layer, wherein depositing the third conductive layer comprises performing a sputter or a co-sputter deposition process; and patterning the multi-layer stack to form the memory device by utilizing a plasma etch process, the plasma etch process comprising:

etching the third conductive layer to form a hardmask, the hardmask comprising a first slope having a first angle;

etching the second conductive layer to form a first electrode, the first electrode comprising a second slope having a second angle;

etching the dielectric layer to form an etched dielectric layer, the etched dielectric layer comprising a third slope having a third angle; and etching the first conductive layer to form a second electrode, the second electrode comprising a fourth slope having a fourth angle, wherein the first angle, the second angle, the third angle, and the fourth angle are individually measured relative to a normal to a lowermost surface of the second electrode, wherein the second angle is less than the third angle, wherein the third angle is less than the fourth angle, wherein the second angle, the third angle and the fourth angle are individually less than 10 degrees, and wherein the first angle is less than 30 degrees.

19. The method of claim 18, wherein the method further comprises depositing a fourth conductive layer on the transition electrode prior to depositing the multi-layer stack, wherein the fourth conductive layer comprises one of Pt, Ir, Ru, $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W, or $WO_x$.

20. The method of claim 18, wherein depositing the first conductive layer comprises depositing one of $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W, or $WO_x$;

wherein depositing the dielectric layer comprises depositing one of:

a perovskite material which includes one of: $BaTiO_3$, $KNbO_3$, or $NaTaO_3$;

lead zirconium titanate (PZT) or PZT with a first doping material, wherein the first doping material is one of La or Nb;

bismuth ferrite (BFO) with a second doping material, wherein the second doping material is one of lanthanum, one or more elements from lanthanide series of a periodic table, or one or more elements of a 3d, 4d, 5d, 6d, 4f, and 5f series of the periodic table;

a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);

a hexagonal ferroelectric which includes one of: $YMnO_3$ or $LuFeO_3$;

hexagonal ferroelectrics of a type $h$-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides;

hafnium oxide of a form $Hf_{1-x}E_xO_2$, where 'x' denotes a fraction, and E includes one of Al, Ca, Ce, Dy, Er, Gd, Ge, La, Sc, Si, Sr, Sn, Zr, or Y;

$Al_{(1-x)}Sc_{(x)}N$, $Ga_{(1-x)}Sc_{(x)}N$, $Al_{(1-x)}Y_{(x)}N$ or $Al_{(a)}Mg_{(b)}Nb_{(c)}N$, wherein a, b, and c are respective compositional fractions;

niobate type compounds including $LiNbO_3$, $LiTaO_3$, $LiTaO_2F_2$, $Sr_xBa_{1-x}Nb_2O_6$, where $0.32 \le x \le 0.8$ or $KSr_2Nb_5O_{15}$; or an improper ferroelectric material which comprises an epitaxial bilayer stack including one of: [barium titanate/strontium titanate]n or [lanthanum aluminate/strontium titanate]n, wherein 'n' represents a number of bilayers, and wherein 'n' is between 1 and 100; or a paraelectric material that comprises $SrTiO_3$, $Ba_{(x)}Sr_{(y)}TiO_3$, $HfZrO_2$, Hf—Si—O, or a PMN-PT based relaxor ferroelectric; and wherein depositing the second conductive layer comprising depositing one of $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W, or $WO_x$.

21. The method of claim 18 wherein, the conductive interconnect comprises a first lateral thickness, the transition electrode comprises a second lateral thickness and the memory device comprises a third lateral thickness, wherein the first lateral thickness is substantially equal to the second lateral thickness, and wherein the third lateral thickness is not equal to the second lateral thickness.

22. The method of claim 18 wherein, the conductive interconnect comprises a first lateral thickness, the transition electrode comprises a second lateral thickness and the memory device comprises a third lateral thickness, wherein the first lateral thickness is substantially equal to the second lateral thickness, and wherein the third lateral thickness is greater than the second lateral thickness.

* * * * *